(12) United States Patent
Ito et al.

(10) Patent No.: US 11,498,991 B2
(45) Date of Patent: Nov. 15, 2022

(54) CURABLE COMPOSITION, CURED PRODUCT, COLOR FILTER, METHOD FOR PRODUCING COLOR FILTER, SOLID IMAGING ELEMENT, AND IMAGE DISPLAY DEVICE

(71) Applicant: FUJIFILM Corporation, Tokyo (JP)

(72) Inventors: Junichi Ito, Shizuoka (JP); Yutaro Fukami, Shizuoka (JP); Yushi Kaneko, Shizuoka (JP); Kazuya Ota, Shizuoka (JP); Hiromu Koizumi, Shizuoka (JP); Michihiro Ogawa, Shizuoka (JP); Hiroaki Idei, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/993,448

(22) Filed: Aug. 14, 2020

(65) Prior Publication Data
US 2020/0369810 A1 Nov. 26, 2020

Related U.S. Application Data

(63) Continuation of application No. PCT/JP2019/003897, filed on Feb. 4, 2019.

(30) Foreign Application Priority Data

Feb. 21, 2018 (JP) .............................. JP2018-029219

(51) Int. Cl.
*C08F 220/32* (2006.01)
*C08F 2/38* (2006.01)
(Continued)

(52) U.S. Cl.
CPC ............. *C08F 220/32* (2013.01); *C08F 2/38* (2013.01); *C08F 2/50* (2013.01); *C08F 220/18* (2013.01);
(Continued)

(58) Field of Classification Search
CPC .. C08F 2/50; C08F 2/48; C08F 220/18; C08F 220/32; C08F 220/36; C08F 220/56;
(Continued)

(56) References Cited

U.S. PATENT DOCUMENTS

| 6,582,862 | B1 | 6/2003 | Nakamura et al. |
| 2010/0247752 | A1 | 9/2010 | Hayashi et al. |
| 2016/0108161 | A1 | 4/2016 | Kaneko et al. |

FOREIGN PATENT DOCUMENTS

| JP | 11-171951 A | 6/1999 |
| JP | 2000-227655 A | 8/2000 |

(Continued)

OTHER PUBLICATIONS

Communication dated Apr. 13, 2021 from the Japanese Patent Office in Application No. 2020-501653.

(Continued)

*Primary Examiner* — Sanza L. McClendon
(74) *Attorney, Agent, or Firm* — Sughrue Mion, PLLC

(57) ABSTRACT

Provided are a curable composition including a pigment, a resin having a structural unit represented by Formula 1, and a photopolymerization initiator; as well as a cured product obtained by curing the curable composition, a color filter including the cured product, a method for producing the color filter, and a solid-state imaging element or an image display device, each of which including the color filter. $R^1$ to $R^3$ each independently represent a hydrogen atom or an alkyl group, $X^1$ represents —COO—, —CONR—, or an arylene group, $R^4$ represents a divalent linking group, $L^1$ represents a group represented by Formula 2 or 3, $R^5$ represents an (n+1)-valent linking group, $X^2$ represents an oxygen atom or —NR$^4$—, $R^4$ represents a hydrogen atom, an alkyl group, or an aryl group, and n represents an integer of 1 or more.

(Continued)

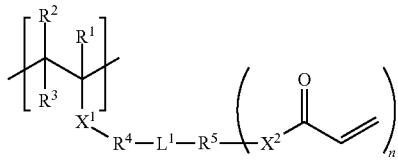

Formula 1

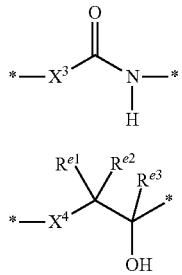

Formula 2

Formula 3

19 Claims, 1 Drawing Sheet

(51) Int. Cl.
| | |
|---|---|
| *C08F 2/50* | (2006.01) |
| *C08F 220/18* | (2006.01) |
| *C08F 220/36* | (2006.01) |
| *C08F 220/56* | (2006.01) |
| *C08F 222/20* | (2006.01) |
| *C08K 5/33* | (2006.01) |
| *C08K 5/3447* | (2006.01) |
| *G03F 7/00* | (2006.01) |
| *G03F 7/033* | (2006.01) |
| *G03F 7/09* | (2006.01) |

(52) U.S. Cl.
CPC .......... *C08F 220/36* (2013.01); *C08F 220/56* (2013.01); *C08F 222/20* (2013.01); *C08K 5/33* (2013.01); *C08K 5/3447* (2013.01); *G03F 7/0007* (2013.01); *G03F 7/033* (2013.01); *G03F 7/091* (2013.01)

(58) Field of Classification Search
CPC .. C08F 220/20; C08F 290/061; C08F 290/12; C08F 299/00; C08K 5/33; C08K 5/3447; G02B 5/20; G03F 7/0007; G03F 7/031; G03F 7/033; G03F 7/0388; G03F 7/091; G03F 7/11; H01L 27/146
See application file for complete search history.

(56) References Cited

FOREIGN PATENT DOCUMENTS

| | | | |
|---|---|---|---|
| JP | 2001-106765 A | | 4/2001 |
| JP | 2003-233179 A | | 8/2003 |
| JP | 2003-344636 A | | 12/2003 |
| JP | 2004-138950 A | | 5/2004 |
| JP | 2008-031234 A | | 2/2008 |
| JP | 2008-143941 A | | 6/2008 |
| JP | 2010017896 A | * | 1/2010 |
| JP | 2010-204199 A | | 9/2010 |
| JP | 2011-033951 A | | 2/2011 |
| JP | 2011-033952 A | | 2/2011 |
| JP | 2011033951 A | * | 2/2011 |
| JP | 2011033952 A | * | 2/2011 |
| JP | 2011-256330 A | | 12/2011 |
| JP | 2012-031260 A | | 2/2012 |
| JP | 2014-081639 A | | 5/2014 |
| JP | 2015-028144 A | | 2/2015 |
| WO | 2007111356 A1 | | 10/2007 |

OTHER PUBLICATIONS

International Search Report dated May 7, 2019 from the International Searching Authority in International Application No. PCT/JP2019/003897.
Written Opinion dated May 7, 2019 from the International Bureau in International Application No. PCT/JP2019/003897.
International Preliminary Report on Patentability dated Aug. 27, 2020 from the International Bureau in International Application No. PCT/JP2019/003897.
Office Action dated Nov. 9, 2021 from the Japanese Patent Office in JP Application No. 2020-501653.
Office Action dated Aug. 3, 2022 in Taiwanese Application No. 108105347.

* cited by examiner

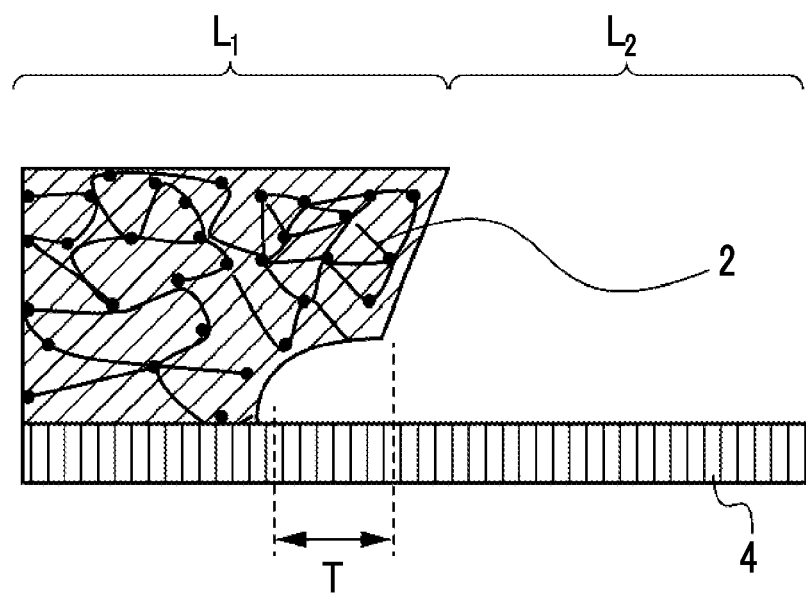

CURABLE COMPOSITION, CURED PRODUCT, COLOR FILTER, METHOD FOR PRODUCING COLOR FILTER, SOLID IMAGING ELEMENT, AND IMAGE DISPLAY DEVICE

CROSS-REFERENCE TO RELATED APPLICATIONS

This application is a continuation application of International Application No. PCT/JP2019/003897, filed Feb. 4, 2019, the disclosure of which is incorporated herein by reference in its entirety. Further, this application claims priority from Japanese Patent Application No. 2018-029219, filed Feb. 21, 2018, the disclosure of which is incorporated herein by reference in its entirety.

BACKGROUND OF THE INVENTION

1. Field of the Invention

The present disclosure relates to a curable composition, a cured product, a color filter, a method for producing a color filter, a solid-state imaging element, and an image display device.

2. Description of the Related Art

A member such as a color filter is produced by a photolithographic method or the like, using a coloring photosensitive composition which is formed by adding a polyfunctional monomer, a photopolymerization initiator, an alkali-soluble resin, and other components to a pigment dispersion composition in which an organic pigment or an inorganic pigment is dispersed.

Examples of a composition used in the formation of a conventional color filter include those described in JP2003-233179A, JP2000-227655A, JP2004-138950A, and JP2014-081639A.

JP2003-233179A discloses a photosensitive composition containing a photopolymerization initiator (A) and a binder resin (B) having a structure in which an epoxy moiety of a compound having an ethylenically unsaturated group and an epoxy group is added to a carboxylic acid moiety of a resin having a carboxylic acid, characterized in that the compound having an ethylenically unsaturated group and an epoxy group is represented by Structural Formula I.

Structural Formula I

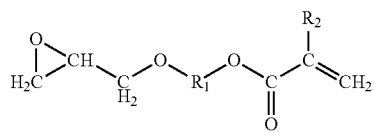

(in Structural Formula I, $R_1$ represents a divalent linking group, and $R_2$ represents a hydrogen atom or a methyl group.)

JP2000-227655A discloses a photopolymerizable composition containing a binder resin having a carboxyl group and/or a hydroxyl group, a photopolymerizable monomer, and a photopolymerization initiator, characterized in that the binder resin is a copolymer containing a repeating unit represented by Formula (I),

($R_1$ represents a hydrogen atom or an alkyl group having 1 to 6 carbon atoms, and $R_2$ represents a divalent linking group), and (1) a part of the carboxyl group of the binder resin forms a —COO—$Y_1$—$R_6$ (where $Y_1$ represents a divalent linking group and $R_6$ represents a group having an ethylenically unsaturated group) structure, or (2) at least a part of the hydroxyl group of the binder resin forms an —O—$Y_2$—$R_{13}$ (where $Y_2$ represents a divalent linking group and $R_{13}$ represents a group having an ethylenically unsaturated group) structure.

JP2004-138950A discloses a coloring photosensitive resin composition containing a binder resin (A), a photopolymerizable monomer (B), a photopolymerization initiator (C), a coloring material (D), and a solvent (E), characterized in that the binder resin (A) is an unsaturated group-containing binder resin obtained by reacting a polymer containing a structural unit derived from an unsaturated carboxylic acid with a compound of Formula (1), and the photopolymerization initiator (C) includes at least one compound selected from the group consisting of a triazine compound, an acetophenone compound, and a biimidazole compound.

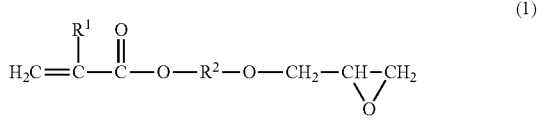

(in the formula, $R^1$ represents a hydrogen atom or a methyl group, and $R^2$ represents an aliphatic hydrocarbon residue having 1 to 6 carbon atoms.)

JP2014-081639A discloses a photosensitive composition containing a photosensitive resin obtained by reacting 0.2 to 0.9 mol of the epoxy group in an epoxy group-containing ethylenically unsaturated monomer (c) with 1 mol of the carboxyl group in a copolymer (I) obtained by radical polymerization of an ethylenically unsaturated monomer (M) containing 10% to 90% by weight of an ethylenically unsaturated monomer (a) having a formula weight of 70 to 120 and having no carboxyl group and 10% to 70% by weight of an ethylenically unsaturated monomer (b) containing a carboxyl group.

SUMMARY OF THE INVENTION

An object to be achieved by an embodiment of the present invention is to provide a curable composition having excellent deep curing properties.

Further, an object to be achieved by another embodiment of the present invention is to provide a cured product obtained by curing the curable composition, a color filter comprising the cured product, a method for producing the color filter, and a solid-state imaging element or an image display device, each of which comprising the color filter.

Means for achieving the foregoing objects include the following aspects.

<1> A curable composition comprising:
a pigment;
a resin having a structural unit represented by Formula 1; and
a photopolymerization initiator.

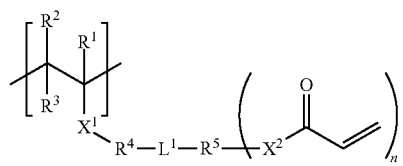

Formula 1

In Formula 1, $R^1$ to $R^3$ each independently represent a hydrogen atom or an alkyl group, $X^1$ represents —COO—, —CONR—, or an arylene group, R represents a hydrogen atom, an alkyl group, or an aryl group, $R^4$ represents a divalent linking group, $L^1$ represents a group represented by Formula 2 or 3, $R^5$ represents an (n+1)-valent linking group, $X^2$ represents an oxygen atom or —$NR^A$—, $R^A$ represents a hydrogen atom, an alkyl group, or an aryl group, and n represents an integer of 1 or more.

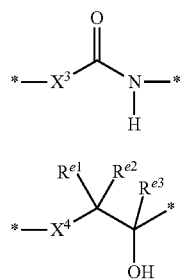

Formula 2

Formula 3

In Formulae 2 and 3, $X^3$ represents an oxygen atom or —NH—, $X^4$ represents an oxygen atom or —COO—, $R^{e1}$ to $R^{e3}$ each independently represent a hydrogen atom or an alkyl group, at least two of $R^{e1}$ to $R^{e3}$ may be bonded to each other to form a ring structure, and *represents a bonding position to another structure.

<2> The curable composition according to <1>, in which the resin further has a structural unit represented by Formula 4.

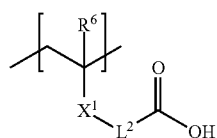

Formula 4

In Formula 4, $R^6$ represents a hydrogen atom or an alkyl group, $X^5$ represents —COO—, —$CONR^B$—, or an arylene group, $R^B$ represents a hydrogen atom, an alkyl group, or an aryl group, $L^2$ represents an aliphatic hydrocarbon group having 1 to 10 carbon atoms, an aromatic hydrocarbon group having 6 to 20 carbon atoms, or a group in which two or more groups selected from the group consisting of an aliphatic hydrocarbon group having 1 to 10 carbon atoms and an aromatic hydrocarbon group having 6 to 20 carbon atoms are bonded to one or more structures selected from the group consisting of an ether bond and an ester bond, and $L^2$ may be a single bond in a case where $X^5$ is an arylene group.

<3> The curable composition according to <1> or <2>, in which the resin further has a structural unit represented by Formula 5.

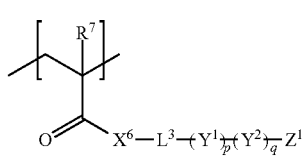

Formula 5

In Formula 5, $R^7$ represents a hydrogen atom or an alkyl group, $X^6$ represents an oxygen atom or —$NR^C$—, $R^C$ represents a hydrogen atom, an alkyl group, or an aryl group, $L^3$ represents a divalent linking group, $Y^1$ and $Y^2$ each independently represent an alkyleneoxy group or an alkylenecarbonyloxy group, $Z^1$ represents an aliphatic hydrocarbon group having 1 to 20 carbon atoms or an aromatic hydrocarbon group having 6 to 20 carbon atoms, p and q each independently represent an integer of 0 or more, and a value of p+q is 1 or more.

<4> The curable composition according to any one of <1> to <3>, in which the resin has an ethylenically unsaturated bond value of 0.1 mmol/g to 2.0 mmol/g.

<5> The curable composition according to any one of <1> to <4>, further comprising: a polymerization inhibitor.

<6> The curable composition according to <5>, in which the polymerization inhibitor includes a compound having an N-oxyl radical structure.

<7> The curable composition according to any one of <1> to <6>, in which $L^1$ is a group represented by Formula 2.

<8> The curable composition according to <7>, in which $X^3$ is an oxygen atom.

<9> The curable composition according to <7> or <8>, in which $R^4$ is a group selected from the group consisting of an ethylene group, an n-propylene group, an isopropylene group, an n-butylene group, and an isobutylene group, and $R^5$ is an ethylene group.

<10> The curable composition according to any one of <1> to <6>, in which $L^1$ is a group represented by Formula 3.

<11> The curable composition according to <10>, in which $X^4$ is —COO—.

<12> The curable composition according to <10> or <11>, in which $R^4$ is a hydrocarbon group, a group in which two or more hydrocarbon groups are bonded to one or more structures selected from the group consisting of an ether bond and an ester bond, or a group selected from the group consisting of groups represented by the following structures, and $R^5$ is an alkylene group or a group in which two or more alkylene groups are bonded to one or more structures selected from the group consisting of an ether bond and an ester bond.

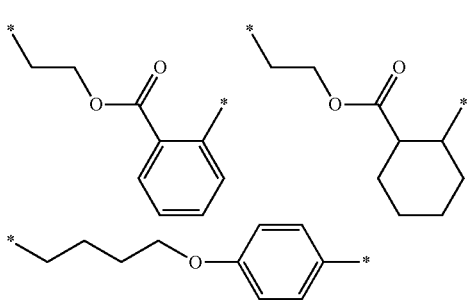

Note that *represents a bonding position to another structure.

<13> The curable composition according to any one of <1> to <12>, in which the photopolymerization initiator is a compound having an oxime structure.

<14> The curable composition according to any one of <1> to <13>, in which the curable composition is used for forming a colored layer of a color filter.

<15> A cured product obtained by curing the curable composition according to any one of <1> to <14>.

<16> A color filter comprising:
the cured product according to <15>.

<17> A method for producing a color filter, comprising:
a step of applying the curable composition according to any one of <1> to <14> onto a support to form a composition film;
a step of exposing the formed composition film to light in a pattern-wise manner; and
a step of developing the composition film after exposure to form a colored pattern.

<18> A method for producing a color filter, comprising:
a step of applying the curable composition according to any one of <1> to <14> onto a support and curing the applied curable composition to form a cured product;
a step of forming a photoresist layer on the cured product;
a step of exposing the photoresist layer to light in a pattern-wise manner and developing the exposed photoresist layer to form a resist pattern; and
a step of etching the cured product through the resist pattern.

<19> A solid-state imaging element comprising:
the color filter according to <16>.

<20> An image display device comprising:
the color filter according to <16>.

According to the embodiment of the present invention, there is provided a curable composition having excellent deep curing properties.

Further, according to another embodiment of the present invention, there are provided a cured product obtained by curing the curable composition, a color filter comprising the cured product, a method for producing the color filter, and a solid-state imaging element or an image display device, each of which comprising the color filter.

BRIEF DESCRIPTION OF THE DRAWINGS

FIG. 1 is a schematic diagram showing a measurement position of an undercut width in a cured product on a pattern in the Examples.

DESCRIPTION OF THE PREFERRED EMBODIMENTS

Hereinafter, the contents of the present disclosure will be described in detail. The description of constituent elements described below may be based on representative embodiments of the present disclosure, but the present disclosure is not limited to such embodiments.

In the present disclosure, a term "to" indicating a numerical range is used as a meaning including numerical values described before and after the term as a lower limit value and an upper limit value, respectively.

In a numerical range described in a stepwise manner in the present specification, an upper limit value or a lower limit value described in a certain numerical range may be replaced with an upper limit value or a lower limit value of another numerical range described in a stepwise manner. In addition, in the numerical range described in the present specification, the upper limit value or the lower limit value of the numerical range may be replaced with the values shown in the Examples.

Regarding a term, group (atomic group) in the present disclosure, a term with no description of "substituted" and "unsubstituted" includes both a group not having a substituent and a group having a substituent. For example, an "alkyl group" includes not only an alkyl group having no substituent (unsubstituted alkyl group), but also an alkyl group having a substituent (substituted alkyl group).

In the present disclosure, unless otherwise specified, "Me" represents a methyl group, "Et" represents an ethyl group, "Pr" represents a propyl group, "Bu" represents a butyl group, and "Ph" represents a phenyl group.

In the present specification, "(meth)acrylic" is a term used as a concept including both acrylic and methacrylic, and "(meth)acryloyl" is a term used as a concept including both acryloyl and methacryloyl.

In the present disclosure, a term "step" not only includes an independent step, but also includes a step, even in a case where the step may not be clearly distinguished from the other step, as long as the expected object of the step is achieved.

In addition, in the present disclosure, "% by mass" is identical to "% by weight" and "parts by mass" is identical to "parts by weight".

Further, in the present disclosure, a combination of two or more preferred aspects is a more preferred aspect.

In addition, unless otherwise noted, a weight-average molecular weight (Mw) and a number-average molecular weight (Mn) in the present disclosure are molecular weights in terms of polystyrene as a standard substance, following the detection by a gel permeation chromatography (GPC) analyzer using columns of TSKgel GMHxL, TSKgel G4000HxL, and TSKgel G2000HxL (all of which are trade names manufactured by Tosoh Corporation), using tetrahydrofuran (THF) as a solvent and a differential refractometer.

Hereinafter, the present disclosure will be described in detail.

(Curable Composition)

The curable composition (hereinafter, also referred to as "composition") according to the present disclosure includes a pigment, a resin having a structural unit represented by Formula 1, and a photopolymerization initiator.

In addition, the curable composition according to the present disclosure can be suitably used as a curable composition for forming a colored layer of a color filter.

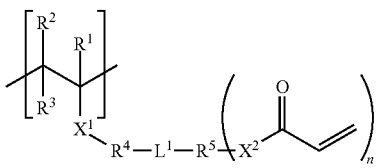

Formula 1

In Formula 1, $R^1$ to $R^3$ each independently represent a hydrogen atom or an alkyl group, $X^1$ represents —COO—, —CONR—, or an arylene group, R represents a hydrogen atom, an alkyl group, or an aryl group, $R^4$ represents a divalent linking group, $L^1$ represents a group represented by Formula 2 or 3, $R^5$ represents an (n+1)-valent linking group, $X^2$ represents an oxygen atom or —$NR^A$—, $R^A$ represents a hydrogen atom, an alkyl group, or an aryl group, and n represents an integer of 1 or more.

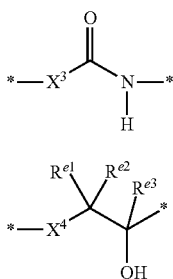

Formula 2

Formula 3

In Formulae 2 and 3, $X^3$ represents an oxygen atom or —NH—, $X^4$ represents an oxygen atom or —COO—, $R^{e1}$ to $R^{e3}$ each independently represent a hydrogen atom or an alkyl group, at least two of $R^{e1}$ to $R^{e3}$ may be bonded to each other to form a ring structure, and *represents a bonding position to another structure.

By using the curable composition according to the present disclosure, a cured product having excellent deep curing properties can be obtained.

The reason why the above effect is obtained is unclear, but is estimated as follows.

Having a group represented by Formula 2 or Formula 3, which is a polar group, in a side chain of the resin having the structural unit represented by Formula 1 leads to an increased width of movement of the acryloyl group in Formula 1 in the composition, thus resulting in excellent reactivity, and having the group represented by Formula 2 or Formula 3 contributes to suppress the aggregation between resins, thus resulting in excellent dispersibility so that the acryloyl group is more easily reacted, which makes it possible to obtain a curable composition having excellent deep curing properties.

In addition, having the structural unit represented by Formula 1 enables to introduce a highly reactive acryloyl group at a position away from the main chain through the group represented by Formula 2 or Formula 3, thus resulting in an increased probability of a reaction between the polymer molecules or a reaction with other crosslinking components in the composition rather than a reaction between acryloyl groups in the polymer molecule, and therefore a crosslinking reaction proceeds efficiently even in a composition having a high pigment concentration, whereby deep curing properties and pattern shape can be improved.

In addition, the structural unit represented by Formula 1 has a relatively long side chain structure and has a polar group represented by Formula 2 or Formula 3 in the side chain, thus resulting in steric repulsion that enhances the adsorptivity to the pigment and suppresses aggregation of the pigment particles. As a result, the dispersibility can be improved.

Further, having the structural unit represented by Formula 4 makes it possible to introduce a carboxylic acid serving as an adsorptive group at a position away from the main chain, which is thus capable of enhancing pigment adsorptivity and improving dispersion stability.

In addition, introducing the structural unit represented by Formula 1 leads to improvements in the adhesiveness to substrate and the pattern shape as well as the deep curing properties, and further, having the structural unit represented by Formula 4 also enables to improve the dispersion stability.

<Resin having structural unit represented by Formula 1>

The curable composition according to the present disclosure includes a resin having a structural unit represented by Formula 1.

In Formula 1, $R^1$ to $R^3$ are each independently preferably a hydrogen atom or a methyl group and particularly preferably a hydrogen atom, from the viewpoint of deep curing properties.

In addition, from the viewpoint of deep curing properties, $R^1$ is more preferably a hydrogen atom or a methyl group, and $R^2$ and $R^3$ are each more preferably a hydrogen atom. Further, in a case where $L^1$ is a group represented by Formula 2, $R^1$ is still more preferably a methyl group, and in a case where $L^1$ is a group represented by Formula 3, $R^1$ is still more preferably a hydrogen atom.

$X^1$ in Formula 1 is preferably —COO— or —CONR— and more preferably —COO—, from the viewpoint of deep curing properties.

R is preferably a hydrogen atom or an alkyl group and more preferably a hydrogen atom.

$R^4$ in Formula 1 is preferably a hydrocarbon group or a group in which two or more hydrocarbon groups are bonded to one or more structures selected from the group consisting of an ether bond and an ester bond and more preferably a hydrocarbon group or a group in which two or more hydrocarbon groups are bonded to one or more ester bonds, from the viewpoint of deep curing properties.

In addition, $R^4$ in Formula 1 is preferably a group having a total number of atoms of 2 to 60, more preferably a group having a total number of atoms of 2 to 50, and particularly preferably a group having a total number of atoms of 2 to 40, from the viewpoint of deep curing properties.

Further, from the viewpoint of deep curing properties, it is particularly preferred that $R^4$ is a hydrocarbon group, an alkyleneoxyalkylenecarboxyl group, or a group selected from the group consisting of groups represented by the following structures, and $R^5$ is an alkylene group or a group in which two or more alkylene groups are bonded to one or more structures selected from the group consisting of an ether bond and an ester bond.

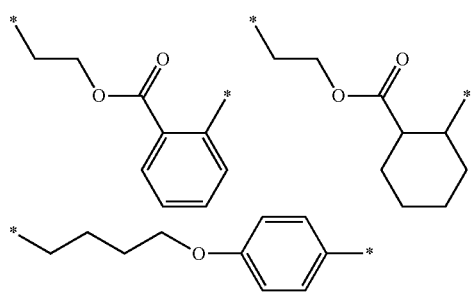

Note that *represents a bonding position to another structure.

In Formula 1, n is preferably an integer of 1 to 6, more preferably an integer of 1 to 3, and particularly preferably 1, from the viewpoint of deep curing properties.

$R^5$ in Formula 1 is preferably a divalent linking group, more preferably an alkylene group or a group in which two or more alkylene groups are bonded to one or more structures selected from the group consisting of an ether bond and an ester bond, still more preferably an alkyleneoxyalkylene group, and particularly preferably a methyleneoxy-n-butylene group, from the viewpoint of deep curing properties.

In addition, $R^5$ in Formula 1 is preferably a group having a total number of atoms of 2 to 40, more preferably a group having a total number of atoms of 2 to 30, and particularly preferably a group having a total number of atoms of 2 to 20, from the viewpoint of deep curing properties.

$X^2$ in Formula 1 is preferably an oxygen atom from the viewpoint of deep curing properties.

$R^4$ is preferably a hydrogen atom or an alkyl group, and more preferably a hydrogen atom.

$L^1$ in Formula 1 is preferably a group represented by Formula 2 from the viewpoint of dispersibility, and is preferably a group represented by Formula 3 from the viewpoint of pattern shape and suppression of development residue.

$X^3$ in Formula 2 is preferably an oxygen atom from the viewpoint of deep curing properties and dispersibility.

In addition, in a case where $L^1$ is a group represented by Formula 2, it is particularly preferred that $R^4$ is a group selected from the group consisting of an ethylene group, an n-propylene group, an isopropylene group, an n-butylene group, and an isobutylene group, and $R^5$ is an ethylene group, from the viewpoint of deep curing properties and dispersibility.

$X^4$ in Formula 3 is preferably —COO— from the viewpoint of deep curing properties, pattern shape, and suppression of development residue.

$R^{e1}$ to $R^{e3}$ in Formula 3 are each preferably a hydrogen atom from the viewpoint of deep curing properties, pattern shape, and suppression of development residue.

In addition, in a case where $L^1$ is a group represented by Formula 3, it is particularly preferred that $R^4$ is a hydrocarbon group, a group in which two or more hydrocarbon groups are bonded to one or more structures selected from the group consisting of an ether bond and an ester bond, or any one of groups represented by the following structures, and $R^5$ is an alkylene group or a group in which two or more alkylene groups are bonded to one or more structures selected from the group consisting of an ether bond and an ester bond, from the viewpoint of deep curing properties, pattern shape, and suppression of development residue.

The group represented by Formula 2 is preferably a group represented by Formula 2-1 or 2-2.

In addition, the group represented by Formula 3 is preferably a group represented by Formula 3-1 or 3-2.

Formula 2-1

Formula 2-2

Formula 3-1

Formula 3-2

Note that *represents a bonding position to another structure.

Preferred examples of the structural unit represented by Formula 1 include the structures shown below, but it is needless to say that the present disclosure is not limited thereto.

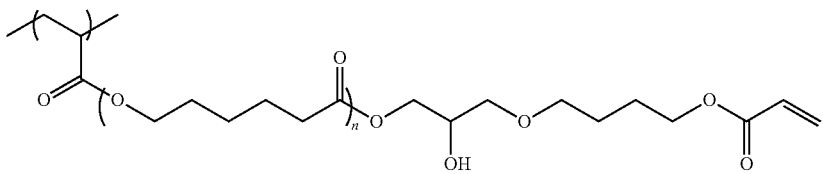

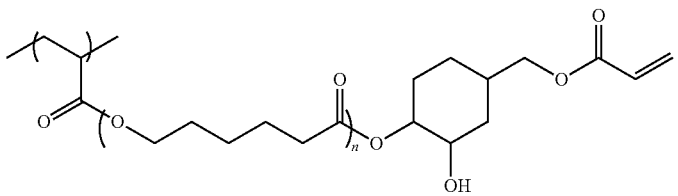

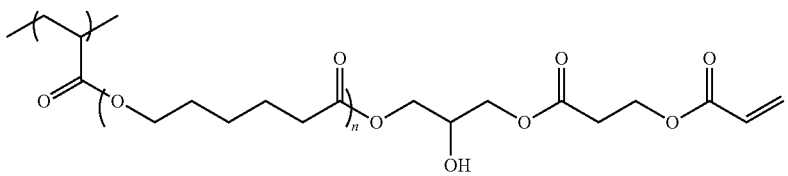

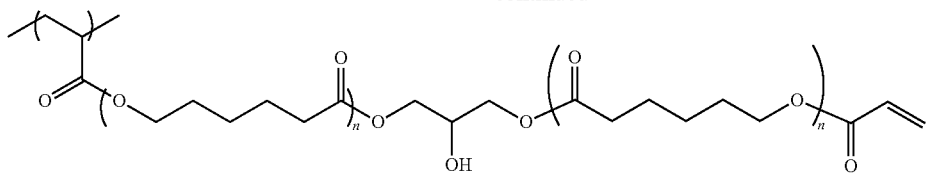
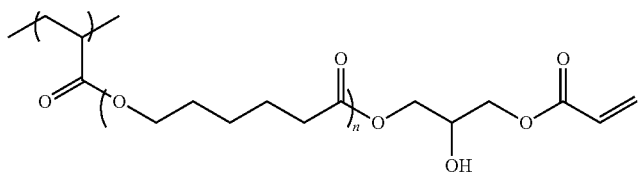
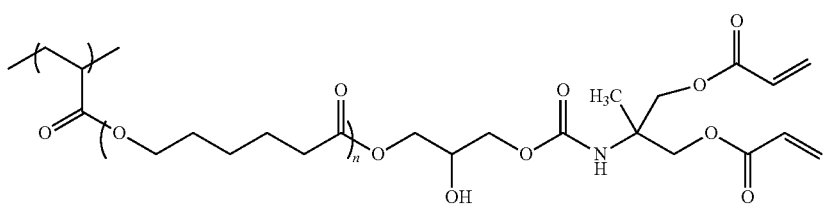
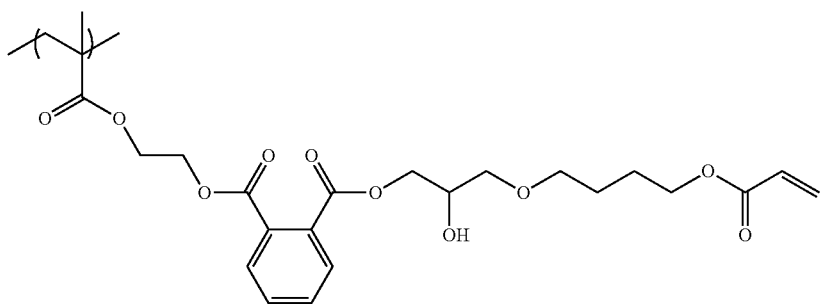
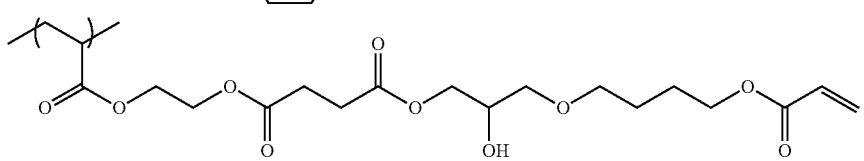
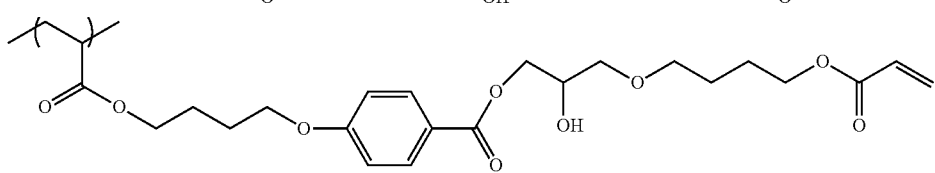
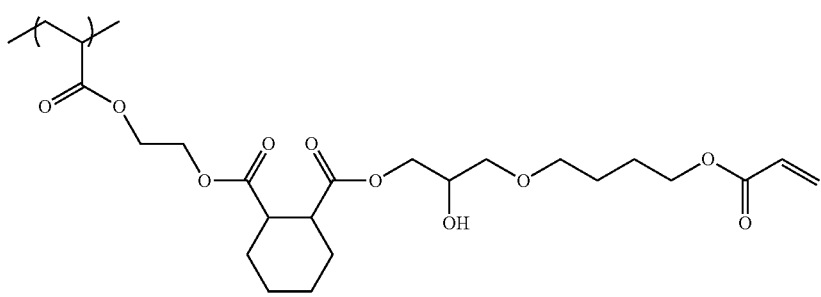
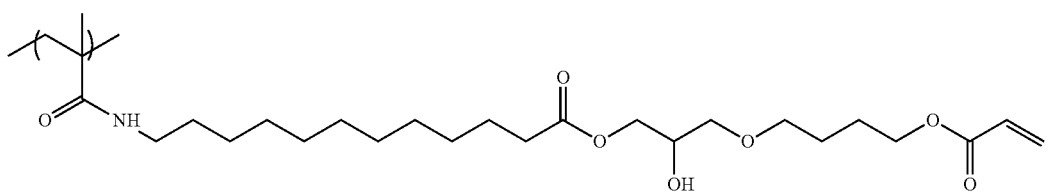

-continued
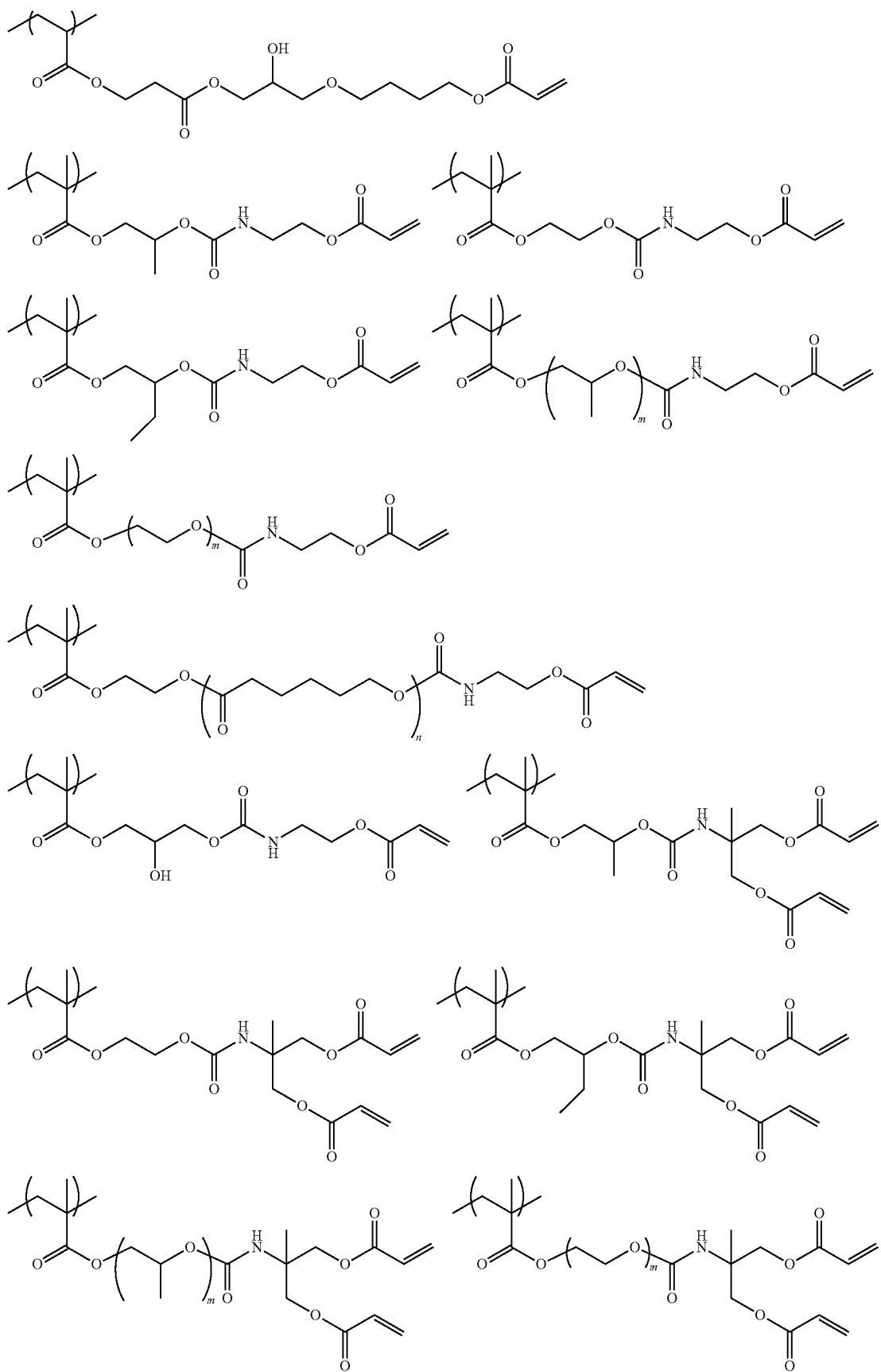

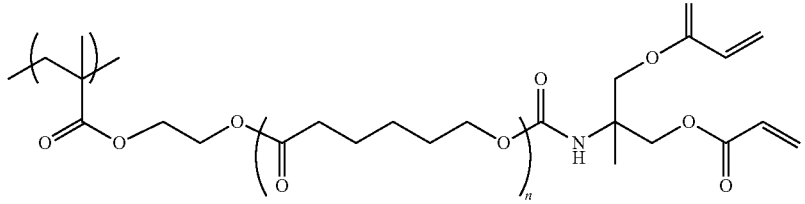

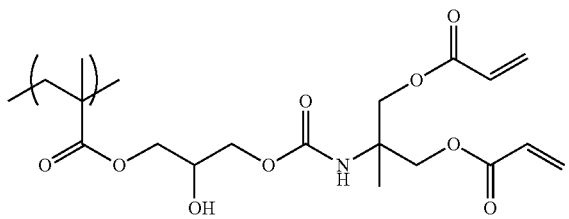

Note that m represents an integer of 2 or more, and n represents an integer of 1 or more.

The resin may have one type of the structural unit represented by Formula 1 singly, or may have two or more types of the structural units represented by Formula 1.

The content of the structural unit represented by Formula 1 is preferably 1% by mass to 80% by mass, more preferably 1% by mass to 70% by mass, and particularly preferably 1% by mass to 60% by mass with respect to the total mass of the resin, from the viewpoint of developability, pattern shape, dispersion stability, and deep curing properties.

Structural unit Represented by Formula 4

The resin preferably further has a structural unit represented by Formula 4 from the viewpoint of dispersion stability and developability.

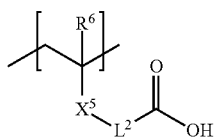

Formula 4

In Formula 4, $R^6$ represents a hydrogen atom or an alkyl group, $X^5$ represents —COO—, —CONR$^B$—, or an arylene group, $R^B$ represents a hydrogen atom, an alkyl group, or an aryl group, $L^2$ represents an aliphatic hydrocarbon group having 1 to 10 carbon atoms, an aromatic hydrocarbon group having 6 to 20 carbon atoms, or a group in which two or more groups selected from the group consisting of an aliphatic hydrocarbon group having 1 to 10 carbon atoms and an aromatic hydrocarbon group having 6 to 20 carbon atoms are bonded to one or more structures selected from the group consisting of an ether bond and an ester bond, and $L^2$ may be a single bond in a case where $X^5$ is an arylene group.

$R^6$ in Formula 4 is preferably a hydrogen atom.

$X^5$ in Formula 4 is preferably —COO— or —CONR$^B$ and more preferably —COO—, from the viewpoint of dispersion stability.

$R^B$ is preferably a hydrogen atom or an alkyl group and more preferably a hydrogen atom.

From the viewpoint of dispersion stability, $L^2$ in Formula 4 is preferably an aliphatic hydrocarbon group having 1 to 10 carbon atoms or a group in which two or more aliphatic hydrocarbon groups having 1 to 10 carbon atoms are bonded to one or more ester bonds, more preferably an aliphatic hydrocarbon group having 1 to 10 carbon atoms, and particularly preferably an alkylene group having 1 to 10 carbon atoms.

Preferred examples of the structural unit represented by Formula 4 include the structures shown below, but it is needless to say that the present disclosure is not limited thereto.

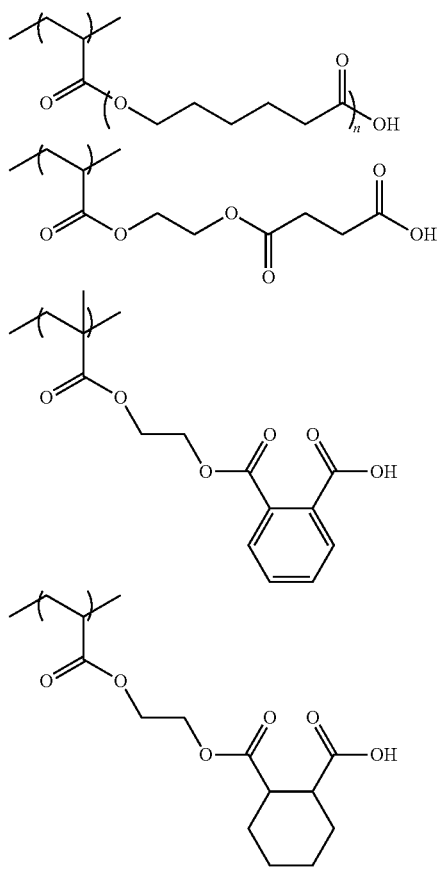

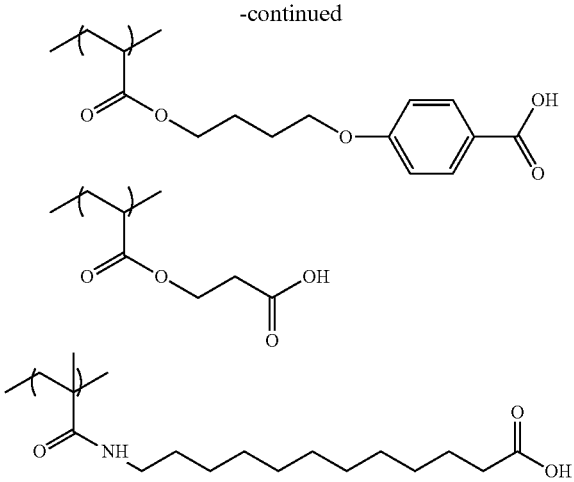

Note that n represents an integer of 1 or more.

The resin may have one type of the structural unit represented by Formula 4 singly, or may have two or more types of the structural units represented by Formula 4.

The content of the structural unit represented by Formula 4 is preferably 20% by mass to 80% by mass, more preferably 20% by mass to 70% by mass, and particularly preferably 20% by mass to 60% by mass with respect to the total mass of the resin, from the viewpoint of developability, pattern shape, and dispersion stability.

Structural unit Represented by Formula 5

The resin preferably further has a structural unit represented by Formula 5 from the viewpoint of dispersion stability, and more preferably the structural unit represented by Formula 4 and the structural unit represented by Formula 5 from the viewpoint of dispersion stability and developability.

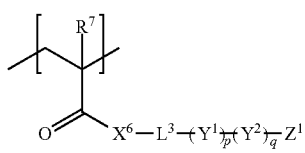

Formula 5

In Formula 5, $R^7$ represents a hydrogen atom or an alkyl group, $X^6$ represents an oxygen atom or $-NR^C-$, $R^C$ represents a hydrogen atom, an alkyl group, or an aryl group, $L^3$ represents a divalent linking group, $Y^1$ and $Y^2$ each independently represent an alkyleneoxy group or an alkylenecarbonyloxy group, $Z^1$ represents an aliphatic hydrocarbon group having 1 to 20 carbon atoms or an aromatic hydrocarbon group having 6 to 20 carbon atoms, p and q each independently represent an integer of 0 or more, and a value of p+q is 1 or more.

$R^7$ in Formula 5 is preferably a hydrogen atom or a methyl group and more preferably a methyl group.

$X^6$ in Formula 5 is preferably an oxygen atom from the viewpoint of dispersion stability.

$R_C$ is preferably a hydrogen atom or an alkyl group and more preferably a hydrogen atom.

$L^3$ in Formula 5 is preferably a group having a total number of atoms of 2 to 30, more preferably a group having a total number of atoms of 3 to 20 atoms, and particularly preferably a group having a total number of atoms of 4 to 10, from the viewpoint of dispersion stability.

In addition, $L^3$ in Formula 5 is preferably a group having a urethane bond or a urea bond, more preferably a group having a urethane bond, and particularly preferably a group in which an alkylene group and a urethane bond are bonded, from the viewpoint of dispersion stability.

In Formula 5, $Y^1$ and $Y^2$ are each independently preferably an alkylenecarbonyloxy group, and $Y^1$ and $Y^2$ are respectively more preferably different alkylenecarbonyloxy groups, from the viewpoint of dispersion stability.

The number of carbon atoms in the alkylenecarbonyloxy group is preferably 2 to 30, more preferably 3 to 10, and particularly preferably 5 to 8, from the viewpoint of dispersion stability.

From the viewpoint of dispersion stability, it is preferred that p is an integer of 1 or more, and q is an integer of 0 or more, it is more preferable that p is an integer of 1 or more, and q is an integer of 1 or more, and it is particularly preferred that p is an integer of 3 or more, and q is an integer of 3 or more.

In addition, p and q are each independently preferably 50 or less, more preferably 30 or less, and particularly preferably 20 or less.

From the viewpoint of dispersion stability, $Z^1$ in Formula 5 is preferably an aliphatic hydrocarbon group having 1 to 20 carbon atoms, more preferably an alkyl group having 4 to 20 carbon atoms, and particularly preferably an alkyl group having 6 to 20 carbon atoms.

In addition, the alkyl group for $Z^1$ is preferably a branched alkyl group from the viewpoint of dispersion stability.

Preferred examples of the structural unit represented by Formula 5 include the structures shown below, but it is needless to say that the present disclosure is not limited thereto.

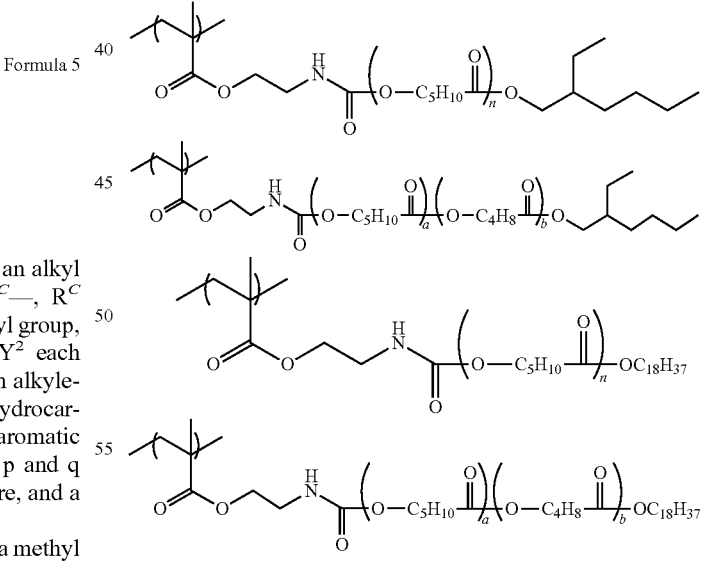

Note that n represents an integer of 1 or more, and a and b each independently represent an integer of 1 or more.

The resin may have one type of the structural unit represented by Formula 5 singly, or may have two or more types of the structural units represented by Formula 5.

The content of the structural unit represented by Formula 5 is preferably 5% by mass to 80% by mass, more preferably 5% by mass to 70% by mass, and particularly preferably 5% by mass to 60% by mass with respect to the total mass of the resin, from the viewpoint of developability and dispersion stability.

Other Structural Units

The resin may have other structural units than the structural unit represented by Formula 1, Formula 4, or Formula 5.

Other structural units are not particularly limited, and may have known structural units.

The weight-average molecular weight (Mw) of the resin is preferably 1,000 or more, more preferably 1,000 to 200,000, and particularly preferably 1,000 to 100,000.

The ethylenically unsaturated bond value of the resin is preferably 0.01 mmol/g to 2.5 mmol/g, more preferably 0.05 mmol/g to 2.3 mmol/g, still more preferably 0.1 mmol/g to 2.2 mmol/g, and particularly preferably 0.1 mmol/g to 2.0 mmol/g, from the viewpoint of deep curing properties, pattern shape, and adhesiveness to substrate.

The ethylenically unsaturated bond value of the resin represents a molar amount of the ethylenically unsaturated group per 1 g of the solid content of the resin, and is calculated in such a manner that a low molecular weight component (a) of an ethylenically unsaturated group site (for example, acrylic acid in a case of having an acryloxy group in the structural unit of the resin represented by Formula 1) is taken out from the resin by an alkali treatment, the content thereof was measured by high performance liquid chromatography (HPLC), and an ethylenically unsaturated bond value was calculated from the following equation based on the measured value. Specifically, 0.1 g of a measurement sample was dissolved in a tetrahydrofuran/methanol mixed liquid (50 mL/15 mL), and 10 mL of a 4 mol/L sodium hydroxide aqueous solution was added thereto, followed by reaction at 40° C. for 2 hours. The reaction solution was neutralized with 10.2 mL of a 4 mol/L methanesulfonic acid aqueous solution, then a mixed liquid obtained by adding 5 mL of ion exchange water and 2 mL of methanol was transferred to a 100 mL measuring flask, and a sample for HPLC measurement was prepared by measuring up with methanol and measured under the following conditions. The content of the low molecular weight component (a) was calculated from a separately prepared calibration curve of the low molecular weight component (a), and the ethylenically unsaturated bond value was calculated by the following equation.

Equation for Calculating Ethylenically Unsaturated Bond Value

Ethylenically unsaturated bond value [mmol/g]=(content of low molecular weight component (a) [ppm]/molecular weight of low molecular weight component (a) [g/mol])/(weighed value of liquid preparation polymer [g]×(concentration of solid contents [%] of polymer liquid/100)×10)

HPLC Measurement Conditions

Measuring equipment: Agilent-1200 (manufactured by Agilent Technologies, Inc.)

Column: Synergy 4u Polar-RP 80A manufactured by Phenomenex Inc., 250 mm×4.60 mm (inner diameter)+ guard column Column temperature: 40° C.

Analysis time: 15 minutes

Flow rate: 1.0 mL/min (maximum liquid sending pressure: 182 bar)

Injection volume: 5 μl

Detection wavelength: 210 nm

Eluent: tetrahydrofuran (for HPLC without stabilizer)/buffer solution (ion exchange aqueous solution containing 0.2 vol % of phosphoric acid and 0.2 vol % of triethylamine)=55/45 (vol %)

Suitable examples of the resin include those produced in Examples which will be described later.

Only one type of the resin or two or more types of resins may be included in the curable composition.

The content of the resin is preferably 10% by mass to 45% by mass, more preferably 12% by mass to 40% by mass, and particularly preferably 14% by mass to 35% by mass with respect to a total solid content of the curable composition, from the viewpoint of deep curing properties and dispersion stability. In the present specification, the total solid content refers to a total amount of components excluding a solvent from all components of the composition.

In addition, the content of the resin is preferably 20 parts by mass to 60 parts by mass, more preferably 22 parts by mass to 55 parts by mass, and particularly preferably 24 parts by mass to 50 parts by mass with respect to 100 parts by mass of the pigment, from the viewpoint of deep curing properties and dispersion stability.

The method for synthesizing the resin having the structural unit represented by Formula 1 is not particularly limited, and the resin can be synthesized by applying a known method.

For example, there is a method in which a precursor of the resin is synthesized by a known method, and then a group having an acryloyl group in the structural unit represented by Formula 1 is introduced thereinto by a polymer reaction. Examples of the polymer reaction include a reaction between a carboxy group of the resin precursor and a compound having an epoxy group and an acryloyl group, and a reaction between a hydroxy group of the resin precursor and a compound having an isocyanato group and an acryloyl group.

In addition, the resin is composed of different structural repeating units such as a structural repeating unit responsible for developability, a structural repeating unit responsible for dispersibility, and a structural repeating unit responsible for curing properties, and therefore it is preferable that the composition of the resin is uniform in order to effectively exhibit different functions.

The method of making the composition of the resin uniform may be, for example, a method of adding a monomer dropwise to a reaction system so as to match consumption rates of different monomer species. In general, it is possible to match a reaction rate by increasing an initial concentration of a monomer species having a low consumption rate in the reaction system and adding dropwise a monomer species having a high consumption rate in the reaction system to create a concentration difference in the reaction system.

<Pigment>

The curable composition according to the present disclosure includes a pigment.

Examples of the pigment include an inorganic pigment and an organic pigment.

Examples of the inorganic pigment include black pigments such as carbon black and titanium black; oxides of metals such as iron, cobalt, aluminum, cadmium, lead, copper, titanium, magnesium, chromium, zinc, and antimony, and metal complex salts. Examples of the organic pigment or inorganic pigment include the following.

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, 42, 58, and 59 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

In addition, a halogenated zinc phthalocyanine pigment having an average number of halogen atoms of 10 to 14, an average number of bromine atoms of 8 to 12, and an average number of chlorine atoms of 2 to 5 in the molecule can also be used as the green pigment. Specific examples of the green pigment include compounds described in WO2015/118720A.

In addition, an aluminum phthalocyanine compound having a phosphorus atom can also be used as the blue pigment. Specific examples of the blue pigment include compounds described in paragraphs [0022] to [0030] of JP2012-247591A and paragraph [0047] of JP2011-157478A.

Pigment Derivatives

The curable composition according to the present disclosure may further include a pigment derivative.

Examples of the pigment derivative include compounds having a structure in which a part of an organic pigment is substituted with an acidic group, a basic group, or a phthalimidomethyl group. Examples of the organic pigment for constituting the pigment derivative include a diketopyrrolopyrrole-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, and a metal complex-based pigment. In addition, the acidic group contained in the pigment derivative is preferably a sulfonic acid group, a carboxylic acid group, or a quaternary ammonium base thereof, more preferably a carboxylic acid group or a sulfonic acid group, and particularly preferably a sulfonic acid group. The basic group contained in the pigment derivative is preferably an amino group and particularly preferably a tertiary amino group. Specific examples of the pigment derivative include the following compounds. In addition, reference can be made to the description in paragraphs [0162] to [0183] of JP2011-252065A, the contents of which are incorporated herein by reference.

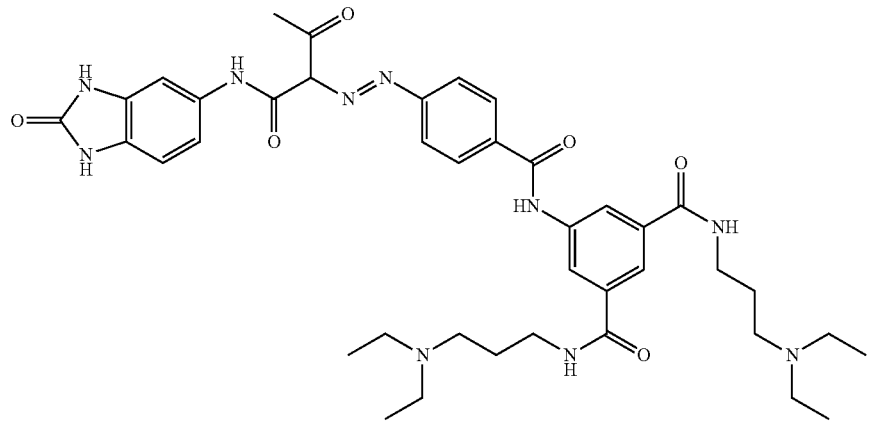

In addition, an infrared absorbing pigment can be suitably used as the pigment.

The infrared absorbing pigment is not particularly limited, and a known infrared absorbing pigment is used. For example, the infrared absorbing pigment is preferably a diiminium compound, a squarylium compound, a cyanine compound, a phthalocyanine compound, a naphthalocyanine compound, a quaterylene compound, an aminium compound, an iminium compound, an azo compound, an anthraquinone compound, a porphyrin compound, a pyrrolopyrrole compound, an oxonol compound, a croconium compound, a hexaphyrin compound, a metal dithiol compound, a copper compound, a tungsten compound, or a metal boride, more preferably a diiminium compound, a squarylium compound, a cyanine compound, a phthalocyanine compound, a naphthalocyanine compound, a quaterylene compound, a pyrrolopyrrole compound, a metal dithiol compound, a copper compound, or a tungsten compound, still more preferably a squarylium compound, a cyanine compound, a phthalocyanine compound, or a pyrrolopyrrole compound, and particularly preferably a squarylium compound or a pyrrolopyrrole compound.

Further examples of the infrared absorbing pigment include infrared absorbing pigments such as infrared absorbers described in JP2009-263614A, JP2011-068731A, WO2015/166873A, and the like. A specific example of the infrared absorbing pigment may be a compound having the following structure.

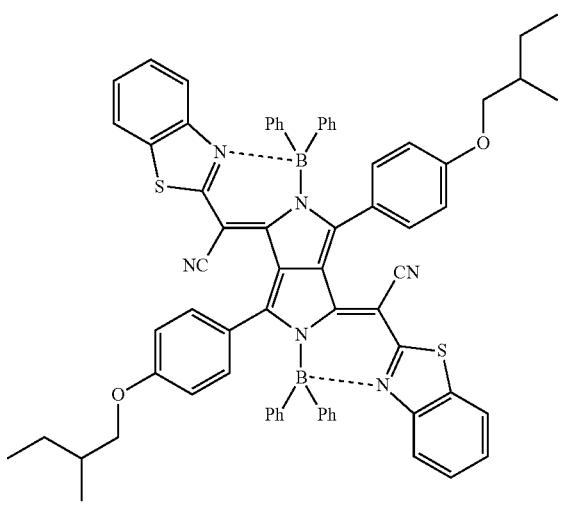

For example, the infrared absorbing pigment is preferably a compound having absorption in a wavelength range of 700 nm to 2,000 nm and more preferably a compound having a maximum absorption wavelength in a wavelength range of 700 nm to 2,000 nm.

The volume average particle size of the pigment, preferably the infrared absorbing pigment is not particularly limited, but is preferably 0.01 μm to 0.1 μm and more preferably 0.01 μm to 0.05 μm.

The pigments may be used alone or in combination of two or more thereof.

The content of the pigment is preferably 10% by mass to 80% by mass, more preferably 40% by mass to 70% by mass, still more preferably 50% by mass to 70% by mass, and particularly preferably 60% by mass to 70% by mass with respect to the total solid content of the curable composition, from the viewpoint of colorability, developability, and curing properties.

<Photopolymerization Initiator>

The curable composition according to the present disclosure includes a photopolymerization initiator.

The photopolymerization initiator is not particularly limited as long as it has an ability to initiate polymerization, and can be appropriately selected from known photopolymerization initiators. For example, a compound having photosensitivity to light in the ultraviolet region to the visible region is preferable. In addition, the photopolymerization initiator may be a compound that generates an active radical by causing some action with a photoexcited sensitizer.

From the viewpoint of curing properties and sensitivity, the photopolymerization initiator is preferably a photoradical polymerization initiator and more preferably a compound having an oxime structure.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxy ketone compound, and an α-amino ketone compound. From the viewpoint of exposure sensitivity, the photopolymerization initiator is preferably at least one compound selected from the group consisting of a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyloxadiazole compound, and a 3-aryl-substituted coumarin compound; more preferably at least one compound selected from the group consisting of an oxime compound, an α-hydroxyketone compound, an α-aminoketone compound, and an acylphosphine compound; and still more preferably an oxime compound.

Regarding the photopolymerization initiator, reference can be made to the description of paragraphs [0065] to [0111] of JP2014-130173A and paragraphs [0274] to [0306] of JP2013-029760A, the contents of which are incorporated herein by reference.

Examples of commercially available α-hydroxyketone compounds include IRGACURE-184, DAROCUR-1173, IRGACURE-500, IRGACURE-2959, and IRGACURE-127 (all of which are manufactured by BASF SE). Examples of commercially available α-aminoketone compounds include IRGACURE-907, IRGACURE-369, IRGACURE-379, and IRGACURE-379EG (all of which are manufactured by BASF SE). Examples of commercially available acylphosphine compounds include IRGACURE-819 and DAROCUR-TPO (both of which are manufactured by BASF SE).

Examples of the oxime compound include compounds described in JP2001-233842A, compounds described in JP2000-080068A, compounds described in JP2006-342166A, compounds described in J. C. S. Perkin II (1979, pp. 1653 to 1660), compounds described in J. C. S. Perkin II (1979, pp. 156 to 162), compounds described in Journal of Photopolymer Science and Technology (1995, pp. 202 to 232), compounds described in JP2000-066385A, compounds described in JP2000-080068A, compounds described in JP2004-534797A, compounds described in JP2006-342166A, compounds described in JP2017-019766A, compounds described in JP6065596B, compounds described in WO2015/152153A, and compounds described in WO2017/051680A. Specific examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. As commercially available oxime compounds, IRGACURE-OXE01, IRGACURE-OXE02, IRGACURE-OXE03, and IRGACURE-OXE04 (all of which are manufactured by BASF SE) are also suitably used. In addition, TRONLY TR-PBG-304, TRONLY TR-PBG-309, and TRONLY TR-PBG-305 (all of which are manufactured by CHANGZHOU TRONLY NEW ELECTRONIC MATERIALS CO., LTD), and ADEKA ARKLS NCI-930 and ADEKA OPTOMER N-1919 (photopolymerization initiator 2 of JP2012-014052A) (both of which are manufactured by ADEKA Corporation) can be mentioned as commercially available oxime compounds.

In addition, as oxime compounds other than the above, compounds described in JP2009-519904A in which an oxime is linked to an N-position of a carbazole ring; compounds described in U.S. Pat. No. 7,626,957B in which a hetero substituent is introduced into a benzophenone moiety; compounds described in JP2010-015025A and US2009-292039A in which a nitro group is introduced into a coloring agent moiety; ketoxime compounds described in WO2009/131189A; compounds described in U.S. Pat. No.

7,556,910B, which contain a triazine skeleton and an oxime skeleton in the same molecule; and compounds described in JP2009-221114A, which have a maximum absorption wavelength of 405 nm and satisfactory sensitivity to a g-ray light source, may be used.

An oxime compound having a fluorene ring can also be used as the photopolymerization initiator. Specific examples of the oxime compound having a fluorene ring include compounds described in JP2014-137466A, the contents of which are incorporated herein by reference.

An oxime compound having a benzofuran skeleton can also be used as the photopolymerization initiator. Specific examples thereof include compounds OE-01 to OE-75 described in WO2015/036910A.

An oxime compound having a skeleton in which at least one benzene ring of a carbazole ring became a naphthalene ring can also be used as the photopolymerization initiator. Specific examples of such an oxime compound include compounds described in WO2013/083505A.

An oxime compound having a fluorine atom can also be used as the photopolymerization initiator. Specific examples of the oxime compound having a fluorine atom include compounds described in JP2010-262028A, the contents of which are incorporated herein by reference, Compounds 24 and 36 to 40 described in JP2014-500852A, the contents of which are incorporated herein by reference, and Compound (C-3) described in JP2013-164471A, the contents of which are incorporated herein by reference.

An oxime compound having a nitro group can be used as the photopolymerization initiator. The oxime compound having a nitro group is also preferably a dimer. Specific examples of the oxime compound having a nitro group include compounds described in paragraphs [0031] to [0047] of JP2013-114249A, and paragraphs [0008] to [0012] and [0070] to [0079] of JP2014-137466A, compounds described in paragraphs [0007] to [0025] of JP4223071B, and ADEKAARKLS NCI-831 (manufactured by ADEKA Corporation).

Preferred specific examples of the oxime compound are shown below, but are not limited thereto.

(C-1)
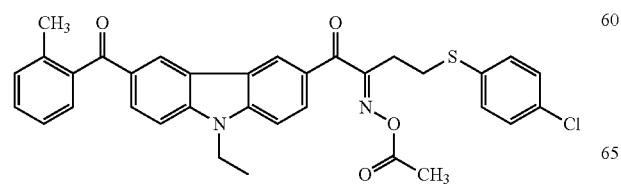

(C-2)
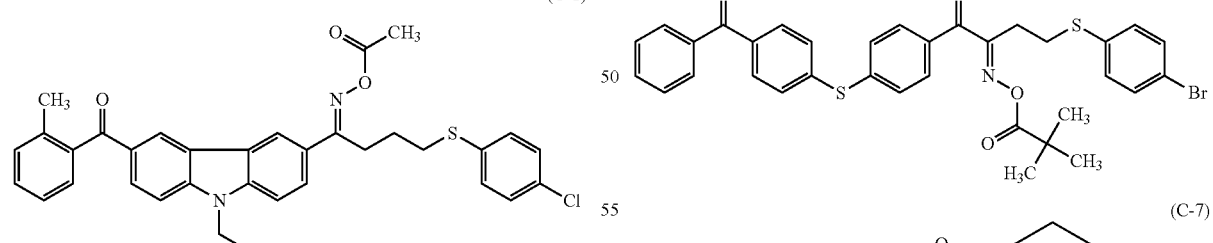

(C-3)
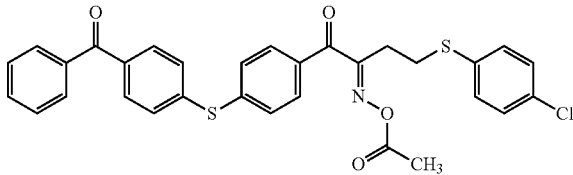

(C-4)
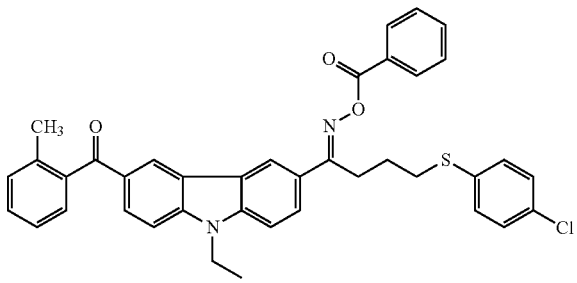

(C-5)
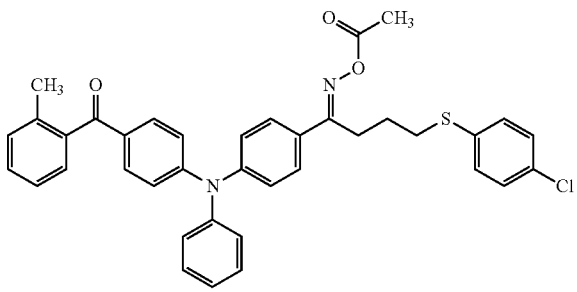

(C-6)
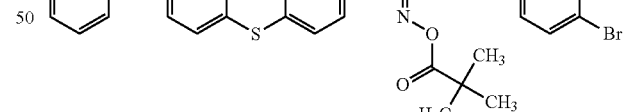

(C-7)
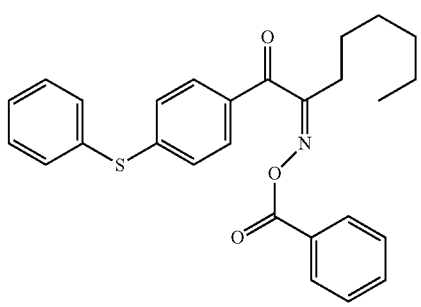

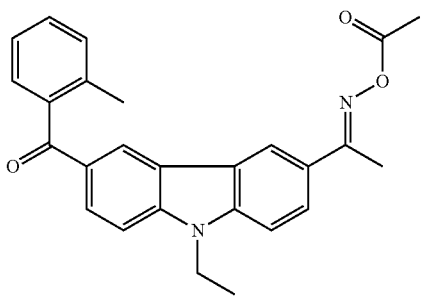

(C-8)

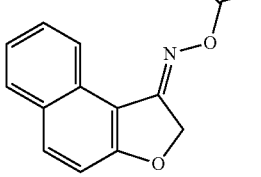

(C-9)

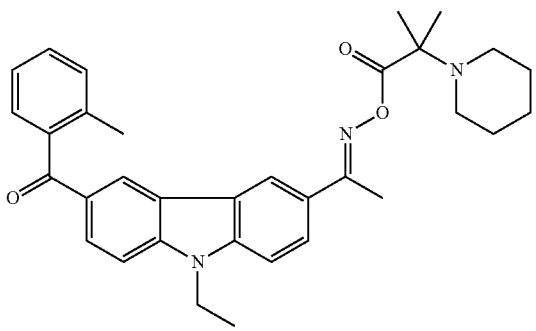

(C-10)

(C-11)

(C-12)

(C-13)

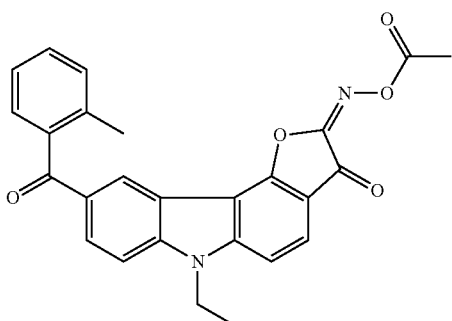

(C-14)

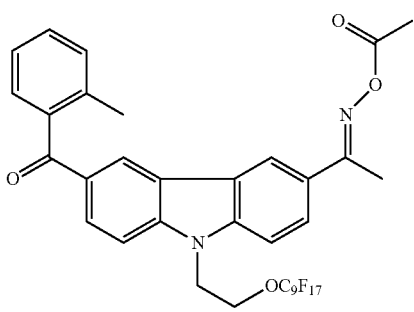

The oxime compound is preferably a compound having a maximum absorption wavelength in the wavelength range of 350 nm to 500 nm, and more preferably a compound having a maximum absorption wavelength in the wavelength range of 360 nm to 480 nm. In addition, the oxime compound is preferably a compound having high absorbance at wavelengths of 365 nm and 405 nm.

The molar light absorption coefficient at a wavelength of 365 nm or 405 nm of the oxime compound is preferably 1,000 to 300,000, more preferably 2,000 to 300,000, and particularly preferably 5,000 to 200,000 from the viewpoint of sensitivity. The molar light absorption coefficient of the compound can be measured using a known method. For example, it is preferable to measure the molar light absorption coefficient of the compound with an ultraviolet-visible spectrophotometer (Cary-5 spectrophotometer manufactured by Varian Medical Systems, Inc.) using an ethyl acetate solvent at a concentration of 0.01 g/L.

A difunctional or tri- or higher functional photopolymerization initiator may be used as the photopolymerization initiator. Specific examples of such a photopolymerization initiator include dimers of oxime compounds described in JP2010-527339A, JP2011-524436A, WO2015/004565A, paragraphs [0412] to [0417] of JP2016-532675A, and paragraphs [0039] to [0055] of WO2017/033680A, Compound (E) and Compound (G) described in JP2013-522445A, and Cmpd 1 to 7 described in WO2016/034963A.

The photopolymerization initiators may be used alone or in combination of two or more thereof.

The content of the photopolymerization initiator is preferably 0.1% by mass to 50% by mass, more preferably 0.5% by mass to 30% by mass, and particularly preferably 1% by mass to 20% by mass with respect to the total solid content of the curable composition, from the viewpoint of sensitivity and pattern formability.

<Polymerization inhibitor>

The curable composition according to the present disclosure preferably includes a polymerization inhibitor from the viewpoint of storage stability.

Examples of the polymerization inhibitor include 2,2,6,6-tetramethylpiperidine-1-oxyl, 4-hydroxy-2,2,6,6-tetramethylpiperidine-1-oxyl, hydroquinone, α-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and an N-nitrosophenylhydroxyamine salt (an ammonium salt, a cerous salt, or the like).

Above all, from the viewpoint of storage stability, a compound having an N-oxyl radical structure is preferable, and 2,2,6,6-tetramethylpiperidine-1-oxyl is particularly preferable.

Incidentally, the polymerization inhibitor may function as an antioxidant.

The molecular weight of the polymerization inhibitor is preferably 200 or less, more preferably 180 or less, still more preferably 160 or less, and particularly preferably 120 or more and 160 or less from the viewpoint of curing properties and pattern shape.

In addition, the polymerization inhibitor is preferably a compound having no aromatic ring from the viewpoint of curing properties and pattern shape.

The polymerization inhibitors may be used alone or in combination of two or more thereof.

The content of the polymerization inhibitor is preferably 0.1 ppm to 1,000 ppm, more preferably 1 ppm to 500 ppm, and particularly preferably 1 ppm to 100 ppm with respect to the total solid content of the curable composition, from the viewpoint of storage stability.

<Other Components>

The curable composition according to the present disclosure is preferably a composition that can be finally cured to obtain a cured film.

In addition, the curable composition according to the present disclosure is preferably a composition capable of forming a pattern of a cured film by, for example, patternwise exposure, and may be a negative composition or a positive composition as long as a cured film is finally obtained.

In a case where the curable composition according to the present disclosure is a negative composition, for example, an aspect including a polymerization initiator, a polymerizable compound, and an alkali-soluble resin is preferable.

In addition, in a case where the curable composition according to the present disclosure is a positive composition, for example, there is an aspect including a photoacid generator, a polymer having a structural unit having a group in which an acid group is protected by an acid-decomposable group, and a polymer having a structural unit having a crosslinkable group.

Hereinafter, individual components included in the aspect in which the curable composition according to the present disclosure is a negative composition will be described.

The individual components included in the aspect in which the curable composition according to the present disclosure is a positive composition include the individual components described in WO2014/003111A, and preferred aspects thereof are also the same.

Polymerizable Compound

The curable composition according to the present disclosure preferably includes a polymerizable compound.

The polymerizable compound that can be used in the present disclosure is preferably an ethylenically unsaturated compound and more preferably a compound having a terminal ethylenically unsaturated group.

As a group of such a compound, known compounds can be used without any particular limitation.

These compounds have a chemical form such as a monomer, a prepolymer, that is, a dimer, a trimer or an oligomer, or a mixture thereof and a copolymer thereof. Examples of the monomer and the copolymer thereof include unsaturated carboxylic acids (for example, acrylic acid, methacrylic acid, itaconic acid, crotonic acid, isocrotonic acid, and maleic acid), and esters and amides thereof, among which an ester of an unsaturated carboxylic acid with an aliphatic polyhydric alcohol compound, or an amide of an unsaturated carboxylic acid with an aliphatic polyvalent amine compound is preferably used. In addition, a product of an addition reaction of an unsaturated carboxylic acid ester or amide having a nucleophilic substituent such as a hydroxyl group, an amino group, or a mercapto group with a monofunctional or polyfunctional isocyanate or epoxy, and a product of a dehydration condensation reaction of such an unsaturated carboxylic acid ester or amide with a monofunctional or polyfunctional carboxylic acid are also suitably used. In addition, a product of an addition reaction of an unsaturated carboxylic acid ester or amide having an electrophilic substituent such as an isocyanate group or an epoxy group with a monofunctional or polyfunctional alcohol, amine or thiol, and further a product of a substitution reaction of an unsaturated carboxylic acid ester or amide having a leaving substituent such as a halogen group or a tosyloxy group with a monofunctional or polyfunctional alcohol, amine or thiol are also suitable. In addition, as another example, it is also possible to use a group of compounds substituted with unsaturated phosphonic acid, styrene, vinyl ether, or the like in place of the foregoing unsaturated carboxylic acid.

Specific examples of the monomer of an ester of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, and isocyanuric acid EO-modified triacrylate.

Examples of the methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl] dimethylmethane.

In addition, a urethane-based addition polymerizable compound produced by using an addition reaction of an isocyanate with a hydroxyl group is also suitable, and specific examples thereof include a vinyl urethane compound containing two or more polymerizable vinyl groups in one molecule, which is obtained by addition of a vinyl monomer containing a hydroxyl group represented by General Formula (I) to a polyisocyanate compound having two or more isocyanate groups in one molecule, which is described in JP1973-041708B (JP-S-48-041708B).

$$CH_2=C(R)COOCH_2CH(R') OH \quad (I)$$

in which R and R' each represent H or $CH_3$.

In addition, urethane acrylates described in JP1976-037193A (JP-S-51-037193A), JP1990-032293B (JP-H-02-032293B), and JP1990-016765B (JP-H-02-016765B), and urethane compounds having an ethylene oxide-based skeleton described in JP1983-049860B (JP-S-58-049860B), JP1981-017654B (JP-S-56-017654B), JP1987-039417B (JP-S-62-039417B), and JP1987-039418B (JP-S-62-039418B) are also suitable. Further, use of addition polymerizable compounds having an amino structure or a sulfide structure in the molecule, described in JP1989-277653A (JP-S-63-277653A), JP1989-260909A (JP-S-63-260909A), and JP1989-105238A (JP-H-01-105238A), makes it possible to obtain a curable composition having a very excellent photosensitizing speed.

Other examples of the polymerizable compound include compounds described in paragraphs [0178] to [0190] of JP2007-277514A.

The content of the polymerizable compound is preferably 0% by mass to 90% by mass, more preferably 0% by mass to 25% by mass, still more preferably 0% by mass to 20% by mass, and even still more preferably 0% by mass to 15% by mass with respect to the total solid content of the curable composition, from the viewpoint of colorability, developability, and curing properties.

Alkali-Soluble Resin

The curable composition according to the present disclosure preferably includes an alkali-soluble resin.

The alkali-soluble resin is a high molecular weight polymer, and can be appropriately selected from alkali-soluble resins having at least one group (for example, a carboxyl group, a phosphoric acid group, or a sulfonic acid group) that promotes alkali solubility in a molecule (preferably a molecule having an acrylic-based copolymer or a styrene-based copolymer as a main chain). Of these, more preferred is an alkali-soluble resin which is soluble in an organic solvent and can be developed with a weak alkaline aqueous solution.

For example, a known radical polymerization method can be applied to the production of the alkali-soluble resin. Polymerization conditions such as temperature, pressure, type and amount of radical initiator, and type of solvent in a case of producing an alkali-soluble resin by a radical polymerization method can be easily set by those skilled in the art, and the polymerization conditions can also be determined experimentally.

The high molecular weight polymer is preferably a polymer having a carboxylic acid in a side chain thereof. Examples of such a high molecular weight polymer include polymers having a carboxylic acid in a side chain thereof, such as methacrylic acid copolymers, acrylic acid copolymers, itaconic acid copolymers, crotonic acid copolymers, maleic acid copolymers, and partially esterified maleic acid copolymers, such as those described in, for example, JP1984-044615A (JP-S-59-044615A), JP1979-034327B (JP-S-54-034327B), JP1983-012577B (JP-S-58-012577B), JP1979-025957B (JP-S-54-025957B), JP1984-053836A (JP-59-053836A), and JP1984-071048A (JP-S-59-071048A); acidic cellulose derivatives having a carboxylic acid in a side chain thereof, and polymers obtained by adding an acid anhydride to a polymer having a hydroxyl group. Further, high molecular weight polymers having a (meth)acryloyl group in a side chain thereof are also preferable.

Specifically, a copolymer of (meth)acrylic acid and other monomers copolymerizable therewith is particularly suitable as the alkali-soluble resin.

Examples of other monomers copolymerizable with (meth)acrylic acid include (meth)acrylic acid esters, crotonic acid esters, vinyl esters, maleic acid diesters, fumaric acid diesters, itaconic acid diesters, (meth)acrylamides, styrenes, vinyl ethers, vinyl ketones, olefins, maleimides, and (meth)acrylonitriles.

Examples of (meth)acrylic acid esters include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, amyl (meth)acrylate, n-hexyl (meth)acrylate, cyclohexyl (meth)acrylate, t-butyl cyclohexyl (meth)acrylate, 2-ethylhexyl (meth)acrylate, t-octyl (meth)acrylate, dodecyl (meth)acrylate, octadecyl (meth)acrylate, acetoxyethyl (meth)acrylate, phenyl (meth)acrylate, 2-hydroxy ethyl (meth)acrylate, 2-hydroxypropyl (meth)acrylate, 3-hydroxypropyl (meth)acrylate, 4-hydroxybutyl (meth)acrylate, 2-methoxyethyl (meth)acrylate, 2-ethoxyethyl (meth)acrylate, 2-(2-methoxyethoxy)ethyl (meth)acrylate, 3-phenoxy-2-hydroxypropyl (meth)acrylate, 2-chloroethyl (meth)acrylate, glycidyl (meth)acrylate, 3,4-epoxycyclohexylmethyl (meth)acrylate, vinyl (meth)acrylate, 2-phenylvinyl (meth)acrylate, 1-propenyl (meth)acrylate, allyl (meth)acrylate, 2-aryloxyethyl (meth)acrylate, propargyl (meth)acrylate, benzyl (meth)acrylate, diethylene glycol monomethyl ether (meth)acrylate, diethylene glycol monoethyl ether (meth)acrylate, triethylene glycol monomethyl ether (meth)acrylate, triethylene glycol monoethyl ether (meth)acrylate, polyethylene glycol monomethyl ether (meth)acrylate, polyethylene glycol monoethyl ether (meth)acrylate, β-phenoxyethoxyethyl (meth)acrylate, nonylphenoxy polyethylene glycol (meth)acrylate, dicyclopentenyl (meth)acrylate, dicyclopentenyloxyethyl (meth)acrylate, trifluoroethyl (meth)acrylate, octafluoropentyl (meth)acrylate, perfluorooctylethyl (meth)acrylate, dicyclopentanyl (meth)acrylate, tribromophenyl (meth)acrylate, tribromophenyloxyethyl (meth)acrylate, and γ-butyrolactone (meth)acrylate.

The weight-average molecular weight of the alkali-soluble resin that can be used in the present disclosure is preferably 5,000 or more and more preferably 10,000 to 300,000, and the number-average molecular weight of the alkali-soluble resin that can be used in the present disclosure is preferably 1,000 or more and more preferably 2,000 to 250,000. The polydispersity (weight-average molecular weight/number-average molecular weight) is preferably in a range of 1.1 to 10 and more preferably in a range of 1.2 to 5.

The alkali-soluble resin may be any of a random polymer, a block polymer, a graft polymer, or the like.

Other examples of the alkali-soluble resin include compounds described in paragraphs [0162] to [0175] of JP2007-277514A.

In addition, at least one selected from the group consisting of the first polymer compound and the second polymer compound according to the present disclosure can also be used as the alkali-soluble resin.

The content of the alkali-soluble resin is preferably 1% by mass to 20% by mass, more preferably 2% by mass to 15% by mass, and particularly preferably 3% by mass to 12% by mass with respect to the total solid content of the curable composition.

Solvent

The curable composition according to the present disclosure may include a solvent.

Examples of the solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, alkyl oxyacetates (such as methyl oxyacetates, ethyl oxyacetates, and butyl oxyacetates (for example, methyl methoxyacetate, ethyl methoxyacetate, butyl methoxyacetate, methyl ethoxyacetate, and ethyl ethoxyacetate), alkyl 3-oxypropionates such as methyl 3-oxypropionates and ethyl 3-oxypropionates (for example, methyl 3-methoxypropionate, ethyl 3-methoxypropionate, methyl 3-ethoxypropionate, and ethyl 3-ethoxypropionate), alkyl 2-oxypropionates such as methyl 2-oxypropionates, ethyl 2-oxypropionates, and propyl 2-oxypropionates (for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate;

ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate, and propylene glycol propyl ether acetate;

ketones such as methyl ethyl ketone, cyclohexanone, 2-heptanone, and 3-heptanone; and aromatic hydrocarbons such as toluene and xylene.

Among these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether acetate, and the like are suitable.

The content of the solvent is preferably such that the total solid content of the curable composition is 10% by mass to 90% by mass. The lower limit of the content of the solvent is more preferably 15% by mass or more and still more preferably 20% by mass or more. The upper limit of the content of the solvent is more preferably 80% by mass or less and still more preferably 70% by mass or less.

The solvent may be only one type or two or more types, and in a case where two or more types of solvents are used, the total amount thereof is preferably within the above range.

Sensitizer

The curable composition according to the present disclosure may contain a sensitizer for the purpose of improving the radical generation efficiency of the radical initiator and widening the photosensitive wavelength. The sensitizer that can be used in the present disclosure is preferably a sensitizer that sensitizes the above-mentioned photopolymerization initiator by an electron transfer mechanism or an energy transfer mechanism.

The sensitizer that can be used in the present disclosure includes those belonging to the compounds listed below and having an absorption wavelength in the wavelength range of 300 nm to 450 nm.

Preferred examples of the sensitizer include those belonging to the following compounds and having an absorption wavelength in the wavelength range of 330 nm to 450 nm.

Examples of the sensitizer include polynuclear aromatics (for example, phenanthrene, anthracene, pyrene, perylene, triphenylene, and 9,10-dialkoxyanthracene), xanthenes (for example, fluorescein, eosin, erythrosine, rhodamine B, and rose bengal), thioxanthones (for example, isopropyl thioxanthone, diethyl thioxanthone, and chlorothioxanthone), cyanines (for example, thiacarbocyanine and oxacarbocyanine), merocyanines (for example, merocyanine and carbomerocyanine), phthalocyanines, thiazines (for example, thionine, methylene blue, and toluidine blue), acridines (for example, acridine orange, chloroflavin, and acriflavine), anthraquinones (for example, anthraquinone), squaliums (for example, squalium), acridine orange, coumarins (for example, 7-diethylamino-4-methylcoumarin), ketocoumarins, phenothiazines, phenazines, styrylbenzenes, azo compounds, diphenylmethane, triphenylmethane, distyrylbenzenes, carbazoles, porphyrins, spiro compounds, quinacridones, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, and Michler's ketone, and heterocyclic compounds such as N-aryloxazolidinone. Further, other examples of the sensitizer include compounds described in EP568993B, U.S. 4,508,811A, U.S. 5,227,227A, JP2001-125255A, JP1999-271969A (JP-H-11-271969A), and the like.

Sensitizers may be used alone or in combination of two or more thereof.

From the viewpoint of light absorption efficiency in a deep portion and initiation decomposition efficiency, the content of the sensitizer in the curable composition according to the present disclosure is preferably 0.1% by mass to 20% by mass and more preferably 0.5% by mass to 15% by mass with respect to the total solid content of the curable composition.

Co-Sensitizer

The curable composition according to the present disclosure may contain a co-sensitizer. The co-sensitizer has a function such as further improving the sensitivity of a sensitizing dye and an initiator to actinic radiation, or preventing the inhibition of polymerization of a polymerizable compound due to oxygen.

In addition, examples of the co-sensitizer include compounds described in paragraphs [0233] to [0241] of JP2007-277514A.

From the viewpoint of improving the curing rate by balancing polymerization growth rate and chain transfer, the content of the co-sensitizer is preferably in a range of 0.1% by mass to 30% by mass, more preferably in a range of 1% by mass to 25% by mass, and still more preferably in a range of 0.5% by mass to 20% by mass with respect to the mass of the total solid content of the curable composition.

Other Colorants

The curable composition according to the present disclosure may further contain a colorant other than the particles described above.

Examples of other colorants include a dye.

Examples of the dye include dyes described in JP1989-090403A (JP-S-64-090403A), JP1989-091102A (JP-S-64-091102A), JP1989-094301A (JP-H-01-094301A), JP1994-011614A (JP-H-06-011614A), U.S. 4,808,501A, U.S. 0,505,950A, U.S. 5,667,920A, JP1993-333207A (JP-H-05-333207A), JP1994-035183A (JP-H-06-035183A), JP1994-

051115A (JP-H-06-051115A), JP1994-194828A (JP-H-06-194828A), and the like. In a case of being classified as chemical structures, a pyrazole azo compound, a pyromethene compound, an anilinoazo compound, a triarylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, and the like can be mentioned.

In addition, a coloring agent multimer may be used as the colorant. The coloring agent multimer is preferably a dye used by being dissolved in a solvent, but may form particles. In a case where the coloring agent multimer is a particle, the coloring agent multimer is used by being dispersed in a solvent or the like. The coloring agent multimer in the particle state can be obtained, for example, by emulsion polymerization. Examples of the coloring agent multimer in the particle state include compounds described in JP2015-214682A. In addition, compounds described in JP2011-213925A, JP2013-041097A, JP2015-028144A, JP2015-030742A, and the like can also be used as the coloring agent multimer.

The curable composition according to the present disclosure may contain, as necessary, various additives such as a fluorine-based organic compound, other fillers, a polymer compound other than the resin having a structural unit represented by Formula I and the alkali-soluble resin, a surfactant, an adhesion promoter, an antioxidant, an ultraviolet absorber, and an aggregation inhibitor.

Examples of other components include compounds described in paragraphs [0238] to of JP2007-277514A.

<Preparation of Curable Composition>

The method for preparing the curable composition according to the present disclosure is not particularly limited, and the curable composition can be obtained by mixing individual components included in the curable composition by a known method.

In addition, in order to improve the dispersibility of particles, the curable composition according to the present disclosure may be obtained in such a manner that the particles are mixed with at least one of the first polymer compound or the second polymer compound to prepare a particle dispersion liquid, and then other components are further added and mixed therewith.

In addition, filtration may be carried out through a filter in order to remove a foreign material or reduce defects. Any filter can be used without particular limitation as long as it has been conventionally used for filtration or the like.

(Cured Product)

The cured product according to the present disclosure is a cured product obtained by curing the curable composition according to the present disclosure.

The curing method is not particularly limited, and examples thereof include curing by exposure to actinic rays such as ultraviolet light and curing by heating.

The cured product according to the present disclosure is preferably in the form of a thin film, for example.

The cured product according to the present disclosure is suitably used as a color filter, an infrared absorption filter, a black matrix provided between pixels of the color filter, a refractive index adjusting film, or the like, and is particularly suitably used as the color filter.

(Color Filter and Production Method Thereof)

The color filter according to the present disclosure comprises the cured product according to the present disclosure.

The color filter according to the present disclosure preferably comprises the cured product according to the present disclosure on a support.

In the color filter, the cured product according to the present disclosure may be a pixel of the color filter or a black matrix provided between the pixels of the color filter, or may be both the pixel of the color filter and the black matrix.

Hereinafter, the color filter according to the present disclosure will be described in detail through the production method thereof (First Aspect of Method for Producing Color Filter)

A first aspect of the method for producing a color filter according to the present disclosure includes a step of applying the curable composition according to the present disclosure onto a support to form a composition film (composition film forming step), a step of exposing the formed composition film to light in a pattern-wise manner (hereinafter, abbreviated as "exposing step" where appropriate), and a step of developing the composition film after exposure to form a colored pattern (hereinafter, abbreviated as "developing step" where appropriate).

Hereinafter, individual steps will be described.

<Composition Film Forming Step>

In the composition film forming step, the curable composition according to the present disclosure is applied onto a support to form a composition film.

Examples of the support which can be used in the present step include a soda glass, a Pyrex (registered trademark) glass, a quartz glass, and those glasses with a transparent conductive film attached thereto which are used in a liquid crystal display element or the like, a photoelectric conversion element substrate used in an imaging element or the like, for example, a silicon substrate, and a complementary metal oxide film semiconductor (CMOS). On these substrates, a black stripe, which isolates individual pixels, is formed in some cases.

In addition, on these substrates, as necessary, an undercoat layer (another layer) may be provided for improving adhesion with an upper layer, preventing diffusion of a substance, or flattening a substrate surface.

As the method for applying the curable composition according to the present disclosure onto the support, various application methods such as slit coating, ink jet method, spin coating, cast coating, roll coating, and screen printing can be applied.

The coating film thickness of the curable composition is preferably 0.1 µm to 10 µm, more preferably 0.2 µm to 5 µm, and still more preferably 0.2 µm to 3 µm.

Drying (pre-baking) of the composition film applied onto the support may be carried out preferably at a temperature of 50° C. to 140° C. for 10 seconds to 300 seconds using a hot plate, an oven, or the like.

<Exposing Step>

In the exposing step, the composition film formed in the composition film forming step is exposed in a pattern-wise manner. The method of exposing the composition film to light in a pattern-wise manner may be, for example, a method of exposing the composition film to light through a mask having a predetermined mask pattern.

In the present step, in a case where the curable composition according to the present disclosure is a negative curable composition, a light-irradiated portion can be cured. In a case where the curable composition according to the present disclosure is a positive curable composition, the solubility of the light-irradiated portion in a developer increases.

As the radiation that can be used in the exposure, ultraviolet rays such as g-line and i-line are particularly preferably used. The exposure amount is preferably 5 mJ/cm$^2$ to 1,500 mJ/cm$^2$, more preferably 10 mJ/cm$^2$ to 1,000 mJ/cm$^2$, and particularly preferably 10 mJ/cm$^2$ to 500 mJ/cm$^2$.

In a case where the color filter according to the present disclosure is for a liquid crystal display element, the exposure amount is preferably 5 mJ/cm$^2$ to 200 mJ/cm$^2$, more preferably 10 mJ/cm$^2$ to 150 mJ/cm$^2$, and particularly preferably 10 mJ/cm$^2$ to 100 mJ/cm$^2$, in the above range.

In addition, in a case where the color filter according to the present disclosure is for a solid-state imaging element, the exposure amount is preferably 30 mJ/cm$^2$ to 1,500 mJ/cm$^2$, more preferably 50 mJ/cm$^2$ to 1,000 mJ/cm$^2$, and particularly preferably 80 mJ/cm$^2$ to 500 mJ/cm$^2$, in the above range.

<Developing Step>

Next, by carrying out a development treatment, an unexposed portion in the exposing step is eluted in a developer, and therefore a photocured portion is obtained as a colored pattern. The developer is not particularly limited as long as it can remove the curable composition in an uncured portion, and a known developer can be used. Specifically, a combination of various organic solvents or an alkaline aqueous solution can be used as the developer.

The development temperature is preferably 20° C. to 30° C., and the development time is preferably 20 seconds to 90 seconds.

Examples of the organic solvent include the above-mentioned solvents that can be used in a case of preparing the curable composition according to the present disclosure.

As to the alkaline aqueous solution, an alkaline aqueous solution obtained by diluting an alkaline compound, such as sodium hydroxide, potassium hydroxide, sodium carbonate, sodium hydrogen carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, or 1,8-diazabicyclo-[5.4.0]-7-undecene, with pure water so as to have a concentration of 0.001% by mass to 10% by mass and preferably 0.01% by mass to 1% by mass is preferably used as the developer.

In addition, in a case where the developer consisting of such an alkaline aqueous solution is used, an aspect of washing (rinsing) with pure water after development is also preferred.

After the developing step, an excess developer may be washed away and drying may be carried out, followed by a heat treatment (post-baking).

The post-baking is a heat treatment after development, and preferably a heat curing treatment at 100° C. to 240° C. is carried out. In a case where the substrate is a glass substrate or a silicon substrate, 200° C. to 240° C. is more preferable in the above temperature range.

The post-baking treatment can be carried out continuously or batchwise using a heating unit such as a hot plate, a convection oven (hot air circulation dryer), or a high-frequency heater such that the coating film after development is in the above condition.

A color filter having desired hues is produced by repeating the above-mentioned steps of the composition film forming step, the exposing step, and the developing step (further, the heat treatment if necessary) only a number of times corresponding to the number of desired hues.

In a case where a film is formed by applying the curable composition according to the present disclosure onto a substrate, the dry thickness of the film is preferably 0.3 μm to 5.0 μm, more preferably 0.5 μm to 3.5 μm, and still more preferably 1.0 μm to 2.5 μm.

Examples of the substrate include a non-alkali glass, a soda glass, a Pyrex (registered trademark) glass, a quartz glass, and those glasses with a transparent conductive film attached thereto which are used in a liquid crystal display element or the like, a photoelectric conversion element substrate used in a solid-state imaging element or the like, for example, a silicon substrate, and a plastic substrate. A black stripe for isolating individual pixels is preferably formed on these substrates.

The plastic substrate preferably has a gas barrier layer and/or a solvent resistant layer on the surface thereof.

The above production method is a method for producing a pixel of a color filter, but according to the curable composition according to the present disclosure, for example, a black matrix provided between the pixels of the color filter is also produced. The black matrix can be formed, for example, by carrying out pattern-wise exposure, alkali development, and then post-baking to accelerate the curing of the film in the same manner as in the above-mentioned pixel production method, except that a black colorant such as carbon black or titanium black is added as the colorant to the curable composition according to the present disclosure.

(Second Aspect of Method for Producing Color Filter)

A second aspect of the method for producing a color filter according to the present disclosure includes a step of applying the curable composition according to the present disclosure onto a support and curing the applied curable composition to form a cured product (cured product forming step); a step of forming a photoresist layer on the cured product (photoresist layer forming step); a step of exposing the photoresist layer to light in a pattern-wise manner and developing the exposed photoresist layer to form a resist pattern (resist pattern forming step); and a step of etching the cured product through the resist pattern (etching step). Hereinafter, individual steps will be described.

<Cured Product Forming Step>

In the cured product forming step, the curable composition according to the present disclosure is applied onto a support and cured to form a cured product.

The support in the composition film forming step described above is preferably used as the support.

In addition, the application method in the composition film forming step described above is preferably used as the method for applying the curable composition.

The method for curing the applied curable composition is not particularly limited, and it is preferable to cure the applied curable composition by light or heat.

In a case where the curable composition is cured by light, the light may be appropriately selected according to the initiator included in the composition, but for example, ultraviolet rays such as g-line and i-line are preferably used. The exposure amount is preferably 5 mJ/cm$^2$ to 1500 mJ/cm$^2$, more preferably 10 mJ/cm$^2$ to 1000 mJ/cm$^2$, and most preferably 10 mJ/cm$^2$ to 500 mJ/cm$^2$.

In a case where the curable composition is cured by heat, the heating temperature is preferably 120° C. to 250° C. and more preferably 160° C. to 230° C. The heating time varies depending on the heating unit, but is preferably about 3 to 30 minutes in a case of being heated on a hot plate and preferably about 30 to 90 minutes in a case of being heated in an oven.

<Photoresist Layer Forming Step>

In the photoresist layer forming step, a photoresist layer is formed on the cured product.

In the formation of the photoresist layer, for example, a known negative or positive photosensitive composition is used, and a positive photosensitive composition is preferable.

The photoresist layer is obtained by applying the photosensitive composition onto the cured product and drying the applied photosensitive composition as necessary.

The method for forming the photoresist layer is not particularly limited, and may be carried out by a known method.

The thickness of the photoresist layer is preferably 0.1 µm to 3 µm, more preferably 0.2 µm to 2.5 µm, and still more preferably 0.3 µm to 2 µm.

<Resist Pattern Forming Step>

In the resist pattern forming step, the photoresist layer is exposed in a pattern-wise manner and developed to form a resist pattern.

The exposure and development are not particularly limited and are carried out by a known method.

<Etching Step>

In the etching step, the cured product is etched through the resist pattern.

The etching method is not particularly limited, and may be carried out by a known method, for example, a dry etching method.

<Step of Peeling Resist Pattern>

The second aspect of the method for producing a color filter according to the present disclosure may further include a step of peeling the resist pattern after the etching step.

The method of peeling the resist pattern is not particularly limited, and a known method is used.

(Solid-State Imaging Element)

A solid-state imaging element according to the present disclosure (for example, an image sensor such as a charge coupled device (CCD) or a complementary metal oxide semiconductor (CMOS)) includes the color filter according to the present disclosure.

For example, the solid-state imaging element according to the present disclosure can be obtained by forming a color filter on a light-receiving element.

Specifically, the solid-state imaging element according to the present disclosure has a configuration which has a plurality of photodiodes constituting a light-receiving area of a solid-state imaging element (a CCD image sensor, a CMOS image sensor, or the like) and transfer electrodes consisting of polysilicon or the like, on a substrate; a light shielding film consisting of tungsten or the like onto the photodiodes and the transfer electrodes, which has openings only over the light-receiving portion of the photodiode; a device protective film consisting of silicon nitride or the like, which is formed so as to cover the entire surface of the light shielding film and the light-receiving portion of the photodiodes, on the light shielding film; and a color filter for a solid-state imaging element according to the present disclosure on the device protective film.

Further, the solid-state imaging element according to the present disclosure may have, for example, a configuration having a light collecting unit (for example, a microlens; the same applies hereinafter) on the device protective layer and below the color filter (on the side close to the support), or a configuration having the light collecting unit on the color filter.

(Image Display Device)

The image display device according to the present disclosure (for example, a liquid crystal display device, an organic electroluminescence (EL) display device, or an electronic paper) has the color filter according to the present disclosure.

Specifically, for example, an alignment film is formed on an inner surface side of the color filter, the alignment film is opposed to an electrode substrate, and a gap portion therebetween is filled with liquid crystal and then sealed, whereby a liquid crystal panel that is the image display device according to the present disclosure is obtained.

The definition of the liquid crystal display device or details of the respective display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, the liquid crystal display device is described in, for example, "Next-Generation Liquid Crystal Display Technology (edited by Tatsuo Uchida, Kogyo Chosakai Publishing Co., Ltd., published in 1994)". The liquid crystal display device to which the present disclosure can be applied is not particularly limited, and for example, the present disclosure can be applied to various types of liquid crystal display devices described in the "Next-Generation Liquid Crystal Display Technology".

EXAMPLES

Hereinafter, the present disclosure will be described in more detail with reference to Examples, but the present disclosure is not limited thereto.

In the Examples, "%" and "part(s)" refer to "% by mass" and "part(s) by mass", respectively, unless otherwise specified. In addition, unless otherwise specified, in the polymer compound, the molecular weight is a weight-average molecular weight (Mw), and the ratio of the structural repeating units is a mole percentage.

The weight-average molecular weight (Mw) is a value measured in terms of polystyrene by gel permeation chromatography (GPC).

Synthesis Example A1: Synthesis of Macromonomer B-1

A method for synthesizing the macromonomer B-1 capable of forming the structural unit represented by Formula 5 is described below.

ε-Caprolactone (1,044.2 parts, corresponding to a cyclic compound), δ-valerolactone (184.3 parts, corresponding to a cyclic compound), and 2-ethyl-1-hexanol (71.6 parts, corresponding to a ring-opening polymerization initiator) were introduced into a three-neck flask to obtain a mixture. Next, the mixture was stirred while blowing nitrogen.

Next, monobutyltin oxide (0.61 parts) was added to the mixture, and the resulting mixture was heated to 90° C. After 6 hours, the disappearance of the signal derived from 2-ethyl-1-hexanol in the mixture was confirmed by $^1$H-nuclear magnetic resonance (NMR), and then the mixture was heated to 110° C. After the polymerization reaction was continued at 110° C. for 12 hours under nitrogen, the disappearance of the signals derived from ε-caprolactone and δ-valerolactone was confirmed by $^1$H-NMR, and the molecular weight of the resulting compound was measured by GPC (gel permeation chromatography, under the measurement conditions described later). After confirming that the molecular weight of the compound reached a desired value, 2,6-di-t-butyl-4-methylphenol (0.35 parts) was added to the mixture containing the compound, and further, 2-methacryloyloxyethyl isocyanate (87.0 parts) was added dropwise to the resulting mixture over 30 minutes. 6 hours after the completion of the dropwise addition, the disappearance of the signal derived from 2-methacryloyloxyethyl isocyanate (MOI) was confirmed by $^1$H-NMR, and then propylene glycol monomethyl ether acetate (PGMEA) (1,387.0 parts) was added to the mixture to obtain a macromonomer B-1 solution (2,770 parts) having a concentration of 50% by mass. The structure of the macromonomer B-1 was confirmed by $^1$H-NMR. The weight-average molecular weight of the resulting macromonomer B-1 was 3,000.

Synthesis Examples A2 and A3: Synthesis of Macromonomers B-2 and B-3

The synthesis was carried out in the same manner as in Synthesis Example A1, except that the monomers and the amounts thereof used were changed as shown in Table 1.

TABLE 1

| | Macro-monomer | Ring-opening polymerization initiator | Structural unit L$^1$ | | Structural unit L$^2$ | | Weight-average molecular weight | Number of repetitions (p + q) |
| | | | Cyclic compound | Content (% by mass) | Cyclic compound | Content (% by mass) | | |
| --- | --- | --- | --- | --- | --- | --- | --- | --- |
| Synthesis Example A1 | B-1 | 2-Ethyl-1-hexanol | ε-Caprolactone | 100 | δ-Valerolactone | 0 | 3,000 | 9 |
| Synthesis Example A2 | B-2 | Stearyl alcohol | ε-Caprolactone | 100 | δ-Valerolactone | 0 | 3,400 | 9 |
| Synthesis Example A3 | B-3 | 2-Ethyl-1-hexanol | ε-Caprolactone | 80 | δ-Valerolactone | 20 | 6,000 | 20 |

The structures of B-1 to B-3, and B-4 to B-6 described later are shown below.

B-4: BLEMMER PSE1300 (stearoxy polyethylene glycol monomethacrylate, manufactured by NOF Corporation)

B-5: BLEMMER 75ANEP-600 (nonylphenoxy(polyethylene glycol-polypropylene glycol)monoacrylate, manufactured by NOF Corporation)

B-6: BLEMMER 50POEP800B (octoxy polyethylene glycol-polypropylene glycol monomethacrylate, m≈8, n≈6, manufactured by NOF Corporation)

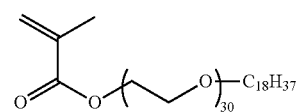

B-1

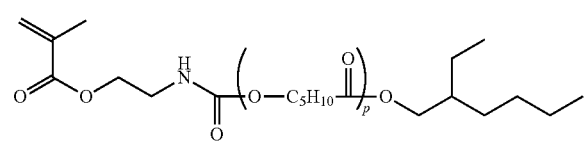

B-2

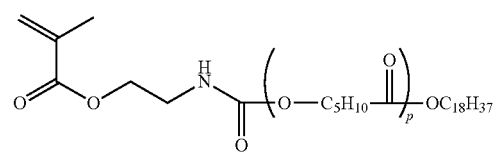

B-3

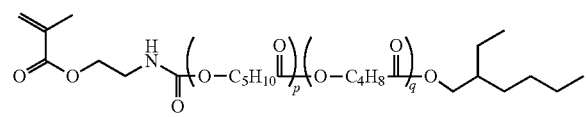

B-4

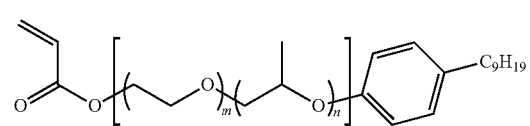

B-5

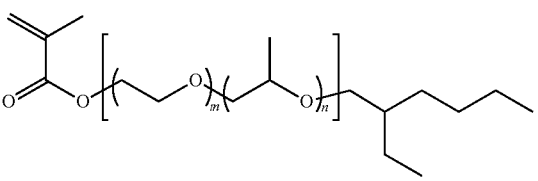

B-6

<Synthesis of Resin PA-1>

52.2 parts of a macromonomer B-1 solution having a concentration (solid content) of 50% by mass (PGMEA: 26.1 parts, macromonomer B-1: 26.1 parts), 33.9 parts of ω-carboxy-polycaprolactone monoacrylate, and 114 parts of PGMEA were introduced into a three-neck flask to obtain a mixture.

The mixture was stirred while blowing nitrogen. Next, the mixture was warmed to 75° C. while flowing nitrogen into the flask. Next, dodecyl mercaptan (0.96 parts) was added to the mixture, to which 0.24 parts of 2,2'-azobis(methyl 2-methylpropionate) (hereinafter, also referred to as "V-601") were then added to initiate the polymerization reaction.

After heating the mixture at 75° C. for 2 hours, V-601 (0.24 parts) was further added to the mixture. After 2 hours, V-601 (0.24 parts) was further added to the mixture.

After a further 2 hours of reaction, the mixture was warmed to 90° C. and stirred for 3 hours. The polymerization reaction was completed by the above operation.

After the completion of the reaction, dimethyldodecylamine (1.8 parts) and 2,2,6,6-tetramethylpiperidine 1-oxyl (TEMPO, 0.38 parts) were added under air, and then 4-hydroxybutyl acrylate glycidyl ether (C-1) (5.21 parts) was added dropwise.

After the completion of the dropwise addition, the reaction was continued at 90° C. for 24 hours under air, and then the completion of the reaction was confirmed by acid value measurement. PGMEA (9.3 parts) was added to the resulting mixture to obtain a 30% by mass solution of the resin PA-1.

The obtained resin PA-1 had a weight-average molecular weight of 16,200 and an acid value of 75 mgKOH/g.

<Synthesis of Resin PB-2>

59.9 parts of a macromonomer B-1 solution having a concentration (solid content) of 50% by mass (PGMEA: 29.95 parts, macromonomer A-1: 29.95 parts), 26.4 parts of ω-carboxy-polycaprolactone monoacrylate, 3.7 parts of 2-hydroxypropyl methacrylate, and 110 parts of PGMEA were introduced into a three-neck flask to obtain a mixture.

The mixture was stirred while blowing nitrogen. Next, the mixture was warmed to 75° C. while flowing nitrogen into the flask. Next, dodecyl mercaptan (1.34 parts) was added to the mixture, to which 0.5 parts of 2,2'-azobis(methyl 2-methylpropionate) (hereinafter, also referred to as "V-601") were then added to initiate the polymerization reaction.

After heating the mixture at 75° C. for 2 hours, V-601 (0.5 parts) was further added to the mixture. After 2 hours, V-601 (0.5 parts) was further added to the mixture.

After a further 2 hours of reaction, the mixture was warmed to 90° C. and stirred for 3 hours. The polymerization reaction was completed by the above operation.

After the completion of the reaction, NEOSTAN U-600 (manufactured by Nitto Kasei Co., Ltd.) (0.11 parts) and 2,2,6,6-tetramethylpiperidine 1-oxyl (TEMPO, 0.38 parts) were added under air, and then 2-isocyanatoethyl acrylate (C-9) (3.24 parts) was added dropwise.

After the completion of the dropwise addition, the reaction was continued at 60° C. for 24 hours under air. PGMEA (5.8 parts) was added to the resulting mixture to obtain a 30% by mass solution of the resin PB-2.

The obtained resin PB-2 had a weight-average molecular weight of 17,800 and an acid value of 75 mgKOH/g.

The weight-average molecular weight (Mw) of each macromonomer and resin was calculated by GPC (Gel Permeation Chromatography) measurement under the following measurement conditions.

Apparatus: HLC-8220GPC (manufactured by Tosoh Corporation)
Detector: differential refractometer (RI detector)
Precolumn: TSK GUARD COLUMN MP (XL), 6 mm×40 mm (manufactured by Tosoh Corporation)
Sample side column: the following four columns were directly connected (all manufactured by Tosoh Corporation).
TSK-GEL Multipore-HXL-M, 7.8 mm×300 mm
Reference side column: same as sample side column
Constant-temperature tank temperature: 40° C.
Mobile phase: tetrahydrofuran
Sample side mobile phase flow rate: 1.0 mL/min
Reference side mobile phase flow rate: 0.3 mL/min
Sample concentration: 0.1% by mass
Sample injection volume: 100 μL
Data collection time: 16 minutes to 46 minutes after sample injection
Sampling pitch: 300 msec In addition, the acid value of each resin was determined by neutralization titration using a sodium hydroxide aqueous solution. Specifically, the acid value of the resin was determined by titrating a solution obtained by dissolving the resulting resin in a solvent with a sodium hydroxide aqueous solution using a potentiometric method, calculating the number of millimoles of the acid included in 1 g of the solid of the resin, and then multiplying the calculated value by the molecular weight of KOH 56.1.

In addition, the ethylenically unsaturated bond value of each resin was calculated from the proportion of the charged amount of 4-hydroxybutyl acrylate glycidyl ether, 2-isocyanatoethyl acrylate, or the like in the charged solid content after confirming the completion of the reaction of 4-hydroxybutyl acrylate glycidyl ether, 2-isocyanatoethyl acrylate, or the like from the $^1$H-NMR measurement.

<Synthesis of Resins PA-2 to 23 and 25, PZ-1 to 4, and PB-1 and 3 to 18>

The resins were synthesized in the same manner as in the synthesis of resin PA-1 or PB-2, respectively, except that the monomers, raw materials, and amounts used thereof were changed as shown in Table 2 to Table 5.

<Synthesis of Resin PA-24>

16.95 parts of w-carboxy-polycaprolactone monoacrylate, 0.27 parts of dodecyl mercaptan, and 63.1 parts of PGMEA were introduced into a three-neck flask, and the mixture was warmed to 75° C. while flowing nitrogen into the flask. Separately, a solution was prepared by mixing 52.2 parts of a macromonomer B-1 solution having a concentration (solid content) of 50% by mass (PGMEA: 26.1 parts, macromonomer B-1: 26.1 parts), 16.95 parts of w-carboxy-polycaprolactone monoacrylate, 50.9 parts of PGMEA, 0.69 parts of dodecyl mercaptan, and 0.484 parts of 2,2'-azobis(methyl 2-methylpropionate) (hereinafter, also referred to as "V-601") in a container, and the solution was added dropwise to a three-neck flask over 4 hours.

After heating the mixture at 75° C. for 2 hours, V-601 (0.24 parts) was further added to the mixture which was then warmed to 90° C. and stirred for 3 hours. The polymerization reaction was completed by the above operation.

After the completion of the reaction, dimethyldodecylamine (1.8 parts) and 2,2,6,6-tetramethylpiperidine 1-oxyl (TEMPO, 0.38 parts) were added under air, and then 4-hydroxybutyl acrylate glycidyl ether (5.21 parts) was added dropwise.

After the completion of the dropwise addition, the reaction was continued at 90° C. for 24 hours under air, and then the completion of the reaction was confirmed by acid value measurement. PGMEA (9.3 parts) was added to the resulting mixture to obtain a 30% by mass solution of the resin PA-24.

The obtained resin PA-24 had a weight-average molecular weight of 16,800 and an acid value of 75 mgKOH/g.

TABLE 2

| | Structural unit A | | Structural unit B | | Structural unit C | | Structural unit E | |
|---|---|---|---|---|---|---|---|---|
| Resin | Acid group monomer | Content (% by mass) | Polymerizable monomer | Content (% by mass) | Polymerizable monomer | Content (% by mass) | Polymerizable monomer | Content (% by mass) |
| PA-1 | A-1 | 52.17 | B-1 | 39.82 | C-1 | 8.01 | | |
| PA-2 | A-1 | 52.17 | B-1 | 40.54 | C-2 | 7.29 | | |
| PA-3 | A-1 | 52.17 | B-1 | 42.71 | C-3 | 5.13 | | |
| PA-4 | A-1 | 52.17 | B-1 | 38.22 | C-4 | 9.61 | | |

TABLE 2-continued

| Resin | | | | | | | | |
|---|---|---|---|---|---|---|---|---|
| PA-5 | A-1 | 52.17 | B-1 | 39.82 | C-5 | 8.01 | | |
| PA-6 | A-1 | 46.16 | B-1 | 49.01 | C-6 | 4.83 | | |
| PA-7 | A-2 | 33.83 | B-1 | 58.16 | C-6 | 8.01 | | |
| PA-8 | A-3 | 49.35 | B-1 | 42.64 | C-6 | 8.01 | | |
| PA-9 | A-4 | 35.31 | B-1 | 56.68 | C-6 | 8.01 | | |
| PA-10 | A-5 | 31.81 | B-1 | 60.18 | C-6 | 8.01 | | |
| PA-11 | A-6 | 43.54 | B-1 | 48.45 | C-6 | 8.01 | | |
| PA-12 | A-7 | 49.23 | B-1 | 42.77 | C-6 | 8.01 | | |
| PA-13 | A-8 | 45.90 | B-1 | 46.09 | C-6 | 8.01 | | |
| PA-14 | A-1 | 52.17 | B-2 | 39.82 | C-1 | 8.01 | | |
| PA-15 | A-1 | 52.17 | B-3 | 39.82 | C-1 | 8.01 | | |
| PA-16 | A-1 | 52.17 | B-4 | 39.82 | C-1 | 8.01 | | |
| PA-17 | A-1 | 52.17 | B-5 | 39.82 | C-1 | 8.01 | | |
| PA-18 | A-1 | 52.17 | B-6 | 39.82 | C-1 | 8.01 | | |
| PA-19 | A-1 | 76.20 | | | C-1 | 24.02 | | |
| PA-20 | A-2 | 70.19 | | | C-2 | 20.02 | E-6 | 9.79 |
| PA-21 | A-3 | 70.19 | | | C-3 | 20.02 | E-4 | 9.79 |
| PA-22 | A-1 | 43.16 | B-1 | 54.84 | C-1 | 2.00 | | |
| PA-23 | A-1 | 52.17 | B-1 | 40.42 | C-12 | 7.41 | | |
| PA-24 | A-1 | 52.17 | B-1 | 39.82 | C-1 | 8.01 | | |
| PA-25 | A-9 | 14.24 | | | C-3 | 0.64 | E-6 | 85.12 |

| Resin | Catalyst Compound (raw material) | Catalyst Content (% by mass) | Polymerization inhibitor Compound (raw material) | Polymerization inhibitor Content (% by mass) | Weight-average molecular weight | Acid value (mgKOH/g) | Ethylenically unsaturated bond value (mmol/g) |
|---|---|---|---|---|---|---|---|
| PA-1 | F-1 | 0.24 | Q-1 | 0.3 | 16200 | 75 | 0.40 |
| PA-2 | F-2 | 0.22 | Q-2 | 0.3 | 16800 | 75 | 0.40 |
| PA-3 | F-2 | 0.15 | Q-1 | 0.3 | 12700 | 75 | 0.40 |
| PA-4 | F-2 | 0.29 | Q-1 | 0.3 | 18900 | 75 | 0.40 |
| PA-5 | F-2 | 0.24 | Q-1 | 0.3 | 21300 | 75 | 0.40 |
| PA-6 | F-3 | 0.14 | Q-1 | 0.3 | 25800 | 75 | 0.40 |
| PA-7 | F-3 | 0.24 | Q-1 | 0.1 | 18800 | 60 | 0.40 |
| PA-8 | F-3 | 0.24 | Q-1 | 0.5 | 34100 | 80 | 0.40 |
| PA-9 | F-3 | 0.24 | Q-1 | 0.3 | 29600 | 115 | 0.40 |
| PA-10 | F-3 | 0.24 | Q-1 | 0.3 | 9700 | 98 | 0.40 |
| PA-11 | F-3 | 0.24 | Q-1 | 0.05 | 41800 | 70 | 0.40 |
| PA-12 | F-3 | 0.24 | Q-1 | 0.3 | 27500 | 75 | 0.40 |
| PA-13 | F-3 | 0.24 | Q-1 | 0.3 | 20900 | 75 | 0.40 |
| PA-14 | F-2 | 0.24 | Q-1 | 0.3 | 17700 | 75 | 0.40 |
| PA-15 | F-2 | 0.24 | Q-1 | 0.3 | 18000 | 75 | 0.40 |
| PA-16 | F-2 | 0.24 | Q-1 | 0.3 | 16400 | 75 | 0.40 |
| PA-17 | F-2 | 0.24 | Q-1 | 0.3 | 15200 | 75 | 0.40 |
| PA-18 | F-2 | 0.24 | Q-1 | 0.3 | 19600 | 75 | 0.40 |
| PA-19 | F-2 | 0.72 | Q-1 | 1 | 14800 | 75 | 1.20 |
| PA-20 | F-2 | 0.60 | Q-1 | 0.6 | 15300 | 75 | 1.00 |
| PA-21 | F-2 | 0.60 | Q-1 | 0.6 | 16600 | 75 | 1.00 |
| PA-22 | F-2 | 0.06 | Q-1 | 0.3 | 17200 | 75 | 0.10 |
| PA-23 | F-3 | 0.22 | Q-2 | 0.3 | 14100 | 75 | 0.40 |
| PA-24 | F-1 | 0.24 | Q-1 | 0.6 | 16800 | 75 | 0.40 |
| PA-25 | F-5 | 0.00 | Q3 | 0.05 | 19000 | 90 | 0.05 |

TABLE 3

| Resin | Structural unit A Acid group monomer | Structural unit A Content (% by mass) | Structural unit C Polymerizable monomer | Structural unit C Content (% by mass) | Structural unit D Polymerizable monomer | Structural unit D Content (% by mass) | Structural unit E Polymerizable monomer | Structural unit E Content (% by mass) |
|---|---|---|---|---|---|---|---|---|
| PZ-1 | A-9 | 18.97 | C-7 | 8.53 | | | E-6 | 72.50 |
| PZ-2 | A-9 | 16.78 | C-8 | 13.24 | | | E-6 | 69.98 |
| PZ-3 | A-9 | 18.97 | C-11 | 9.31 | D-1 | 8.65 | E-4 | 63.07 |
| PZ-4 | A-9 | 16.78 | C-8 | 13.24 | | | E-4 | 69.98 |

| Resin | Catalyst Compound (raw material) | Catalyst Content (% by mass) | Polymerization inhibitor Compound (raw material) | Polymerization inhibitor Content (% by mass) | Weight-average molecular weight | Acid value (mgKOH/g) | Ethylenically unsaturated bond value (mmol/g) |
|---|---|---|---|---|---|---|---|
| PZ-1 | F-4 | 0.26 | Q3 | 0.05 | 15300 | 90 | 0.60 |
| PZ-2 | Without catalyst | | Q3 | 0.05 | 18100 | 90 | 0.60 |

TABLE 3-continued

| | | | | | | | |
|---|---|---|---|---|---|---|---|
| PZ-3 | F-6 | 0.28 | Q3 | 0.05 | 17200 | 90 | 0.60 |
| PZ-4 | Without catalyst | | Q3 | 0.05 | 17500 | 90 | 0.60 |

TABLE 4

| | Structural unit A | | Structural unit B | | Structural unit C | | Structural unit D | |
|---|---|---|---|---|---|---|---|---|
| Resin | Acid group monomer | Content (% by mass) | Polymerizable monomer | Content (% by mass) | Polymerizable monomer | Content (% by mass) | Polymerizable monomer | Content (% by mass) |
| PB-1 | A-1 | 40.15 | B-1 | 49.00 | C-9 | 5.65 | D-1 | 5.21 |
| PB-2 | A-1 | 40.15 | B-1 | 48.39 | C-9 | 5.69 | D-2 | 5.77 |
| PB-3 | A-1 | 40.15 | B-1 | 47.79 | C-9 | 5.73 | D-3 | 6.33 |
| PB-4 | A-1 | 40.15 | B-1 | 47.11 | C-9 | 5.77 | D-4 | 6.97 |
| PB-5 | A-1 | 49.26 | B-1 | 29.90 | C-9 | 5.81 | D-5 | 15.04 |
| PB-6 | A-1 | 48.18 | B-1 | 31.65 | C-9 | 5.85 | D-6 | 14.32 |
| PB-7 | A-1 | 45.51 | B-1 | 48.35 | C-9 | 2.94 | D-7 | 3.20 |
| PB-8 | A-1 | 40.15 | B-1 | 52.46 | C-10 | 4.78 | D-2 | 2.60 |
| PB-9 | A-2 | 24.62 | B-1 | 64.53 | C-9 | 5.65 | D-2 | 5.21 |
| PB-10 | A-3 | 39.51 | B-1 | 49.64 | C-9 | 5.65 | D-2 | 5.21 |
| PB-11 | A-4 | 29.03 | B-1 | 60.12 | C-9 | 5.65 | D-1 | 5.21 |
| PB-12 | A-5 | 25.09 | B-1 | 64.06 | C-9 | 5.65 | D-1 | 5.21 |
| PB-13 | A-6 | 32.97 | B-1 | 56.18 | C-9 | 5.65 | D-3 | 5.21 |
| PB-14 | A-7 | 37.89 | B-1 | 51.26 | C-9 | 5.65 | D-3 | 5.21 |
| PB-15 | A-8 | 35.33 | B-1 | 53.82 | C-9 | 5.65 | D-3 | 5.21 |
| PB-16 | A-1 | 40.15 | | | C-9 | 29.64 | D-2 | 30.28 |
| PB-17 | A-1 | 40.15 | B-1 | 57.13 | C-9 | 1.41 | D-1 | 1.30 |

| | Catalyst | | Polymerization inhibitor | | Weight-average molecular weight | Acid value (mgKOH/g) | Ethylenically unsaturated bond value (mmol/g) |
|---|---|---|---|---|---|---|---|
| Resin | Compound (raw material) | Content (% by mass) | Compound (raw material) | Content (% by mass) | | | |
| PB-1 | F-6 | 0.17 | Q-1 | 0.3 | 17800 | 75 | 0.40 |
| PB-2 | F-6 | 0.17 | Q-1 | 0.3 | 21100 | 75 | 0.40 |
| PB-3 | F-6 | 0.17 | Q-2 | 0.3 | 19800 | 75 | 0.40 |
| PB-4 | F-6 | 0.17 | Q-1 | 0.3 | 13800 | 75 | 0.40 |
| PB-5 | F-6 | 0.17 | Q-1 | 0.3 | 35800 | 92 | 0.40 |
| PB-6 | F-6 | 0.18 | Q-1 | 0.3 | 32100 | 90 | 0.40 |
| PB-7 | F-6 | 0.09 | Q-1 | 0.3 | 28300 | 85 | 0.40 |
| PB-8 | F-6 | 0.14 | Q-1 | 0.3 | 21500 | 75 | 0.40 |
| PB-9 | F-6 | 0.17 | Q-2 | 0.3 | 16400 | 60 | 0.40 |
| PB-10 | F-6 | 0.17 | Q-1 | 0.3 | 7800 | 82 | 0.40 |
| PB-11 | F-6 | 0.17 | Q-1 | 0.3 | 12800 | 113 | 0.40 |
| PB-12 | F-6 | 0.17 | Q-1 | 0.3 | 10400 | 95 | 0.40 |
| PB-13 | F-6 | 0.17 | Q-1 | 0.3 | 13800 | 70 | 0.40 |
| PB-14 | F-6 | 0.17 | Q-1 | 0.3 | 27800 | 75 | 0.40 |
| PB-15 | F-6 | 0.17 | Q-1 | 0.3 | 18300 | 75 | 0.40 |
| PB-16 | F-6 | 0.89 | Q-1 | 1 | 8100 | 75 | 2.10 |
| PB-17 | F-6 | 0.04 | Q-1 | 0.3 | 16400 | 75 | 0.10 |

TABLE 5

| | Structural unit A | | Structural unit C | | Structural unit D | | Structural unit E | |
|---|---|---|---|---|---|---|---|---|
| Resin | Acid group monomer | Content (% by mass) | Polymerizable monomer | Content (% by mass) | Polymerizable monomer | Content (% by mass) | Polymerizable monomer | Content (% by mass) |
| PB-18 | A-9 | 14.24 | C-9 | 0.71 | D-1 | 0.72 | E-4 | 84.34 |

| | Catalyst | | Polymerization inhibitor | | Weight-average molecular weight | Acid value (mgKOH/g) | Ethylenically unsaturated bond value (mmol/g) |
|---|---|---|---|---|---|---|---|
| Resin | Compound (raw material) | Content (% by mass) | Compound (raw material) | Content (% by mass) | | | |
| PB-18 | F-6 | 0.02 | Q3 | 0.05 | 18400 | 90 | 0.05 |

The details of the abbreviations described in Table 2 to Table 5 other than those described above are shown below.

A-1: ARONIX M-5300 (ω-carboxy-polycaprolactone monoacrylate, manufactured by Toagosei Co., Ltd.)

A-2: LIGHT ESTER HO-MS (2-methacryloyloxyethyl succinate, manufactured by Kyoeisha Chemical Co., Ltd.)

A-3: LIGHT ESTER HOA-HH (2-acryloyloxyethyl hexahydrophthalate, manufactured by Kyoeisha Chemical Co., Ltd.)

A-4: (3-carboxyethyl acrylate (β-CEA, manufactured by Daicel-Allnex Ltd.)

A-5: vinylbenzoic acid (manufactured by Tokyo Chemical Industry Co., Ltd.)

A-6: CB-1 (2-methacryloyloxyethyl phthalate, manufactured by Shin-Nakamura Chemical Co., Ltd.)

A-7: 12-methacrylamidododecanoic acid

A-8: 4-(4-(acryloyloxy)butoxy)benzoic acid

A-9: methacrylic acid (MAA)

C-1: 4-hydroxybutyl acrylate glycidyl ether (4HBAGE, manufactured by Nihon Kasei Co., Ltd.)

C-2: 3,4-epoxycyclohexylmethyl acrylate (manufactured by Daicel Corporation)

C-3: glycidyl acrylate (manufactured by Tokyo Chemical Industry Co., Ltd.)

C-4: 9-(oxiran-2-yl)nonyl acrylate (synthetic product)

C-5: 3-(oxiran-2-ylmethoxy)-3-oxopropyl acrylate (synthetic product)

C-6: 2-methyl-2-(((oxiran-2-ylmethoxy)carbonyl)amino)propane-1,3-diyl diacrylate (synthetic product, the compound shown below)

C-6

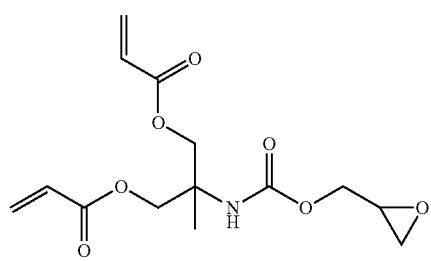

C-7: glycidyl methacrylate (GMA, manufactured by Tokyo Chemical Industry Co., Ltd.)

C-8: 2-((3-chloropropanoyl)oxy)ethyl methacrylate

C-9: KARENZ AOI (2-isocyanatoethyl acrylate, manufactured by Showa Denko KK),

C-10: KARENZ BEI (1,1-(bisacryloyloxymethypethyl isocyanate, manufactured by Showa Denko KK)

C-11: KARENZ MOI (2-isocyanatoethyl methacrylate, manufactured by Showa Denko KK)

C-12: N-methyl-N-hydroxyethylacrylamide glycidyl ether

Synthesis Example of C-4

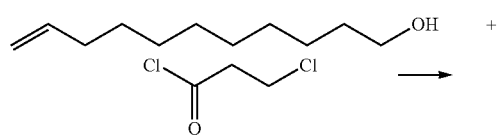

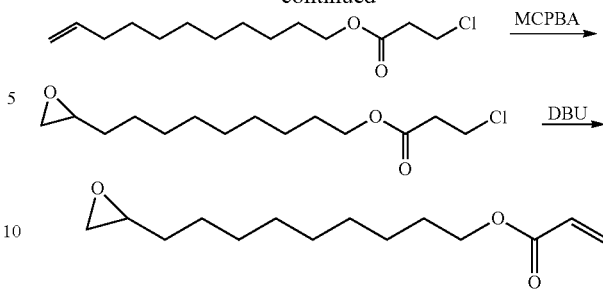

153.65 g of 3-chloropropionyl chloride (manufactured by Tokyo Chemical Industry Co., Ltd.) was added dropwise while cooling a flask containing 200 g of 10-undecen-1-ol (manufactured by Tokyo Chemical Industry Co., Ltd.) and 1,378 g of dimethylacetamide (DMAc) on ice, followed by stirring under ice cooling for 1.5 hours. The disappearance of the raw material alcohol and the target product were confirmed by $^1$H-NMR, and the stirring was stopped. Ethyl acetate (2,000 mL) was added thereto, followed by washing twice with 2,000 mL of a 3.5% by mass hydrochloric acid aqueous solution and twice with 2,000 mL of a 5% by mass sodium bicarbonate aqueous solution, the organic layer was dried over magnesium sulfate, and the solvent was distilled off under reduced pressure to obtain 296 g of an intermediate.

To a flask containing 192 g of the intermediate and 918 g of dichloromethane, 200 g of metachloroperbenzoic acid (mCPBA) was added in five portions every one hour under a water bath, followed by stirring overnight.

It was confirmed by $^1$H-NMR that the peak of the terminal double bond of the raw material had disappeared, and 1487 g of a 5% by mass sodium bicarbonate aqueous solution was added to the reaction solution, followed by stirring for 2 hours. Thereafter, 500 mL of ethyl acetate was added thereto, followed by extraction, 500 mL of a 5% by mass sodium thiosulfate aqueous solution was added thereto, followed by stirring for 1 hour, the aqueous layer was discarded, and the organic layer was concentrated under reduced pressure to obtain 211.5 g of an intermediate.

210 g of the intermediate, 822 g of methylene chloride, and 182.3 mg of p-methoxyphenol were added, and a mixed liquid of 231 g of DBU and 441 g of methylene chloride was added dropwise thereto under ice cooling while maintaining the temperature at 10° C. or lower.

The product was confirmed by $^1$H-NMR, and a mixed liquid of 91.1 g of acetic acid and 147 g of methylene chloride was added dropwise thereto while maintaining the temperature at 10° C. or lower, followed by stirring at room temperature for 2 hours.

The methylene chloride was concentrated under reduced pressure, and 1050 g of hexane was added, followed by washing with 420 g of water and washing with 420 g of 5% by mass sodium bicarbonate aqueous solution to obtain 137.9 g of the target product.

<Synthesis of C-5>

23.3 g of β-carboxyethyl acrylate, 87 mg of p-methoxyphenol, 117 g of chloroform, 16.8 g of glycidol and 1.98 g of N,N-dimethylaminopyridine were added to a flask to which 37.26 g of 1-(3-dimethylaminopropyl)-3-ethylcarbodiimide hydrochloride was then added in portions under ice cooling, followed by stirring for 1 hour. This was followed by washing with 150 mL of 0.1N hydrochloric acid and then 150 mL of water, and the organic layer was concentrated under reduced pressure to obtain 20 g of the target product.

<Synthesis of C-6>

5.0 g of glycidol (manufactured by Sigma-Aldrich Co. LLC), 53 g of butyl acetate, 0.04 g of p-methoxyphenol, 14.5 g of KARENZ BEI (manufactured by Showa Denko KK), and 0.04 g of NEOSTAN U600 (manufactured by Nitto Kasei Co., Ltd.) were added to a 200 mL three-neck flask, and the temperature was slowly raised to 60° C. After the polymerization reaction was continued at 60° C. for 4 hours, the disappearance of the signal derived from KARENZ BEI was confirmed by $^1$H-NMR, and 50 g of water was added thereto, followed by stirring. The organic layer obtained by separating the liquid and discarding the aqueous layer was washed again with 50 g of water. 3 g of magnesium sulfate was added to the organic layer after washing, followed by filtration, and 2,6-di-t-butyl-4-methylphenol (0.4 g) was added thereto, followed by concentration to obtain 12 g of C-6.

D-1: ACRYLIC ESTER HO (2-hydroxyethyl methacrylate, manufactured by Mitsubishi Chemical Corporation)

D-2: LIGHT ESTER HOP (2-hydroxypropyl methacrylate, manufactured by Kyoeisha Chemical Co., Ltd.)

D-3: LIGHT ESTER HOB (2-hydroxybutyl methacrylate, manufactured by Kyoeisha Chemical Co., Ltd.)

D-4: BLEMMER PE-90 (polyethylene glycol monomethacrylate, n≈2, manufactured by NOF Corporation)

D-5: BLEMMER PP1000 (polypropylene glycol monomethacrylate, n≈4 to 6, manufactured by NOF Corporation)

D-6: PLACCEL FM2D (unsaturated fatty acid hydroxyalkyl ester-modified ε-caprolactone, $CH_2=C(CH_3)COO(CH_2)_2O[CO(CH_2)_5O]_nH$, manufactured by Daicel Corporation)

D-7: BLEMMER GLM (glycerin monomethacrylate, manufactured by NOF Corporation)

E-1: cyclohexyl methacrylate (manufactured by Tokyo Chemical Industry Co., Ltd.)

E-2: BLEMMER TBCHMA (4-t-butylcyclohexyl methacrylate, manufactured by NOF Corporation)

E-3: 2-ethylhexyl methacrylate (manufactured by Tokyo Chemical Industry Co., Ltd.)

E-4: ARONIX M120 (2-(2-((2-ethylhexyl)oxy)ethoxy) ethyl acrylate, manufactured by Toagosei Co., Ltd.)

E-5: dicyclopentanyl methacrylate (manufactured by Tokyo Chemical Industry Co., Ltd.)

E-6: 2-methoxyethyl acrylate (manufactured by Tokyo Chemical Industry Co., Ltd.)

F-1: dimethyldodecylamine

F-2: dimethylbutylamine

F-3: dimethylbenzylamine

F-4: tetrabutylammonium bromide

F-5: triphenylphosphine

F-6: NEOSTAN U-600 (bismuth tris(2-ethylhexanoate), manufactured by Nitto Kasei Co., Ltd.)

Q-1: 2,2,6,6-tetramethylpiperidine 1-oxyl (TEMPO)

Q-2: 4-hydroxy-2,2,6,6-tetramethylpiperidine 2-oxyl (4-hydroxy-TEMPO)

Q-3: p-methoxyphenol

<Preparation of Pigment Dispersion Liquid>

Raw materials shown in Table 6 or Table 7 below were mixed, 230 parts by mass of zirconia beads having a diameter of 0.3 mm were added thereto, a dispersion treatment was carried out for 5 hours using a paint shaker, and the beads were separated by filtration to produce each pigment dispersion liquid.

TABLE 6

| | Pigment | | Dispersion aid (derivative, resin) | | Resin | | Polymerization inhibitor | | Solvent | |
|---|---|---|---|---|---|---|---|---|---|---|
| | Type | Parts by | Type | Parts by | Type | Parts by | Type | Parts by | Type | Parts by |
| Pigment dispersion liquid R-1 | PR254 | 12.00 | B1 | 1.39 | PA-1 | 4.2 | Q1 | 0.01 | J1 | 82.40 |
| Pigment dispersion liquid R-2 | PR254 | 12.00 | B1 | 1.39 | PA-2 | 4.2 | Q1 | 0.01 | J1 | 82.40 |
| Pigment dispersion liquid R-3 | PR254 | 12.00 | B1 | 1.39 | PA-3 | 4.2 | Q1 | 0.01 | J1 | 82.40 |
| Pigment dispersion liquid R-4 | PR254 | 12.00 | B1 | 1.39 | PA-4 | 4.2 | Q1 | 0.01 | J1 | 82.40 |
| Pigment dispersion liquid R-5 | PR254 | 12.00 | B1 | 1.39 | PA-5 | 4.2 | Q1 | 0.01 | J1 | 82.40 |
| Pigment dispersion liquid R-6 | PR254 | 12.00 | B1 | 1.39 | PA-6 | 4.2 | Q1 | 0.01 | J4 | 82.40 |
| Pigment dispersion liquid R-7 | PR254 | 12.00 | B2 | 1.39 | PA-7 | 4.2 | Q1 | 0.01 | J1 | 82.40 |
| Pigment dispersion liquid R-8 | PR254 | 12.00 | B1 | 1.39 | PA-8 | 4.2 | Q1 | 0.001 | J1 | 82.41 |
| Pigment dispersion liquid R-9 | PR254 | 12.00 | B1 | 1.39 | PA-9 | 4.2 | Q2 | 0.01 | J1 | 82.40 |
| Pigment dispersion liquid R-10 | PR254 | 12.00 | B1 | 1.39 | PA-10 | 3.6 | Q1 | 0.01 | J1 | 83.00 |
| Pigment dispersion liquid R-11 | PR254 | 12.00 | B1 | 1.39 | PA-11 | 4.2 | Q1 | 0.01 | J1 | 82.40 |
| Pigment dispersion liquid R-12 | PR254 | 12.00 | B1 | 1.39 | PA-12/PA-1 = 1/1 | 4.2 | Q1 | 0.05 | J1 | 82.36 |
| Pigment dispersion liquid R-13 | PR254 | 12.00 | B1 | 1.39 | PA-1/PA-13 = 1/1 | 4.2 | Q1 | 0.01 | J2 | 82.40 |
| Pigment dispersion liquid R-14 | PR254 | 12.00 | B1 | 1 | PA-14 | 4.8 | Q1 | 0.01 | J1 | 82.19 |
| Pigment dispersion liquid R-15 | PR254 | 12.00 | B1 | 1.39 | PA-15 | 4.2 | Q1 | 0.01 | J1/J3 = 1/1 | 82.40 |
| Pigment dispersion liquid R-16 | PR254 | 12.00 | B3 | 1.39 | PA-16 | 4.2 | Q1 | 0.01 | J1 | 82.40 |

TABLE 6-continued

| | Pigment | | Dispersion aid (derivative, resin) | | Resin | | Polymerization inhibitor | | Solvent | |
|---|---|---|---|---|---|---|---|---|---|---|
| | Type | Parts by | Type | Parts by | Type | Parts by | Type | Parts by | Type | Parts by |
| Pigment dispersion liquid R-17 | PR254 | 12.00 | B1 | 1.39 | PA-17 | 4.2 | Q1 | 0.01 | J3 | 82.40 |
| Pigment dispersion liquid R-18 | PR264 | 12.00 | B1 | 1.39 | PA-18 | 4.2 | Q1 | 0.01 | J1 | 82.40 |
| Pigment dispersion liquid R-19 | PR272 | 12.00 | B1 | 1.39 | PA-19 | 4.2 | Q1 | 0.01 | J1 | 82.40 |
| Pigment dispersion liquid R-20 | PR254 PY139 | 8.3 3.7 | B1 | 2.3 | PA-20 | 4.4 | Q1 | 0.01 | J1 | 81.29 |
| Pigment dispersion liquid R-21 | PR254 | 12.00 | B1 | 1.39 | PA-21 | 4.2 | Q1 | 0.01 | J1 | 82.40 |
| Pigment dispersion liquid R-22 | PR254 | 12.00 | B1 | 1.39 | PA-22 | 4.2 | Q1 | 0.01 | J1 | 82.40 |
| Pigment dispersion liquid R-23 | PR254 | 12.00 | B1 | 1.39 | PB-1 | 4.2 | Q1 | 0.01 | J1 | 82.40 |
| Pigment dispersion liquid R-24 | PR254 | 12.00 | B1 | 1.39 | PB-2 | 4.2 | Q1 | 0.01 | J1 | 82.40 |
| Pigment dispersion liquid R-25 | PR254 | 12.00 | B1 | 1.39 | PB-3 | 4.2 | Q1 | 0.01 | J1 | 82.40 |
| Pigment dispersion liquid R-26 | PR254 | 12.00 | B3 | 1.39 | PB-4 | 4.2 | Q1 | 0.01 | J1 | 82.40 |
| Pigment dispersion liquid R-27 | PR254 | 12.00 | B1 | 1.39 | PB-5 | 4.2 | Q1 | 0.01 | J2 | 82.40 |
| Pigment dispersion liquid R-28 | PR254 | 12.00 | B1 | 1.39 | PB-6 | 4.2 | Q1 | 0.01 | J1 | 82.40 |
| Pigment dispersion liquid R-29 | PR254 | 12.00 | B1 | 1.39 | PB-7 | 4.2 | Q1 | 0.01 | J1 | 82.40 |
| Pigment dispersion liquid R-30 | PR254 | 12.00 | B1 | 1.39 | PB-8 | 4.2 | Q1 | 0.01 | J3 | 82.40 |
| Pigment dispersion liquid R-31 | PR254 | 12.00 | B2 | 139 | PB-9 | 4.2 | Q1 | 0.01 | J1 | 82.40 |
| Pigment dispersion liquid R-32 | PR254 | 12.00 | B1 | 1.39 | PB-10 | 4.2 | Q1 | 0.01 | J1 | 82.40 |
| Pigment dispersion liquid R-33 | PR254 | 12.00 | B1 | 1.39 | PB-11 | 4.2 | Q1 | 0.01 | J1 | 82.40 |
| Pigment dispersion liquid R-34 | PR264 | 12.00 | B1 | 1.39 | PB-12 | 4.2 | Q1 | 0.01 | J1 | 82.40 |
| Pigment dispersion liquid R-35 | PR272 | 12.00 | B1 | 1.39 | PB-13 | 4.2 | Q1 | 0.01 | J1 | 82.40 |
| Pigment dispersion liquid R-36 | PR254 PY139 | 8.3 3.7 | B1 | 2.3 | PB-14 | 4.4 | Q1 | 0.01 | J1 | 81.29 |
| Pigment dispersion liquid R-37 | PR254 | 12.00 | B1 | 1.39 | PB-15 | 4.2 | Q1 | 0.01 | J1 | 82.40 |
| Pigment dispersion liquid R-38 | PR254 | 12.00 | B1 | 1.39 | PB-16 | 4.2 | Q1 | 0.01 | J1 | 82.40 |
| Pigment dispersion liquid R-39 | PR254 | 12.00 | B1 | 1.39 | PB-17 | 4.2 | Q1 | 0.01 | J1/ J3 = 1/1 | 82.40 |
| Pigment dispersion liquid R-40 | PR254 | 12.00 | B1 | 1.39 | PZ-1 | 4.2 | Q1 | 0.01 | J1 | 82.40 |
| Pigment dispersion liquid R-41 | PR254 | 12.00 | B1 | 1.39 | PZ-2 | 4.2 | Q1 | 0.01 | J1 | 82.40 |
| Pigment dispersion liquid R-42 | PR254 | 12.00 | B1 | 1.39 | PZ-3 | 4.2 | Q1 | 0.01 | J1 | 82.40 |
| Pigment dispersion liquid R-43 | PR254 | 12.00 | B1 | 1.39 | PZ-4 | 4.2 | Q1 | 0.01 | J1 | 82.40 |
| Pigment dispersion liquid R-44 | PR254 | 12.00 | B1 | 1.39 | PA-25 | 4.2 | Q1 | 0.01 | J1 | 82.40 |
| Pigment dispersion liquid R-45 | PR254 | 12.00 | B1 | 1.39 | PB-18 | 4.2 | Q1 | 0.01 | J1 | 82.40 |
| Pigment dispersion liquid R-46 | PR254 | 12.00 | B1 | 1.39 | PA-23 | 4.2 | Q1 | 0.01 | J1 | 82.40 |

TABLE 6-continued

|  | Pigment | | Dispersion aid (derivative, resin) | | Resin | | Polymerization inhibitor | | Solvent | |
| --- | --- | --- | --- | --- | --- | --- | --- | --- | --- | --- |
|  | Type | Parts by | Type | Parts by | Type | Parts by | Type | Parts by | Type | Parts by |
| Pigment dispersion liquid R-47 | PR254 | 12.00 | B1 | 1.39 | PA-24 | 4.2 | Q1 | 0.01 | J1 | 82.40 |
| Pigment dispersion liquid Y-1 | PY139 | 11.00 | B1 | 1.59 | PA-1 | 4.4 | Q1 | 0.01 | J1 | 83.01 |
| Pigment dispersion liquid Y-2 | PY139/ PY150 = 8/2 | 11.00 | B1 | 1.59 | PA-1 | 4.4 | Q1 | 0.01 | J1 | 83.01 |
| Pigment dispersion liquid Y-3 | PY139 | 11.00 | B1 | 1.59 | PA-1 | 4.4 | Q1 | 0.01 | J1 | 83.01 |
| Pigment dispersion liquid Y-4 | PY150 | 11.00 | B1 | 1.59 | PA-1 | 4.4 | Q1 | 0.01 | J1 | 83.01 |
| Pigment dispersion liquid Y-5 | PY150 | 11.00 | B1 | 1.59 | PA-1 | 4.4 | Q1 | 0.01 | J1 | 83.01 |
| Pigment dispersion liquid Y-6 | PY139 | 11.00 | B1 | 1.59 | PZ-1 | 4.4 | Q1 | 0.01 | J1 | 83.01 |

TABLE 7

|  | Pigment | | Dispersion aid (derivative, resin) | | Resin | | Polymerization inhibitor | | Solvent | |
| --- | --- | --- | --- | --- | --- | --- | --- | --- | --- | --- |
|  | Type | Parts by mass | Type | Parts by mass | Type | Parts by mass | Type | Parts by mass | Type | Parts by mass |
| Pigment dispersion liquid B-1 | PB15:6 PV23 | 10.0 2.59 |  |  | PA-1 | 5.38 | Q1 | 0.01 | J1 | 83.01 |
| Pigment dispersion liquid G-1 | PG58 PY185 | 9.2 2.3 | B1 | 1.2 | PA-2 | 4.95 | Q1 | 0.01 | J1 | 82.34 |
| Pigment dispersion liquid G-2 | PG36 PY150 PY185 | 12.1 1.8 0.7 | B1 | 1.2 | PA-2 | 4.95 | Q1 | 0.01 | J1 | 79.24 |
| Pigment dispersion liquid G-3 | PG58 PG36 PY185 | 6.2 3.0 2.3 | B1 | 1.2 | PA-2 | 4.95 | Q1 | 0.01 | J1 | 82.34 |
| Pigment dispersion liquid Bk-1 | TiON | 12.00 |  |  | PA-19 | 4.2 | Q1 | 0.01 | J2 | 74.90 |
| Pigment dispersion liquid IR-1 | K1 | 11.00 | B1 | 1.59 | PA-1 | 6.0 | Q1 | 0.01 | J1 | 81.41 |
| Pigment dispersion liquid IR-2 | K2 | 6.70 | K3 | 0.8 | PB-1 | 6.0 | Q1 | 0.01 | J1 | 86.50 |
| Pigment dispersion liquid IR-3 | K2 | 6.70 | K3 | 0.8 | PA-1 | 6.0 | Q1 | 0.01 | J1 | 86.50 |

The details of the abbreviations described in Table 6 or Table 7 other than those described above are shown below.
PR254: C.I. Pigment Red 254
PR264: C.I. Pigment Red 264
PR272: C.I. Pigment Red 272
PY139: C.I. Pigment Yellow 139
PY150: C.I. Pigment Yellow 150
PY185: C.I. Pigment Yellow 185
PB15:6: C.I. Pigment Blue 15:6
PV23: C.I. Pigment Violet 23
PG36: C.I. Pigment Green 36
PG58: C.I. Pigment Green 58
TiON: titanium black
K1: a compound shown below
K2: a compound shown below
K3: a compound shown below
B1: a compound shown below
B2: a compound shown below
B3: a compound shown below

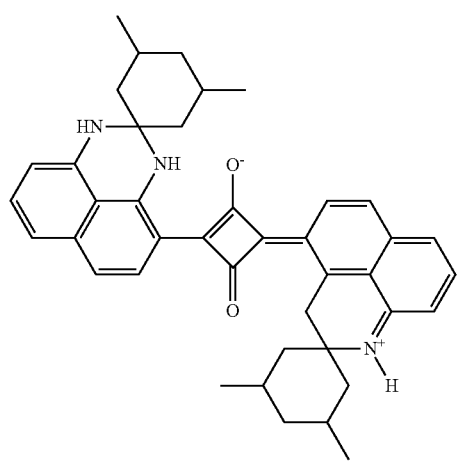
K1
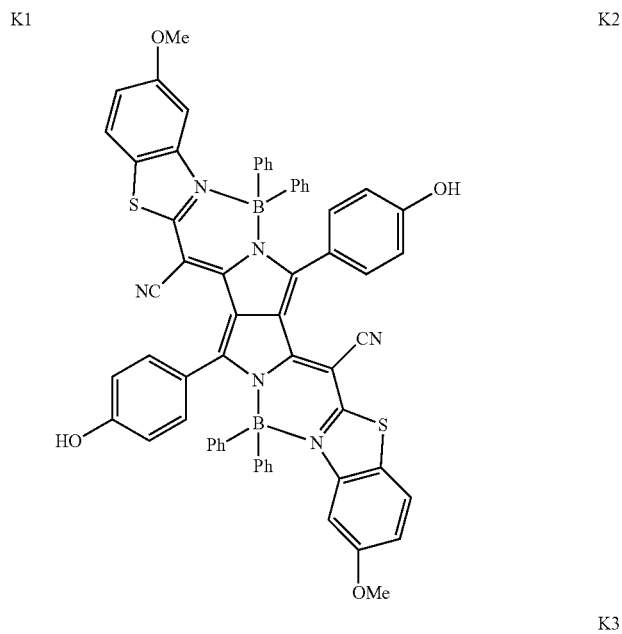
K2
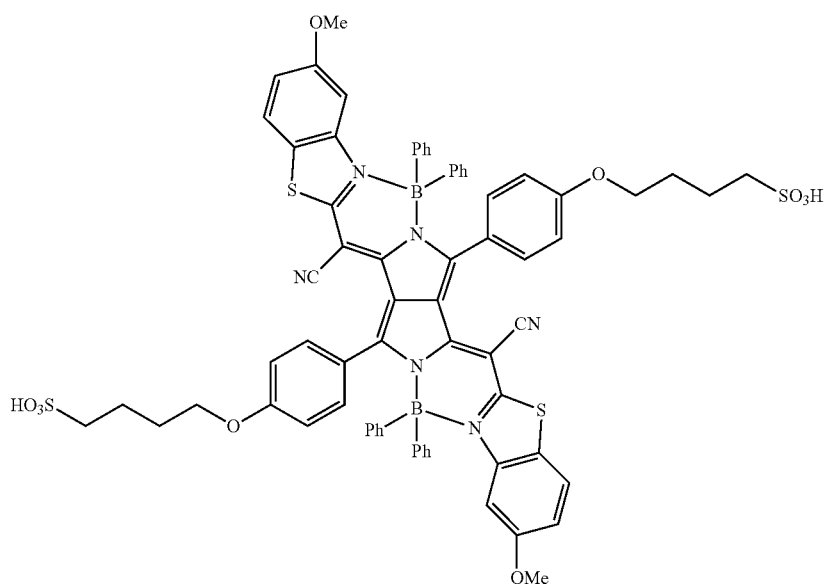
K3
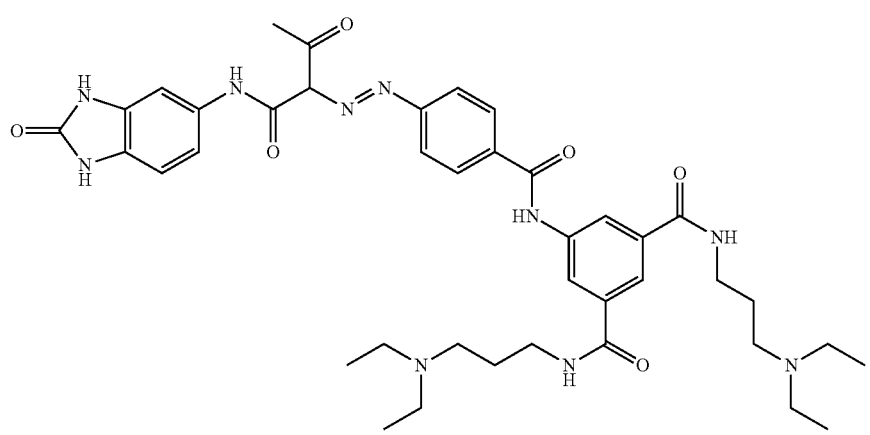
B1

-continued

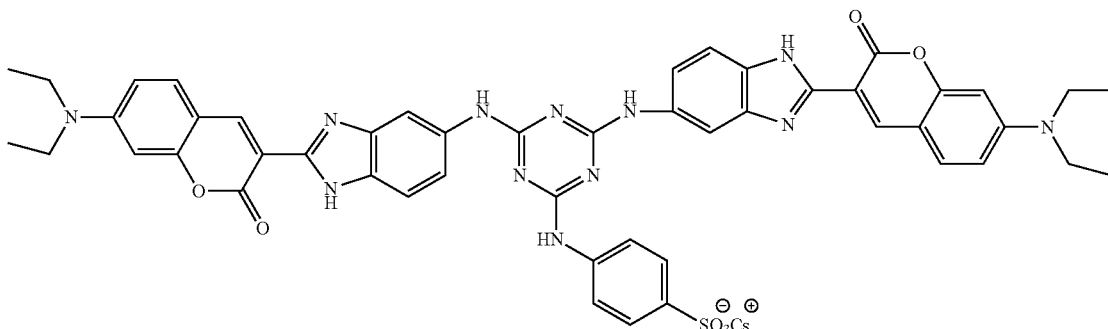
B2

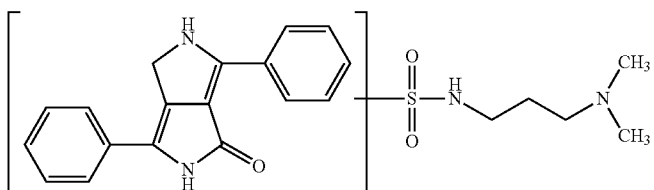
B3

Q1: 2,2,6,6-tetramethylpiperidine 1-oxyl (TEMPO)
Q2: 4-hydroxy-2,2,6,6-tetramethylpiperidine 2-oxyl (4-hydroxy-TEMPO)
J1: propylene glycol monomethyl ether acetate (PGMEA)
J2: cyclohexanone
J3: cyclopentanone
J4: propylene glycol monomethyl ether (PGME)

Examples 1 to 51 and Comparative Examples 1 to 4

<Preparation of Curable Composition>
Individual components shown in Table 8 to Table 10 below were mixed in the amounts shown in Table 8 to Table 10 below to prepare individual curable compositions.
<Evaluation>
The evaluation of the curable composition was carried out by the following method. The evaluation results are shown in Table 8 to Table 10.
Evaluation of Pattern Adhesiveness
The curable composition obtained above was applied onto an 8-inch silicon wafer previously sprayed with hexamethyldisilazane using a spin coater so that the film thickness after drying became the described film thickness (μm) and then prebaked at 100° C. for 120 seconds.
Using an i-line stepper exposure apparatus FPA-i5+ (manufactured by Canon Inc.), the coating film of the coated substrate was irradiated at a wavelength of 365 nm through a mask having an island pattern of 1.1 μm square at an exposure amount of 50 mJ/cm$^2$ to 1,700 mJ/cm$^2$. After the exposure, the development was carried out at 25° C. for 40 seconds using an alkaline developer CD-2000 (manufactured by FUJIFILM Electronics Materials Co., Ltd.). This was followed by rinsing with running water for 30 seconds, and then spray-drying to obtain a colored pattern.
The obtained 1.1 μm square island pattern was observed from above the pattern using a scanning electron microscope (S-9220, manufactured by Hitachi, Ltd.), and the pattern size was measured. In addition, the adhesiveness was evaluated using an optical microscope. The pattern size in a case where all the patterns were in intimate attachment was evaluated on the following five scales.

A rating of 3 or higher is preferable, and a rating of 4 and a rating of 5 are evaluated as having excellent performance.
5: Intimate attachment at 0.9 μm or more and less than 1.0 μm
4: Intimate attachment at 1.0 μm or more and less than 1.05 μm
3: Intimate attachment at 1.05 μm or more and less than 1.1 μm
2: Intimate attachment at 1.1 μm or more and less than 1.2 μm
1: No intimate attachment unless it is 1.2 μm or more
Evaluation of Deep Curing Properties (Evaluation of Edge Shape of Cured Product)
The edge shape of the patterned cured product formed using each curable composition was evaluated by the following method.
[Curable Composition Film Forming Step]
A curable composition film (composition film) was formed on a silicon wafer such that the film thickness after drying was 0.9 μm. The curable composition film was formed using spin coating. The rotation speed of the spin coating was adjusted so as to achieve the above film thickness. The curable composition film after application was placed on a hot plate with the silicon wafer facing down and then dried. The surface temperature of the hot plate was 100° C., and the drying time was 120 seconds.
[Exposing Step]
The obtained curable composition film was exposed under the following conditions.
The exposure was carried out using an i-line stepper exposure apparatus (trade name "FPA-3000iS+", manufactured by Canon Inc.). The curable composition film was irradiated (exposed) at an exposure amount of 400 mJ/cm$^2$ (irradiation time of 0.5 seconds) through a mask having a linear shape of 20 μm (width: 20 μm, length: 4 mm).
[Developing Step]
The curable composition film after curing was developed under the following conditions to obtain a patterned cured film.
Using a 0.3% by mass aqueous solution of tetramethylammonium hydroxide (TMAH), puddle development for 60 seconds at 23° C. was repeated 5 times on the curable composition film after curing to obtain a patterned cured product. Thereafter, the patterned cured product was rinsed using a spin shower and further washed with pure water.

[Post-Baking Step]

The patterned cured product obtained above was heated at 220° C. for 300 seconds using a clean oven CLH-21CDH (manufactured by Koyo Thermo Systems Co., Ltd.).

Further, the patterned cured product after heating was placed on a hot plate having a surface temperature of 220° C. and heated for 300 seconds.

[Evaluation]

The patterned cured product was imaged with a scanning electron microscope, and the edge shape of a 1.5 μm pattern cross section was evaluated according to the following standards.

As shown in FIG. 1, a length T of the cut at a bottom of a pattern edge portion 2 of the patterned cured product formed on a wafer 4 was measured. In FIG. 1, $L_1$ corresponds to an exposed region, and $L_2$ corresponds to an unexposed region. The evaluation was carried out according to the following standards.

A rating of A or higher is preferable, and a rating of AA is evaluated as having excellent performance.

Evaluation Standards

AA: The undercut width was more than 0 μm and 0.05 μm or less.

A: The undercut width was more than 0.05 μm and 0.15 μm or less.

B: The undercut width was more than 0.15 μm and 0.25 μm or less.

C: The undercut width was more than 0.25 μm.

Evaluation of Storage Stability

[1. Exposure Sensitivity of Curable Composition (Initial)]

In each Example or Comparative Example, each curable composition immediately after the preparation thereof was applied onto a glass substrate by spin coating and dried to form a curable composition film having a film thickness of 1.0 μm. The spin coating conditions were as follows: first, the rotation speed: 300 rpm (rotation per minute) for 5 seconds, and then 800 rpm for 20 seconds. In addition, the drying condition was 100° C. for 80 seconds.

Using an i-line stepper exposure apparatus FPA-3000i5+ (manufactured by Canon Inc.), the coating film obtained as described above was irradiated with light having a wavelength of 365 nm at an exposure amount of 10 mJ/cm² to 1,600 mJ/cm² through a pattern mask having 1 μm lines and spaces. Next, using a 60% CD-2000 (manufactured by FujiFilm Electronics Materials Co., Ltd.) developer, the curable composition film after the exposure was developed at 25° C. for 60 seconds to obtain a patterned cured film. Thereafter, the patterned cured film was rinsed with running water for 20 seconds and then air-dried.

In the above exposing step, the minimum exposure amount at which a pattern line width after the development of the region irradiated with light was 1.0 μm or more was defined as exposure sensitivity, and this exposure sensitivity was taken as initial exposure sensitivity.

[2. Exposure sensitivity of curable composition (after the lapse of time: after 30 days at 45° C.)]

The curable composition immediately after the preparation thereof was sealed in an airtight container, held in a thermostat (EYELA/LTI-700) whose internal temperature was set to 45° C., and taken out after 30 days. Using the taken out curable composition, the same test as that carried out using the curable composition immediately after the preparation thereof was carried out to obtain the exposure sensitivity. This exposure sensitivity was taken as exposure sensitivity after the lapse of time.

[Evaluation]

The variation (%) of the exposure sensitivity obtained by the following expression was calculated from the initial exposure sensitivity and the exposure sensitivity after the lapse of time. A smaller value of the variation (%) indicates more excellent storage stability of a curable composition.

(Expression) Variation=[(exposure sensitivity after lapse of time−initial exposure sensitivity)/initial exposure sensitivity]×100

A rating of 3 or higher is preferable, and a rating of 4 and a rating of 5 are evaluated as having excellent performance.

Evaluation Standards

5: The variation was 0% to 3%.

4: The variation was more than 3% and 6% or less.

3: The variation was more than 6% and 10% or less.

2: The variation was more than 10% and 15% or less.

1: The variation was more than 15%.

Evaluation of Development Residue (Unexposed Portion Residue)

In the test of the [1. Exposure sensitivity of curable composition (initial)], the cured film obtained with the minimum exposure amount at which the pattern line width after the development becomes 1.0 μm or more was heated together with a glass substrate in an oven at 220° C. for 1 hour. After heating the cured film, the number of residues present on the glass substrate in the region not irradiated with light in the exposing step (unexposed portion) was observed with a scanning electron microscope (SEM, magnification: 20000×) to evaluate the unexposed portion residues. The evaluation was carried out according to the following standards. In practice, a rating of 3 or higher is preferable, and a rating of 4 and a rating of 5 are evaluated as having excellent performance.

Evaluation Standards

5: A pattern was formed, and no residue was observed in an unexposed portion.

4: A pattern was formed, and 1 to 3 residues were observed in an unexposed portion of 1.0 μm square.

3: A pattern was formed, and 4 to 10 residues were observed in an unexposed portion of 1.0 μm square.

2: A pattern was formed, and 11 or more residues were observed in an unexposed portion of 1.0 μm square.

1: A pattern was not formed due to poor development.

TABLE 8

| | Pigment dispersion liquid 1 | | Pigment dispersion liquid 2 | | Resin | | Photopolymerization initiator | | Polymerizable compound Type |
|---|---|---|---|---|---|---|---|---|---|
| | Type | Parts by mass | Type | Parts by mass | Type | Parts by mass | Type | Parts by mass | |
| Example 1 | Pigment dispersion liquid R-1 | 42 | Pigment dispersion liquid Y-1 | 19 | P1 | 1.02 | I1 | 0.45 | M4 |
| Example 2 | Pigment dispersion liquid R-2 | 48.2 | Pigment dispersion liquid Y-1 | 21.2 | | | I2 | 0.37 | M5 |
| Example 3 | Pigment dispersion liquid R-3 | 48.2 | Pigment dispersion liquid Y-1 | 21.2 | | | I2 | 0.37 | |

TABLE 8-continued

| | | | | | | | |
|---|---|---|---|---|---|---|---|
| Example 4 | Pigment dispersion liquid R-4 | 44.8 | Pigment dispersion liquid Y-1 | 20.2 | | I1 | 0.37 | M4 |
| Example 5 | Pigment dispersion liquid R-5 | 44.8 | Pigment dispersion liquid Y-1 | 20.2 | | I1 | 037 | M1 |
| Example 6 | Pigment dispersion liquid R-6 | 44.8 | Pigment dispersion liquid Y-1 | 20.2 | | I6 | 0.37 | M4 |
| Example 7 | Pigment dispersion liquid R-7 | 44.8 | Pigment dispersion liquid Y-1 | 20.2 | | I1 | 0.37 | M3 |
| Example 8 | Pigment dispersion liquid R-8 | 44.8 | Pigment dispersion liquid Y-1 | 20.2 | | I1 | 0.37 | M4 |
| Example 9 | Pigment dispersion liquid R-9 | 44.8 | Pigment dispersion liquid Y-1 | 20.2 | | I3 | 0.37 | M4 |
| Example 10 | Pigment dispersion liquid R-10 | 42 | Pigment dispersion liquid Y-1 | 19 | P1  1.02 | I1 | 0.45 | M2/M6 = 2/3 |
| Example 11 | Pigment dispersion liquid R-11 | 44.8 | Pigment dispersion liquid Y-1 | 20.2 | | I1/I6 = 8/2 | 0.37 | M4 |
| Example 12 | Pigment dispersion liquid R-12 | 44.8 | Pigment dispersion liquid Y-1 | 20.2 | | I1 | 0.37 | M4 |
| Example 13 | Pigment dispersion liquid R-13/Pigment dispersion liquid R-19 = 9/1 | 44.8 | Pigment dispersion liquid Y-1 | 20.2 | | I1 | 0.37 | M4 |
| Example 14 | Pigment dispersion liquid R-14 | 44.8 | Pigment dispersion liquid Y-1 | 20.2 | | I1 | 0.37 | M4 |
| Example 15 | Pigment dispersion liquid R-15 | 44.8 | Pigment dispersion liquid Y-3 | 20.2 | | I4 | 0.37 | M4 |
| Example 16 | Pigment dispersion liquid R-16 | 44.8 | Pigment dispersion liquid Y-1 | 20.2 | | I1 | 0.37 | M4 |
| Example 17 | Pigment dispersion liquid R-17 | 42 | Pigment dispersion liquid Y-1 | 19 | P1  1.02 | I1 | 0.45 | M4 |
| Example 18 | Pigment dispersion liquid R-18 | 42 | Pigment dispersion liquid Y-1 | 19 | P1/P2 = 1/1  1.02 | I1 | 0.45 | M4 |
| Example 19 | Pigment dispersion liquid R-19 | 42 | Pigment dispersion liquid Y-1 | 19 | P1  1.02 | I1 | 0.45 | M4 |
| Example 20 | Pigment dispersion liquid R-20 | 71 | | | | I2 | 0.37 | |

| | Polymerizable compound | Surfactant | | Solvent | | Performance evaluation | | | |
|---|---|---|---|---|---|---|---|---|---|
| | Parts by mass | Type | Parts by mass | Type | Parts by mass | Adhesion sensitivity | Pattern shape | Development residue | Storage stability |
| Example 1 | 0.86 | H1 | 4.17 | J1 | 32.5 | 5 | AA | 5 | 5 |
| Example 2 | 0.1 | H1 | 3.34 | J1 | 26.79 | 5 | A | 5 | 5 |
| Example 3 | | H1 | 3.34 | J1 | 26.89 | 5 | A | 5 | 5 |
| Example 4 | 0.4 | H1 | 4.17 | J1 | 30.06 | 5 | A | 5 | 5 |
| Example 5 | 0.4 | H1 | 4.17 | J1 | 30.06 | 5 | A | 5 | 5 |
| Example 6 | 0.4 | H1 | 4.17 | J4 | 30.06 | 5 | A | 5 | 5 |
| Example 7 | 0.4 | H1 | 4.17 | J1 | 30.06 | 5 | A | 5 | 5 |
| Example 8 | 0.4 | H1 | 4.17 | J1 | 30.06 | 5 | A | 5 | 5 |
| Example 9 | 0.4 | H1 | 4.17 | J1 | 30.06 | 5 | A | 4 | 4 |
| Example 10 | 0.86 | H1 | 4.17 | J1 | 32.5 | 5 | A | 4 | 4 |
| Example 11 | 0.4 | H1 | 4.17 | J1 | 30.06 | 5 | A | 5 | 5 |
| Example 12 | 0.4 | H1 | 4.17 | J1 | 30.06 | 5 | A | 5 | 5 |
| Example 13 | 0.4 | H1 | 4.17 | J2 | 30.06 | 5 | A | 5 | 5 |
| Example 14 | 0.4 | H1 | 4.17 | J1 | 30.06 | 5 | AA | 5 | 5 |
| Example 15 | 0.4 | H1 | 4.17 | J1/J3 = 1/1 | 30.06 | 5 | AA | 5 | 5 |

TABLE 8-continued

| Example 16 | 0.4  | H1 | 4.17 | J1 | 30.06 | 5 | AA | 5 | 5 |
| Example 17 | 0.86 | H1 | 4.17 | J3 | 32.5  | 5 | AA | 5 | 5 |
| Example 18 | 0.86 | H1 | 4.17 | J1 | 32.5  | 5 | AA | 5 | 5 |
| Example 19 | 0.86 | H1 | 4.17 | J1 | 32.5  | 5 | AA | 5 | 3 |
| Example 20 |      | H1 | 3.34 | J1 | 25.29 | 5 | AA | 5 | 3 |

TABLE 9

| | Pigment dispersion liquid 1 | | Pigment dispersion liquid 2 | | Resin | | Photopolymerization initiator | | Polymerizable compound | | Surfactant | | Solvent | | Performance evaluation | | | |
|---|---|---|---|---|---|---|---|---|---|---|---|---|---|---|---|---|---|---|
| | Type | Parts by mass | Type | Parts by mass | Type | Parts by mass | Type | Parts by mass | Type | Parts by mass | Type | Parts by mass | Type | Parts by mass | Adhesion sensitivity | Pattern shape | Development residue | Storage stability |
| Example 21 | Pigment dispersion liquid R-21 | 42 | Pigment dispersion liquid Y-1 | 19 | P1 | 1.02 | I1 | 0.45 | M4 | 0.86 | H1 | 4.17 | J1 | 32.5 | 5 | AA | 5 | 3 |
| Example 22 | Pigment dispersion liquid R-22 | 42 | Pigment dispersion liquid Y-1 | 19 | P1 | 1.02 | I1 | 0.45 | M4 | 0.86 | H1 | 4.17 | J1 | 32.5 | 4 | A | 5 | 5 |
| Example 23 | Pigment dispersion liquid R-23 | 44.8 | Pigment dispersion liquid Y-1 | 20.2 | | | I1 | 0.37 | M4 | 0.4 | H1 | 4.17 | J1 | 30.06 | 5 | A | 5 | 4 |
| Example 24 | Pigment dispersion liquid R-24 | 44.8 | Pigment dispersion liquid Y-1 | 20.2 | | | I1 | 0.37 | M4 | 0.4 | H1 | 4.17 | J1 | 30.06 | 5 | AA | 5 | 5 |
| Example 25 | Pigment dispersion liquid R-25 | 44.8 | Pigment dispersion liquid Y-1 | 20.2 | | | I1 | 0.37 | M4 | 0.4 | H1 | 4.17 | J1 | 30.06 | 5 | AA | 5 | 5 |
| Example 26 | Pigment dispersion liquid R-26 | 44.8 | Pigment dispersion liquid Y-1 | 20.2 | | | I1 | 0.37 | M4 | 0.4 | H1 | 4.17 | J1 | 30.06 | 5 | A | 5 | 4 |
| Example 27 | Pigment dispersion liquid R-27 | 44.8 | Pigment dispersion liquid Y-1 | 20.2 | | | I1 | 0.37 | M4 | 0.4 | H1 | 4.17 | J2 | 30.06 | 5 | A | 5 | 4 |
| Example 28 | Pigment dispersion liquid R-28 | 44.8 | Pigment dispersion liquid Y-3 | 20.2 | | | I1 | 0.37 | M4 | 0.4 | H1 | 4.17 | J1 | 30.06 | 5 | A | 5 | 4 |
| Example 29 | Pigment dispersion liquid R-29 | 44.8 | Pigment dispersion liquid Y-1 | 20.2 | | | I5 | 0.37 | M4 | 0.4 | H1 | 4.17 | J1 | 30.06 | 5 | A | 5 | 4 |
| Example 30 | Pigment dispersion liquid R-30 | 44.8 | Pigment dispersion liquid Y-1 | 20.2 | | | I1 | 0.37 | M4 | 0.4 | H1 | 4.17 | J3 | 30.06 | 5 | AA | 5 | 5 |
| Example 31 | Pigment dispersion liquid R-31 | 44.8 | Pigment dispersion liquid Y-1 | 20.2 | | | I1 | 0.37 | M4 | 0.4 | H1 | 4.17 | J1 | 30.06 | 5 | AA | 5 | 5 |
| Example 32 | Pigment dispersion liquid R-32 | 44.8 | Pigment dispersion liquid Y-2 | 20.2 | | | I1 | 0.37 | M4 | 0.4 | H1 | 4.17 | J1 | 30.06 | 5 | AA | 5 | 5 |
| Example 33 | Pigment dispersion liquid R-33 | 44.8 | Pigment dispersion liquid Y-1 | 20.2 | | | I1 | 0.37 | M4 | 0.4 | H1 | 4.17 | J1 | 30.06 | 5 | A | 3 | 3 |
| Example 34 | Pigment dispersion liquid R-34 | 42 | Pigment dispersion liquid Y-1 | 19 | P1 | 1.02 | I1 | 0.45 | M4 | 0.86 | H1 | 4.17 | J1 | 32.5 | 5 | A | 3 | 3 |
| Example 35 | Pigment dispersion liquid R-35 | 42 | Pigment dispersion liquid Y-1 | 19 | P1 | 1.02 | I1 | 0.45 | M4 | 0.86 | H1 | 4.17 | J1 | 32.5 | 5 | AA | 5 | 5 |
| Example 36 | Pigment dispersion liquid R-36 | 71 | | | P1 | 1.02 | I2 | 0.37 | M4 | 0.86 | H1 | 3.34 | J1 | 25.29 | 5 | AA | 5 | 5 |
| Example 37 | Pigment dispersion liquid R-37 | 42 | Pigment dispersion liquid Y-1 | 19 | P1 | 1.02 | I1 | 0.45 | M4 | 0.86 | H1 | 4.17 | J1 | 32.5 | 5 | AA | 5 | 5 |
| Example 38 | Pigment dispersion liquid R-38 | 42 | Pigment dispersion liquid Y-1 | 19 | P1 | 1.02 | I1 | 0.45 | M4 | 0.86 | H1 | 4.17 | J1 | 32.5 | 5 | AA | 5 | 3 |
| Example 39 | Pigment dispersion liquid R-39 | 42 | Pigment dispersion liquid Y-1 | 19 | P1 | 1.02 | I1 | 0.45 | M4 | 0.86 | H1 | 4.17 | J1/J3 = 1/1 | 32.5 | 3 | A | 5 | 4 |
| Example 40 | Pigment dispersion liquid R-44 | 42 | Pigment dispersion liquid Y-1 | 19 | P1 | 1.02 | I1 | 0.45 | M4 | 0.86 | H1 | 4.17 | J1 | 32.5 | 3 | B | 3 | 3 |
| Example 41 | Pigment dispersion liquid R-45 | 42 | Pigment dispersion liquid Y-1 | 19 | P1 | 1.02 | I1 | 0.45 | M4 | 0.86 | H1 | 4.17 | J1 | 32.5 | 3 | B | 3 | 3 |

TABLE 9-continued

| | Pigment dispersion liquid 1 | | Pigment dispersion liquid 2 | | Resin | | Photopolymerization initiator | | Polymerizable compound | | Surfactant | | Solvent | | Performance evaluation | | | |
|---|---|---|---|---|---|---|---|---|---|---|---|---|---|---|---|---|---|---|
| | Type | Parts by mass | Type | Parts by mass | Type | Parts by mass | Type | Parts by mass | Type | Parts by mass | Type | Parts by mass | Type | Parts by mass | Adhesion sensitivity | Pattern shape | Development residue | Storage stability |
| Example 42 | Pigment dispersion liquid R-46 | 42 | Pigment dispersion liquid Y-1 | 19 | P1 | 1.02 | I1 | 0.45 | M4 | 0.86 | H1 | 4.17 | J1 | 32.5 | 5 | A | 5 | 4 |
| Example 43 | Pigment dispersion liquid R-47 | 42 | Pigment dispersion liquid Y-1 | 19 | P1 | 1.02 | I1 | 0.45 | M4 | 0.86 | H1 | 4.17 | J1 | 32.5 | 5 | AA | 5 | 5 |
| Comparative Example 1 | Pigment dispersion liquid R-40 | 44.8 | Pigment dispersion liquid Y-6 | 20.2 | | | I1 | 0.37 | M4 | 0.4 | H1 | 4.17 | J1 | 30.06 | 1 | C | 1 | 1 |
| Comparative Example 2 | Pigment dispersion liquid R-41 | 44.8 | Pigment dispersion liquid Y-6 | 20.2 | | | I1 | 0.37 | M4 | 0.4 | H1 | 4.17 | J1 | 30.06 | 1 | C | 1 | 1 |
| Comparative Example 3 | Pigment dispersion liquid R-42 | 44.8 | Pigment dispersion liquid Y-6 | 20.2 | | | I1 | 0.37 | M4 | 0.4 | H1 | 4.17 | J1 | 30.06 | 1 | C | 1 | 1 |
| Comparative Example 4 | Pigment dispersion liquid R-43 | 44.8 | Pigment dispersion liquid Y-6 | 20.2 | | | I1 | 0.37 | M4 | 0.4 | H1 | 4.17 | J1 | 30.06 | 1 | C | 1 | 1 |

TABLE 10

| | Pigment dispersion liquid 1 | | Pigment dispersion liquid 2 | | Resin | | Photopolymerization initiator | | Polymerizable compound |
|---|---|---|---|---|---|---|---|---|---|
| | Type | Parts by mass | Type | Parts by mass | Type | Parts by mass | Type | Parts by mass | Type |
| Example 44 | Pigment dispersion liquid B-1 | 71.3 | | | | | I2 | 0.37 | |
| Example 45 | Pigment dispersion liquid G-1 | 65 | | | | | I2 | 0.37 | M4 |
| Example 46 | Pigment dispersion liquid G-2 | 68 | | | | | I2 | 0.37 | M4 |
| Example 47 | Pigment dispersion liquid G-3 | 68 | | | | | I1 | 0.37 | M4 |
| Example 48 | Pigment dispersion liquid Bk-1 | 65 | | | | | I1 | 0.37 | M4 |
| Example 49 | Pigment dispersion liquid IR-1 | 65 | | | | | I1 | 0.37 | M4 |
| Example 50 | Pigment dispersion liquid IR-2 | 65 | | | | | I1 | 0.37 | M4 |
| Example 51 | Pigment dispersion liquid IR-3 | 65 | | | | | I1 | 0.37 | M4 |

| | Polymerizable compound | Surfactant | | Solvent | | Performance evaluation | | | |
|---|---|---|---|---|---|---|---|---|---|
| | Parts by mass | Type | Parts by mass | Type | Parts by mass | Adhesion sensitivity | Pattern shape | Development residue | Storage stability |
| Example 44 | | H1 | 3.34 | J1 | 24.99 | 5 | AA | 5 | 5 |
| Example 45 | 0.3 | H1 | 3.34 | J1 | 30.99 | 5 | AA | 5 | 5 |
| Example 46 | 0.3 | H1 | 3.34 | J1 | 27.99 | 5 | AA | 5 | 5 |
| Example 47 | 0.4 | H1 | 3.34 | J1 | 27.89 | 5 | AA | 5 | 5 |
| Example 48 | 0.8 | H1 | 3.34 | J1 | 30.49 | 5 | AA | 5 | 5 |
| Example 49 | 0.8 | H1 | 3.34 | J1 | 30.49 | 5 | AA | 5 | 5 |
| Example 50 | 0.8 | H1 | 3.34 | J1 | 30.49 | 5 | AA | 5 | 5 |
| Example 51 | 0.8 | H1 | 3.34 | J1 | 30.49 | 5 | AA | 5 | 5 |

The details of the abbreviations described in Table 8 to Table 10 other than those described above are shown below.

I1: an oxime-based polymerization initiator, IRGACURE OXE-02 (manufactured by BASF SE)

I2: an oxime-based polymerization initiator, IRGACURE OXE-03 (manufactured by BASF SE)

I3: an oxime-based polymerization initiator, IRGACURE OXE-04 (manufactured by BASF SE)

I4: a compound shown below

I5: an oxime-based polymerization initiator, ADEKA ARKLS NCI-831 (which contains a nitro group, manufactured by ADEKA Corporation)

I6: 2-benzyl-2-dimethylamino-1-(4-morpholinophenyl)-1-butanone, IRGACURE 369 (manufactured by BASF SE)

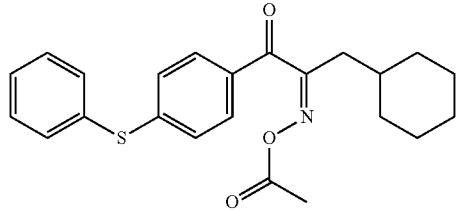

M1: a compound shown below in which a+b+c=3

M2: a compound shown below in which a+b+c=4

M3: KAYARAD DPHA (mixture of dipentaerythritol hexaacrylate and dipentaerythritol pentaacrylate, manufactured by Nippon Kayaku Co., Ltd.)

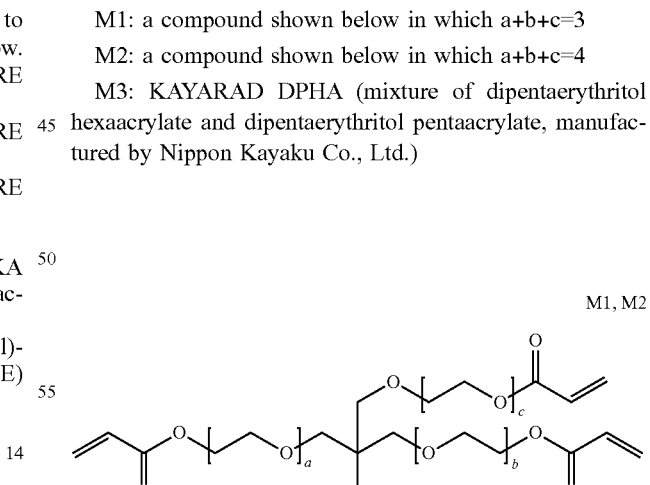

M1, M2

M4: UA-7200 (urethane acrylate, manufactured by Shin-Nakamura Chemical Co., Ltd.)

M5: a compound shown below

M6: a mixture of dipentaerythritol hexaacrylate and dipentaerythritol pentaacrylate (mass ratio of 7:3)

M5

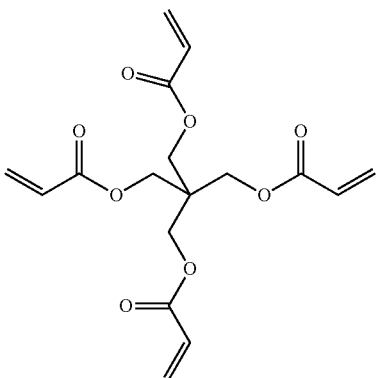

P1: a resin having the following structure, in which the numerical value at the lower right of the parenthesis indicates the mass ratio.
P2: a resin having the following structure
H1: a fluorine-based surfactant, MEGAFACE F-781F (manufactured by DIC Corporation)

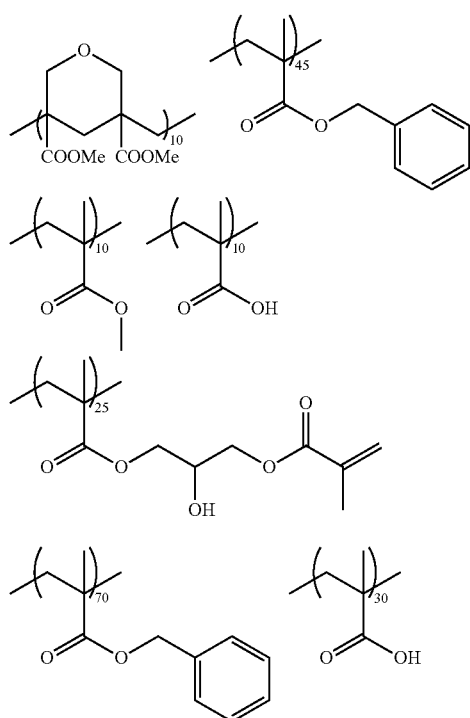

Example 101 to Example 147

One of the Green composition, the Blue composition and the Red composition was applied by a spin coating method such that the film thickness after film formation is 1.0 μm so that the color does not overlap with that of the curable composition. For example, the color of the curable compositions of Examples 1 to 43 is Red, the color of the curable composition of Example 44 is Blue, and the color of the curable compositions of Examples 45 to 47 is Green.

This was followed by heating at 100° C. for 2 minutes using a hot plate. Then, the exposure was carried out at 1,000 mJ/cm$^2$ through a mask having a dot pattern of 2 μm square using an i-line stepper exposure apparatus FPA-3000i5+ (manufactured by Canon Inc.). Next, the puddle development was carried out at 23° C. for 60 seconds using a 0.3% by mass aqueous solution of tetramethylammonium hydroxide (TMAH). This was followed by rinsing with a spin shower and then further washing with pure water. Next, the Red composition was patterned on the pattern of an infrared cut filter by heating at 200° C. for 5 minutes using a hot plate. Similarly, the remaining one of the Green composition, the Blue composition and the Red composition was sequentially patterned to form red, green and blue colored patterns (Bayer patterns).

The Bayer pattern is a pattern in which a 2×2 array of color filter elements each having one red (Red) element, two green (Green) elements, and one blue (Blue) element is repeated, as disclosed in US3971065A.

An image was captured for the obtained solid-state imaging element, and the image performance was evaluated. In a case where any of the compositions obtained in Example 1 to Example 47 was used, images could be clearly recognized even in a low illuminance environment.

The Red composition, the Green composition, the Blue composition, and the composition for forming an infrared transmission filter used in Example 101 to Example 147 are as follows.

Red Composition

The following components were mixed, stirred, and then filtered through a nylon filter (manufactured by Pall Corporation) having a pore size of 0.45 μm to prepare a Red composition.

Red pigment dispersion liquid: 51.7 parts by mass
Resin 4 (40% by mass PGMEA solution): 0.6 parts by mass
Polymerizable compound 4: 0.6 parts by mass
Photopolymerization initiator 1: 0.3 parts by mass
Surfactant 1: 4.2 parts by mass
PGMEA: 42.6 parts by mass Green Composition The following components were mixed, stirred, and then filtered through a nylon filter (manufactured by Pall Corporation) having a pore size of 0.45 μm to prepare a Green composition.

Green pigment dispersion liquid: 73.7 parts by mass
Resin 4 (40% by mass PGMEA solution): 0.3 parts by mass
Polymerizable compound 1: 1.2 parts by mass
Photopolymerization initiator 1: 0.6 parts by mass
Surfactant 1: 4.2 parts by mass
Ultraviolet absorber (UV-503, manufactured by Daito Chemical Co., Ltd.): 0.5 parts by mass
PGMEA: 19.5 parts by mass Blue Composition The following components were mixed, stirred, and then filtered through a nylon filter (manufactured by Pall Corporation) having a pore size of 0.45 μm to prepare a Blue composition.

Blue pigment dispersion liquid: 44.9 parts by mass
Resin 4 (40% by mass PGMEA solution): 2.1 parts by mass
Polymerizable compound 1: 1.5 parts by mass
Polymerizable compound 4: 0.7 parts by mass
Photopolymerization initiator 1: 0.8 parts by mass Surfactant 1: 4.2 parts by mass
PGMEA: 45.8 parts by mass Composition for Forming Infrared Transmission Filter The components in the following composition were mixed, stirred, and then filtered through a nylon filter (manufactured by Pall Corporation) having a pore size of 0.45 μm to prepare a composition for forming an infrared transmission filter.

<Composition 100>
Pigment dispersion liquid 1-1: 46.5 parts by mass
Pigment dispersion liquid 1-2: 37.1 parts by mass
Polymerizable compound 5: 1.8 parts by mass
Resin 4: 1.1 parts by mass
Photopolymerization initiator 2: 0.9 parts by mass
Surfactant 1: 4.2 parts by mass
Polymerization inhibitor (p-methoxyphenol): 0.001 parts by mass
Silane coupling agent: 0.6 parts by mass
PGMEA: 7.8 parts by mass <Composition 101>
Pigment dispersion liquid 2-1: 1,000 parts by mass
Polymerizable compound (dipentaerythritol hexaacrylate): 50 parts by mass
Resin: 17 parts by mass
Photopolymerization initiator (1-[4-(phenylthio)]-1,2-octanedi one-2-(O-benzoyloxime)): 10 parts by mass
PGMEA: 179 parts by mass
Alkali-soluble polymer F-1: 17 parts by mass (concentration of solid contents: 35% by mass)

Synthesis Example of Alkali-Soluble Polymer F-1

In a reaction vessel, 14 parts of benzyl methacrylate, 12 parts of N-phenylmaleimide, 15 parts of 2-hydroxyethyl methacrylate, 10 parts of styrene and 20 parts of methacrylic acid were dissolved in 200 parts of propylene glycol monomethyl ether acetate, and 3 parts of 2,2'-azoisobutyronitrile and 5 parts of α-methylstyrene dimer were further added thereto. After the inside of the reaction vessel was purged with nitrogen, the reaction mixture was heated at 80° C. for 5 hours while stirring and bubbling with nitrogen to obtain a solution including an alkali-soluble polymer F-1 (concentration of solid contents: 35% by mass). This polymer had a weight-average molecular weight in terms of polystyrene of 9,700, a number-average molecular weight in terms of polystyrene of 5,700, and an Mw/Mn of 1.70.

<Pigment Dispersion Liquid 2-1>
60 parts of C.I. Pigment Black 32, 20 parts of C.I. Pigment Blue 15:6, 20 parts of C.I. Pigment Yellow 139, 80 parts of SOLSPERSE 76500 (manufactured by Lubrizol Japan Limited, concentration of solid contents: 50% by mass), 120 parts of a solution including the alkali-soluble polymer F-1 (concentration of solid contents: 35% by mass), and 700 parts of propylene glycol monomethyl ether acetate were mixed and then dispersed for 8 hours using a paint shaker to obtain a colorant dispersion liquid 2-1.

The raw materials used for the Red composition, the Green composition, the Blue composition, and the composition for forming an infrared transmission filter are as follows.

Red Pigment Dispersion Liquid

A mixed liquid consisting of 9.6 parts by mass of C.I. Pigment Red 254, 4.3 parts by mass of C.I. Pigment Yellow 139, 6.8 parts by mass of a dispersant (Disperbyk-161, manufactured by BYK-Chemie GmbH), and 79.3 parts by mass of PGMEA was mixed and dispersed for 3 hours by a beads mill (zirconia beads having a diameter of 0.3 mm) to prepare a pigment dispersion liquid. Thereafter, a dispersion treatment was further carried out at a flow rate of 500 g/min under a pressure of 2,000 kg/cm², using a high-pressure disperser NANO-3000-10 (manufactured by Nippon BEE Chemical Co., Ltd.) equipped with a pressure reducing mechanism. This dispersion treatment was repeated 10 times to obtain a Red pigment dispersion liquid.

Green Pigment Dispersion Liquid

A mixed liquid consisting of 6.4 parts by mass of C.I. Pigment Green 36, 5.3 parts by mass of C.I. Pigment Yellow 150, 5.2 parts by mass of a dispersant (Disperbyk-161, manufactured by BYK-Chemie GmbH), and 83.1 parts by mass of PGMEA was mixed and dispersed for 3 hours by a beads mill (zirconia beads having a diameter of 0.3 mm) to prepare a pigment dispersion liquid. Thereafter, a dispersion treatment was further carried out at a flow rate of 500 g/min under a pressure of 2,000 kg/cm², using a high-pressure disperser NANO-3000-10 (manufactured by Nippon BEE Chemical Co., Ltd.) equipped with a pressure reducing mechanism. This dispersion treatment was repeated 10 times to obtain a Green pigment dispersion liquid.

Blue Pigment Dispersion Liquid

A mixed liquid consisting of 9.7 parts by mass of C.I. Pigment Blue 15:6, 2.4 parts by mass of C.I. Pigment Violet 23, 5.5 parts by mass of a dispersant (Disperbyk-161, manufactured by BYK-Chemie GmbH), and 82.4 parts by mass of PGMEA was mixed and dispersed for 3 hours by a beads mill (zirconia beads having a diameter of 0.3 mm) to prepare a pigment dispersion liquid. Thereafter, a dispersion treatment was further carried out at a flow rate of 500 g/min under a pressure of 2,000 kg/cm², using a high-pressure disperser NANO-3000-10 (manufactured by Nippon BEE Chemical Co., Ltd.) equipped with a pressure reducing mechanism. This dispersion treatment was repeated 10 times to obtain a Blue pigment dispersion liquid.

Pigment Dispersion Liquid 1-1

The mixed liquid having the following composition was mixed and dispersed for 3 hours using zirconia beads having a diameter of 0.3 mm in a beads mill (high-pressure disperser NANO-3000-10 equipped with a pressure reducing mechanism, manufactured by Nippon BEE Chemical Co., Ltd.) to prepare a pigment dispersion liquid 1-1.

A mixed pigment consisting of a red pigment (C.I. Pigment Red 254) and a yellow pigment (C.I. Pigment Yellow 139): 11.8 parts by mass
Resin (Disperbyk-111, manufactured by BYK-Chemie GmbH): 9.1 parts by mass
PGMEA: 79.1 parts by mass Pigment Dispersion Liquid 1-2

The mixed liquid having the following composition was mixed and dispersed for 3 hours using zirconia beads having a diameter of 0.3 mm in a beads mill (high-pressure disperser NANO-3000-10 equipped with a pressure reducing mechanism, manufactured by Nippon BEE Chemical Co., Ltd.) to prepare a pigment dispersion liquid 1-2.

A mixed pigment consisting of a blue pigment (C.I. Pigment Blue 15:6) and a violet pigment (C.I. Pigment Violet 23): 12.6 parts by mass
Resin (Disperbyk-111, manufactured by BYK-Chemie GmbH): 2.0 parts by mass
Resin A: 3.3 parts by mass
Cyclohexanone: 31.2 parts by mass
PGMEA: 50.9 parts by mass
Resin A: a structure shown below (Mw=14,000, the ratio in each structural unit is a molar ratio)

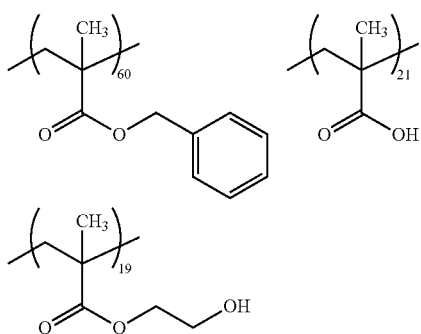

Polymerizable compound 1: KAYARAD DPHA (mixture of dipentaerythritol hexaacrylate and dipentaerythritol pentaacrylate, manufactured by Nippon Kayaku Co., Ltd.)

Polymerizable compound 4: a structure shown below

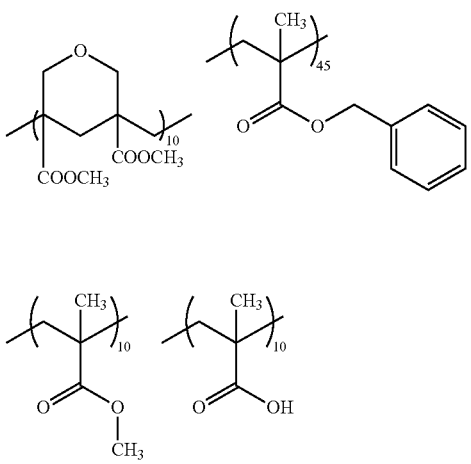

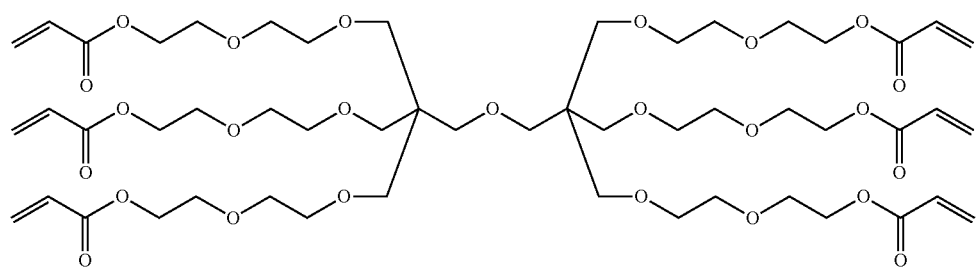

Polymerizable compound 5: a structure shown below (mixture of left-side compound and right-side compound in a molar ratio of 7:3)

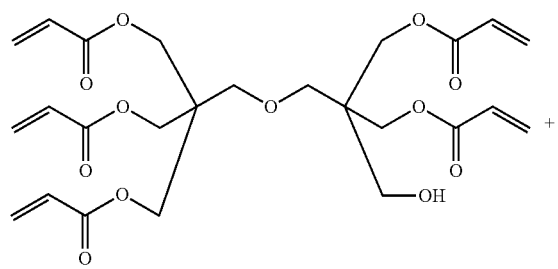

-continued

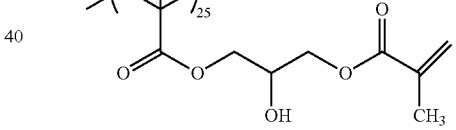

Photopolymerization initiator 1: IRGACURE-OXE01 (1-[4-(phenylthio)]-1,2-octanedione-2-(O-benzoyloxime), manufactured by BASF SE)

Photopolymerization initiator 2: a structure shown below

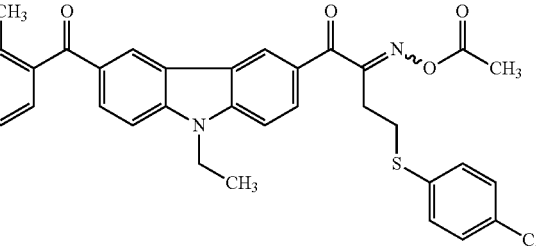

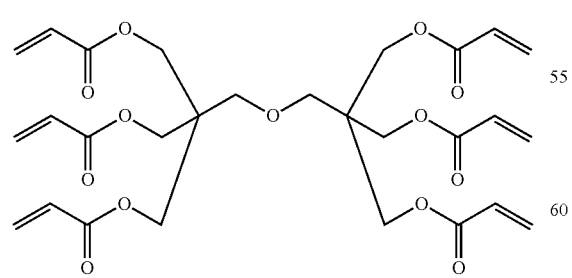

Resin 4: a structure shown below (acid value: 70 mgKOH/g, Mw=11,000, the ratio in each structural unit is a molar ratio)

Surfactant 1: a 1% by mass PGMEA solution of the following mixture (Mw=14,000). In the following formula, the unit of % (62% and 38%) indicating the percentage of the structural units is % by mass.

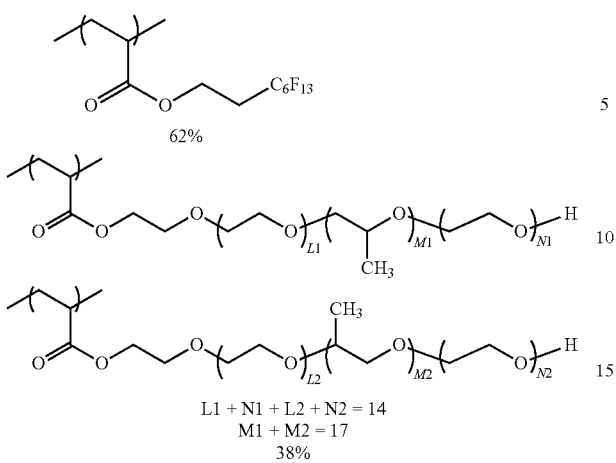

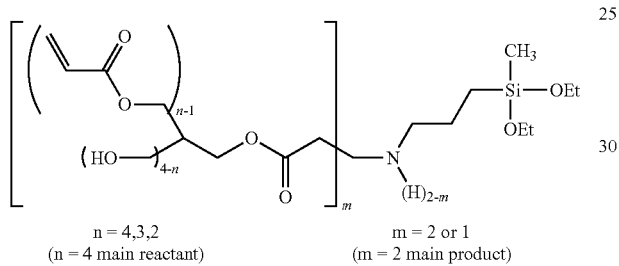

L1 + N1 + L2 + N2 = 14
M1 + M2 = 17
38%

Silane coupling agent: a compound having the following structure. In the following structural formula, Et represents an ethyl group.

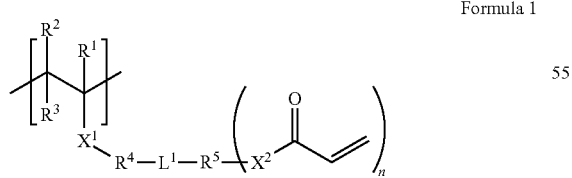

n = 4,3,2
(n = 4 main reactant)

m = 2 or 1
(m = 2 main product)

The disclosure of JP2018-029219 filed on Feb. 21, 2018 is incorporated herein by reference in its entirety.

All publications, patent applications, and technical standards mentioned in the present specification are herein incorporated by reference to the same extent as if each individual publication, patent application, and technical standard were specifically and individually indicated to be incorporated by reference.

What is claimed is:

1. A curable composition comprising:
   a pigment;
   a resin having a structural unit represented by Formula 1; and
   a photopolymerization initiator:

Formula 1

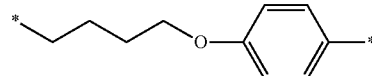

in Formula 1, $R^1$ to $R^3$ each independently represent a hydrogen atom or an alkyl group, $X^1$ represents —COO—, —CONR—, or an arylene group, R represents a hydrogen atom, an alkyl group, or an aryl group, $R^4$ represents a divalent linking group in which two or more aliphatic hydrocarbon groups are bonded to one or more structures selected from the group consisting of an ether bond and an ester bond; or a divalent group that is either one of the following structures LG-1 or LG-2, $L^1$ represents a group represented by Formula 2 or 3, $R^5$ represents a group in which two or more alkylene groups are bonded to one or more structures selected from the group consisting of an ether bond and an ester bond, $X^2$ represents an oxygen atom or —$NR^A$—, $R^A$ represents a hydrogen atom, an alkyl group, or an aryl group, and n represents an integer of 1 or more; and Formula 2

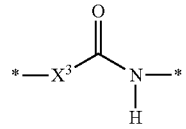

Formula 3

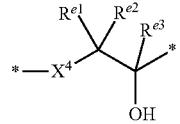

LG-1

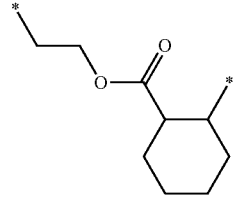

LG-2

in Formulae 2 and 3, $X^3$ represents an oxygen atom or —NH—, $X^4$ represents an oxygen atom or —COO—, $R^{e1}$ to $R^{e3}$ each independently represent a hydrogen atom or an alkyl group, at least two of $R^{e1}$ to $R^{e3}$ may be bonded to each other to form a ring structure, and *represents a bonding position to another structure; and in LG-1 and LG-2,*represents a bonding position to another structure.

2. The curable composition according to claim 1, wherein the resin further has a structural unit represented by Formula 4:

Formula 4 in Formula 4, $R^6$ represents a hydrogen atom or an alkyl group, $X^5$ represents —COO—, —$CONR^B$—, or an arylene group, $R^B$ represents a hydrogen atom, an alkyl group, or an aryl group, $L^2$ represents an aliphatic hydrocarbon group having 1 to 10 carbon atoms, an aromatic hydrocarbon group having 6 to 20 carbon atoms, or a group in which two or more groups selected from the group consisting of an aliphatic hydrocarbon group having 1 to 10 carbon atoms and an aromatic hydrocarbon group having 6 to 20 carbon atoms are bonded to one or more structures selected from the group consisting of an ether bond and an ester bond, and $L^2$ may be a single bond in a case where $X^5$ is an arylene group.

3. The curable composition according to claim 1, wherein the resin further has a structural unit represented by Formula 5:

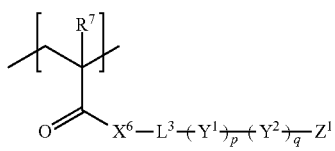

Formula 5 in Formula 5, $R^7$ represents a hydrogen atom or an alkyl group, $X^6$ represents an oxygen atom or —$NR^C$—, $R^C$ represents a hydrogen atom, an alkyl group, or an aryl group, $L^3$ represents a divalent linking group, $Y^1$ and $Y^2$ each independently represent an alkyleneoxy group or an alkylenecarbonyloxy group, $Z^1$ represents an aliphatic hydrocarbon group having 1 to 20 carbon atoms or an aromatic hydrocarbon group having 6 to 20 carbon atoms, p and q each independently represent an integer of 0 or more, and a value of p+q is 1 or more.

4. The curable composition according to claim 1, wherein the resin has an ethylenically unsaturated bond value of 0.1 mmol/g to 2.0 mmol/g.

5. The curable composition according to claim 1, further comprising:
a polymerization inhibitor.

6. The curable composition according to claim 5, wherein the polymerization inhibitor includes a compound having an N-oxyl radical structure.

7. The curable composition according to claim 1, wherein $L^1$ is a group represented by Formula 2.

8. The curable composition according to claim 7, wherein $X^3$ is an oxygen atom.

9. The curable composition according to claim 1, wherein $L^1$ is a group represented by Formula 3.

10. The curable composition according to claim 9, wherein $X^4$ is —COO—.

11. The curable composition according to claim 1, wherein the photopolymerization initiator is a compound having an oxime structure.

12. The curable composition according to claim 1, wherein the curable composition is used for forming a colored layer of a color filter.

13. A cured product obtained by curing the curable composition according to claim 1.

14. A color filter comprising:
the cured product according to claim 13.

15. A method for producing a color filter, comprising:
a step of applying the curable composition according to claim 1 onto a support to form a composition film;
a step of exposing the formed composition film to light in a pattern-wise manner; and
a step of developing the composition film after exposure to form a colored pattern.

16. A method for producing a color filter, comprising:
a step of applying the curable composition according to claim 1 onto a support and curing the applied curable composition to form a cured product;
a step of forming a photoresist layer on the cured product;
a step of exposing the photoresist layer to light in a pattern-wise manner and developing the exposed photoresist layer to form a resist pattern; and
a step of etching the cured product through the resist pattern.

17. A solid-state imaging element comprising:
the color filter according to claim 14.

18. An image display device comprising:
the color filter according to claim 14.

19. The curable composition according to claim 3, wherein the content of the structural unit represented by Formula 5 is 5% by mass to 70% by mass, with respect to the total mass of the resin.

* * * * *